United States Patent
Murai et al.

(10) Patent No.: US 9,894,751 B2
(45) Date of Patent: Feb. 13, 2018

(54) PRINTED CIRCUIT BOARD

(71) Applicant: CANON KABUSHIKI KAISHA, Tokyo (JP)

(72) Inventors: Yusuke Murai, Kawasaki (JP); Shoji Matsumoto, Yokohama (JP); Takashi Numagi, Kawasaki (JP); Hiroyuki Yamaguchi, Yokohama (JP); Nobuaki Yamashita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 252 days.

(21) Appl. No.: 14/944,540

(22) Filed: Nov. 18, 2015

(65) Prior Publication Data

US 2016/0157336 A1    Jun. 2, 2016

(30) Foreign Application Priority Data

Nov. 20, 2014   (JP) ................. 2014-235526
Oct. 16, 2015   (JP) ................. 2015-204852

(51) Int. Cl.
*H05K 1/02*     (2006.01)
*H05K 1/11*     (2006.01)

(52) U.S. Cl.
CPC ......... *H05K 1/0225* (2013.01); *H05K 1/0231* (2013.01); *H05K 1/0234* (2013.01); *H05K 1/115* (2013.01)

(58) Field of Classification Search
CPC .. H05K 1/0225; H05K 1/0231; H05K 1/0234; H05K 1/115
USPC ....................................................... 361/782
See application file for complete search history.

(56) References Cited

U.S. PATENT DOCUMENTS

2014/0209367 A1*  7/2014  Sakai .............. H05K 1/0227
                                                        174/260

FOREIGN PATENT DOCUMENTS

JP    2007-235170 A    9/2007

OTHER PUBLICATIONS

Jingook Kim, et al, [Analytical Model of power/groundnoise coupling to signal traces in high-speed multi-layer package orboards. ]IEEE 5th Electronics Packaging Technology Conference, pp. 45-50, Dec. 2003.

(Continued)

*Primary Examiner* — Eric Thomas
*Assistant Examiner* — Michael P McFadden
(74) *Attorney, Agent, or Firm* — Canon U.S.A., Inc. IP Division

(57) ABSTRACT

First and second semiconductor devices and first and second bypass circuits are mounted on a printed wiring board. The first bypass circuit and the second bypass circuit are provided closer to the first semiconductor device and to the second semiconductor device, respectively. The first bypass circuit has one end connected to a power plane through a first power supply via and the other end connected to a ground plane through a first ground via. The second bypass circuit has one end connected to the power plane through a second power supply via and the other end connected to the ground plane through a second ground via. The ground plane has a slit between the connecting portions of the first and second ground vias to increase the impedance between the connecting portions of the first and the second ground vias. Thus, jitters caused by power supply noise can be reduced.

17 Claims, 31 Drawing Sheets

(56) References Cited

OTHER PUBLICATIONS

Double-Data-Rate3 Synchronous Dynamic Random Access Memory; DDR3 SDRAM Standard, JESD79-3F (Revision of JESD79-3E, Jul. 2010) Jedec Solid State Technology Association. Jul. 2012.

* cited by examiner

FIG. 9A
FIG. 9B
FIG. 9C
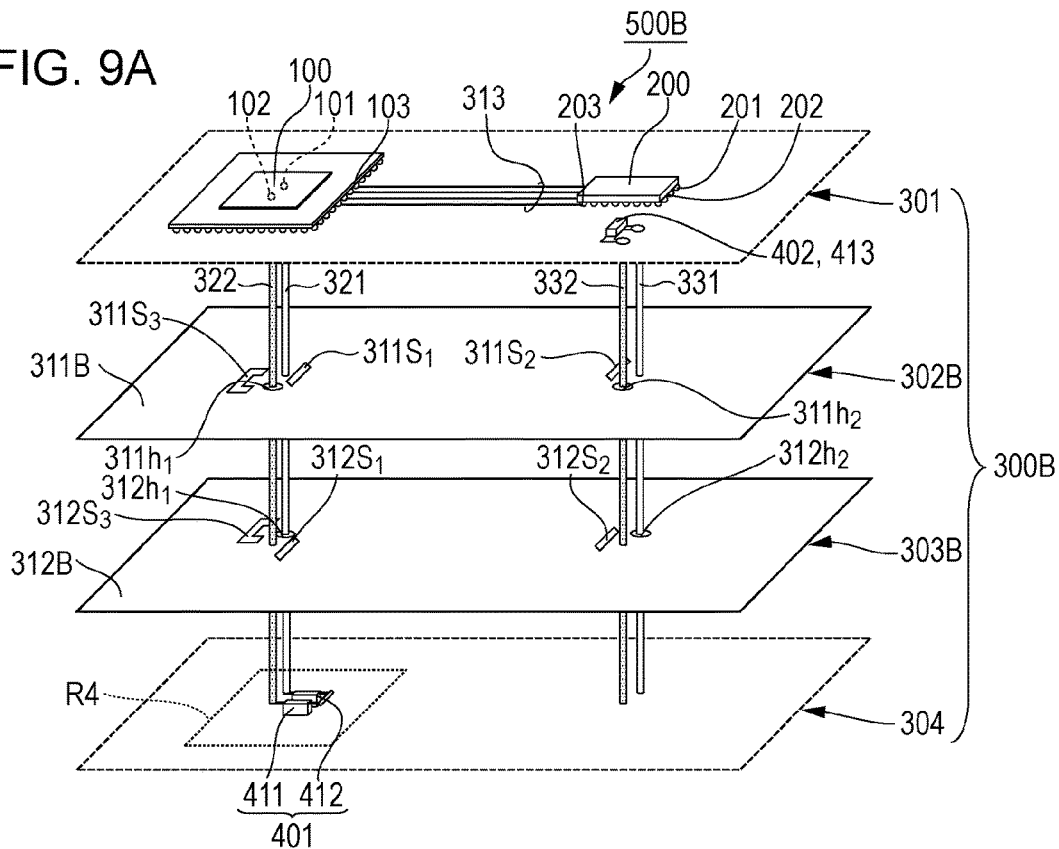
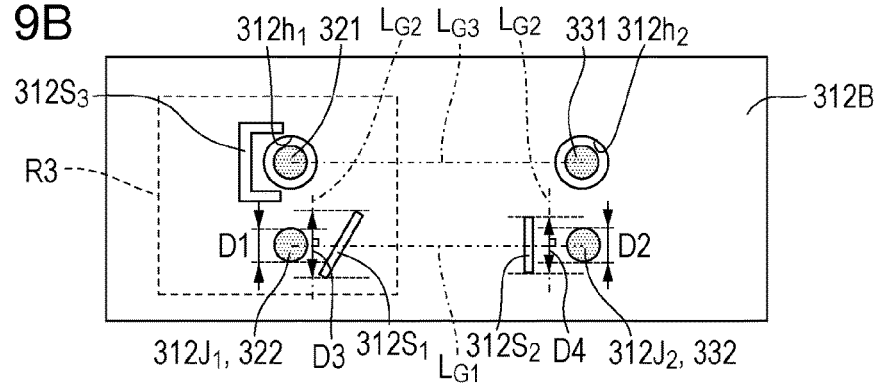
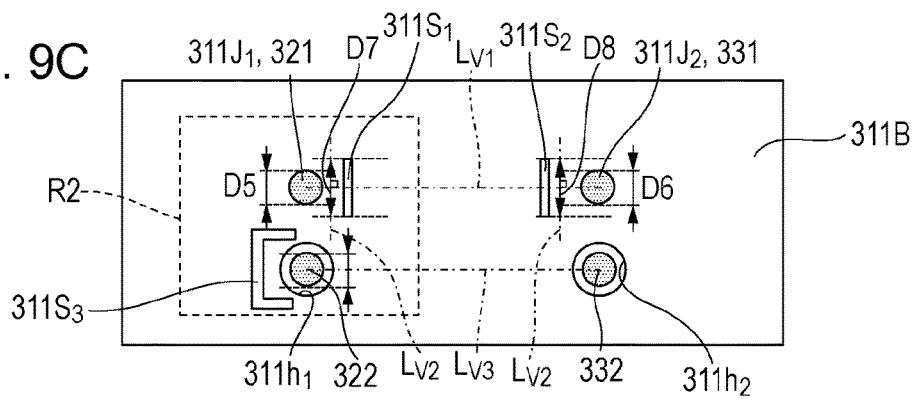

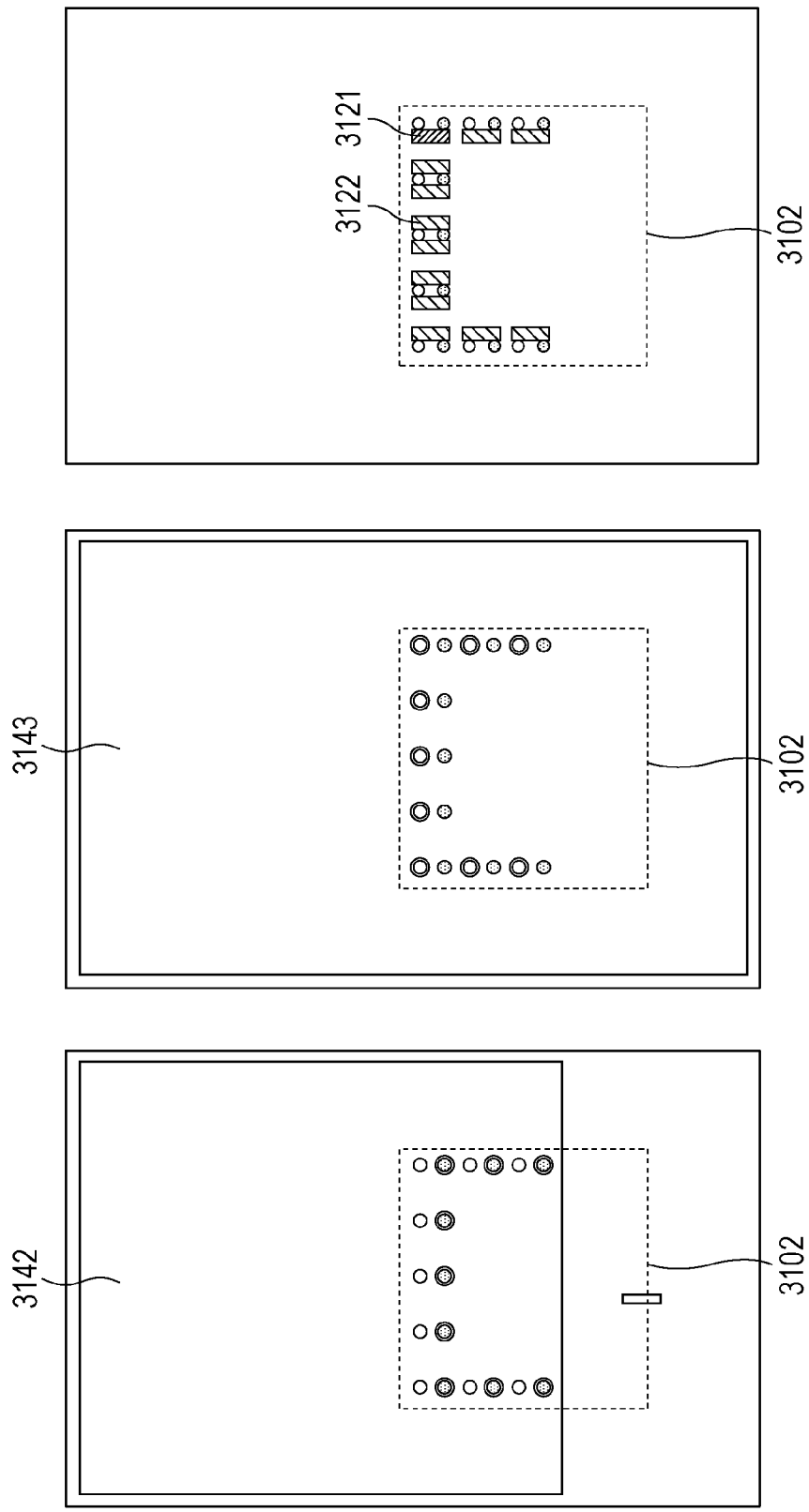

PRINTED CIRCUIT BOARD

BACKGROUND OF THE INVENTION

Field of the Invention

The present invention relates to a printed circuit board including a printed wiring board having a signal line being a transmission path for a signal to a first semiconductor circuit and a second semiconductor circuit.

Description of the Related Art

In recent years, with enhancement of functionality and performances of electronic equipment, the speed of data transfer between a first semiconductor circuit having an output terminal and a second semiconductor circuit having an input terminal, both of which are mounted on a printed wiring board, has been increased. Such an increased speed of data transfer may result in increased variations in propagation times of electric signals due to various kinds of noise. Such a variation in propagation time is called a jitter.

In a clock synchronization type interface, such as a Double-Data-Rate 3 Synchronous Dynamic Random Access Memory, an increased jitter may reduce the operation timing margin and thus increase the misoperation risk.

Jitters may include a jitter caused by power supply noise and a jitter caused by signal noise. The jitter caused by power supply noise will be described. First, When logic levels of signals output from output terminals of a plurality of buffer circuits in a first semiconductor circuit are simultaneously changed, current occurs. When the current is fed to a power feeding path to the first semiconductor circuit, power supply noise is caused by an impedance of the power feeding path. The power supply noise changes the power supply potential of the first semiconductor circuit, and waveforms of signals are distorted, causing jitters.

In order to reduce jitters caused by power supply noise, a capacitor may be provided between a power supply line and a ground line to lower the impedance. For preventing a rapid change of the impedance, a capacitor has been disclosed (see Japanese Patent Laid-Open No. 2007-235170) which has a low parasitic inductance (ESL) and a high parasitic resistance (ESR).

On the other hand, jitters caused by signal noise may include inter-symbol interference jitters caused due to impedance mismatching in signal wire and an insufficient frequency band and crosstalk noise jitters caused due to electromagnetic coupling between wires. In order to reduce such jitters, a terminator may be used, or an interval between wires may be increased.

An increased speed of transfer may result in a shorter interval between a rise and a fall of a signal waveform. Then, power supply noise occurring at a rise and power supply noise occurring at a fall may be superimposed, which causes a large potential fluctuation and thus increases jitters. In order to reduce jitters caused by power supply noise, the capacitor disclosed in Japanese Patent Laid-Open No. 2007-235170, for example, may be used to cause the power supply noises to be quickly converged so that the fluctuations in power supply potential may be reduced. In other words, a capacitor having a resistance component having a high resistance value disclosed in Japanese Patent Laid-Open No. 2007-235170 may be mounted in vicinity of the first semiconductor circuit (such as a plane on the opposite side of the plane mounting the first semiconductor circuit) to cause the power supply noise to be quickly converged.

However, because electromagnetic coupling is provided between the signal wire and the power plane, noise may be propagated from the signal wire to the power plane, causing resonance noise from the power plane. The resonance noise may also cause jitters due to signal noise. (See Jingook Kim, et al, "Analytical Model of power/ground noise coupling to signal traces in high-speed multi-layer package or boards." IEEE 5th Electronics Packaging Technology Conference, pp. 45-50, December 2003.) In other words, noise caused by the power plane resonance is propagated from the power plane to the signal line because of their electromagnetic coupling, and jitters may thus occur.

In order to prevent the propagation of noise to a signal line, a capacitor which apply a bypass to a power plane and a ground plane may be provided in the second semiconductor circuit having an input terminal power to inhibit plane resonance noise and thus reduce jitters due to the signal noise.

Because a power supply plane and a signal line co-exist on a printed circuit board, implementation of a combination of a measure against power supply noise and a measure against signal noise may be necessary. While the capacitor to be inserted to the first semiconductor circuit for prevention of power supply noise is a component having a high resistance value for quick convergence of power supply noise, a capacitor to be inserted to a second semiconductor circuit for prevention of signal noise is a component having a low resistance value. Thus, a combination of the two measures against noise facilitates flow of power supply noise occurring during an operation of the first semiconductor circuit to a capacitor having a resistance component with a low resistance value inserted to the second semiconductor circuit. Therefore, though the effect of signal noise reduction produced by the capacitor inserted to the second semiconductor circuit could be maintained. The effect of attenuation of power supply noise is lowered, which reduce the effect of reduction of jitters due to power supply noise.

The present invention provides a printed circuit board which may reduce jitters due to power supply noise even with a combination of a first bypass circuit and a second bypass circuit.

SUMMARY OF THE INVENTION

A printed circuit board according to the present invention includes a first semiconductor circuit having an output terminal configured to output a signal, a first power supply terminal to which a power supply potential is applied, and a first ground terminal to which a ground potential is applied;

a second semiconductor circuit having an input terminal to which a signal is input, a second power supply terminal to which a power supply potential is applied and a second ground terminal to which a ground potential is applied;

a printed wiring board on which the first semiconductor circuit and the second semiconductor circuit are mounted and a signal line configured to connect the output terminal are the input terminal is provided, the printed wiring board having a power plane in conduction with the first power supply terminal and the second power supply terminal, and a ground plane in conduction with the first ground terminal and the second ground terminal;

a first bypass circuit mounted on the printed wiring board, the first bypass circuit having one end connected to the power plane through a first power supply via provided in the printed wiring board and the other end connected to the ground plane through a first ground via provided in the printed wiring board, the first bypass circuit including a first resistance component and a first capacitance component serially connected to the first resistance component, the first bypass circuit being provided closer to the first semiconductor circuit; and a second bypass circuit mounted on the printed wiring board, the second bypass circuit having one end connected to the power plane through a second power supply via provided in the printed wiring board and the other end connected to the ground plane through a second ground via provided in the printed wiring board, the second bypass circuit including a second resistance component having a lower resistance value than that of the first resistance component and a second capacitance component serially connected to the second resistance component, the second bypass circuit being provided closer to the second semiconductor circuit. In this case, the ground plane has an inner slit being a slit crossing a line segment connecting a connection position of the first ground via and a connection position of the second ground via between the connection position of the first ground via and the connection position of the second ground via.

Further features of the present invention will become apparent from the following description of exemplary embodiments with reference to the attached drawings.

BRIEF DESCRIPTION OF THE DRAWINGS

FIGS. 9A to 9C are schematic diagrams illustrating a printed circuit board according to a third embodiment.

FIGS. 27A to 27C are schematic diagrams of a printed wiring board according to a fourth comparison example.

DESCRIPTION OF THE EMBODIMENTS

Embodiments of the present invention will be described below with reference to drawings.

First Embodiment

Figure 1A:
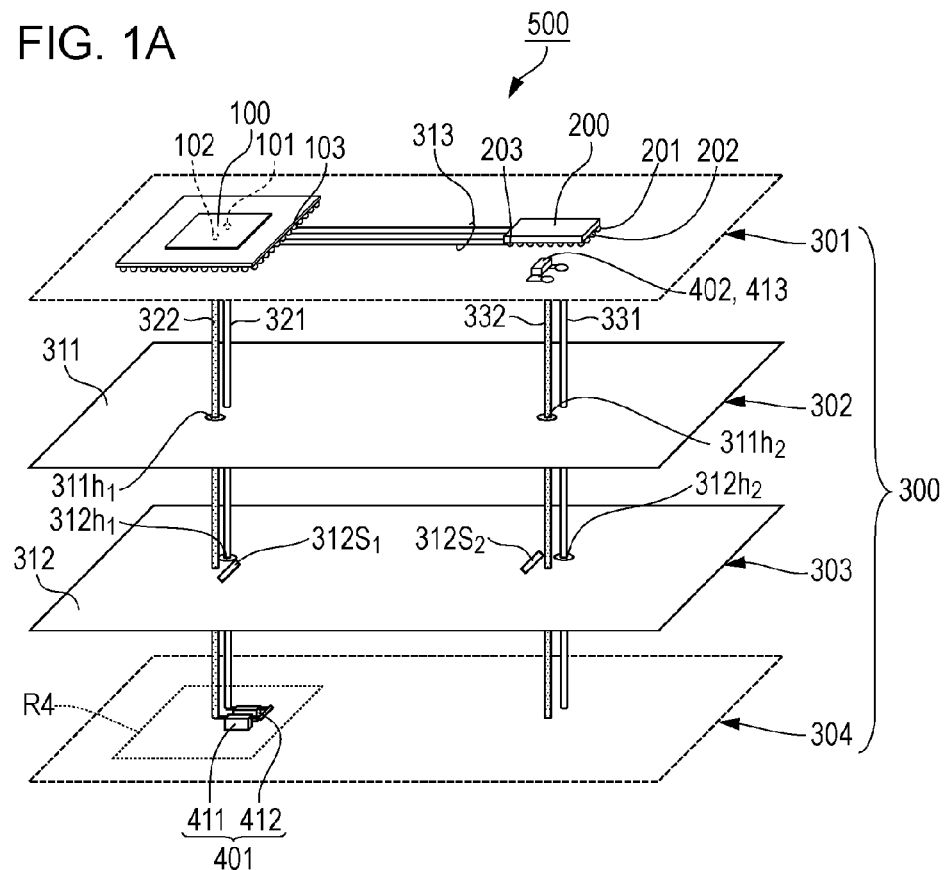
FIGS. 1A and 1B are schematic diagrams illustrating a printed circuit board according to a first embodiment.
Figure 1B:
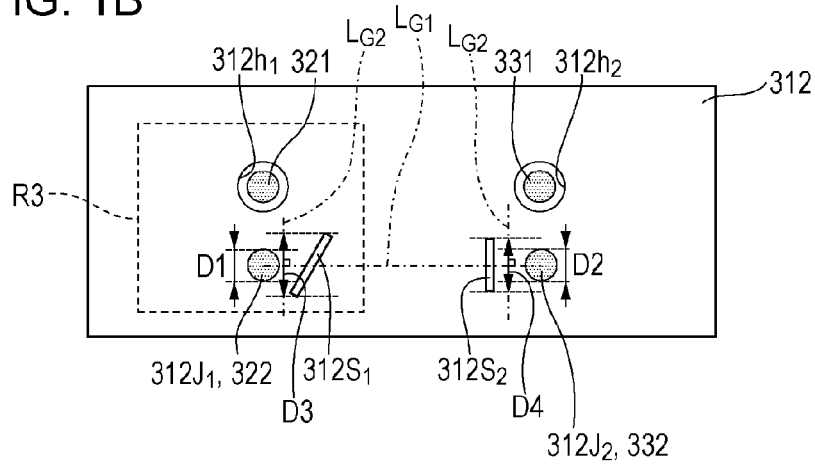

FIGS. 1A and 1B are schematic diagrams illustrating a printed circuit board according to a first embodiment of the present invention. FIG. 1A is a perspective view of the printed circuit board, and FIG. 1B is an upper surface view of a ground plane. As illustrated in FIG. 1A, a printed circuit board 500 includes a printed wiring board 300, a semiconductor device 100 being a first semiconductor circuit, and semiconductor device 200 being a second semiconductor circuit. In this case, the semiconductor devices 100 and 200 are mounted on the printed wiring board 300.

According to the first embodiment, the semiconductor device 100 is a memory controller, and the semiconductor device 200 is a memory (such as a DDR3SDRAM). It should be noted that the semiconductor devices 100 and 200 are not limited thereto. The semiconductor device 100 may only be required to have an output circuit usable for outputting a signal, and the semiconductor device 200 may only be required to have an input circuit usable for inputting a signal.

The semiconductor device 100 at least has an output terminal 103, a power supply terminal 101 being a first power supply terminal, and a ground terminal 102 being a first ground terminal. The output terminal 103 is a terminal configured to output a signal (digital signal) generated by an output circuit within the package internal. A power supply potential is applied to the power supply terminal 101, and a ground potential is applied to the ground terminal 102. The voltage applied between the power supply terminal 101 and the ground terminal 102 causes supply of power to and operates a circuit within the semiconductor device 100.

The semiconductor device 200 at least has an input terminal 203, a power supply terminal 201 being a second power supply terminal, and a ground terminal 202 being a second ground terminal. The input terminal 203 is a terminal usable for externally input a signal received at an internal input circuit within the package. A power supply potential is applied to the power supply terminal 201, and a ground potential is applied to the ground terminal 202. The voltage applied between the power supply terminal 201 and the ground terminal 202 causes supply of power to and operates a circuit within the semiconductor device 200.

According to the first embodiment, the semiconductor device 100 has a plurality of (four in FIG. 1A) output terminals 103, and the semiconductor device 200 has a plurality of (four in FIG. 1A) input terminals 203.

The semiconductor device 100 has a plurality of power supply terminals 101 and a plurality of ground terminals 102. The semiconductor device 200 has a plurality of power supply terminals 201 and a plurality of ground terminals 202.

According to the first embodiment, the semiconductor device 100 is a BGA type semiconductor device and has a plurality of terminals 101, 102, and 103 on a lower surface of the package substrate. According to the first embodiment, the semiconductor device 200 is a BGA type semiconductor device and has a plurality of terminals 201, 202, and 203 on a lower surface of the package substrate.

The semiconductor devices 100 and 200 are not limited to those of the BGA type. The semiconductor device 100 may have an input terminal (input circuit) usable for inputting a signal, and the semiconductor device 200 may have an output terminal (output circuit) usable for outputting a signal.

The printed wiring board 300 is a multilayer printed wiring board having a plurality of (four in the first embodiment) conductor layers on which conductors are placed. In other words, the printed wiring board 300 is a layered printed wiring board on which a surface layer 301, an inner layer 302, an inner layer 303, and a surface layer 304, which are conductor layers on each of which a conductor pattern is placed, are stacked through an insulator layer (dielectric layer). The surface layers 301 and 304 have a solder resist, not illustrated, thereon.

The surface layer 301 has a signal pattern 313 thereon. The signal pattern 313 is a signal line which electrically connects an output terminal 103 of the semiconductor device 100 and the input terminal 203 of the semiconductor device 200. According to the first embodiment, because a plurality of (four, for example) output terminals 103 and a plurality of (four, for example) input terminals 203 are provided, a plurality of (four) signal patterns 313 also functioning as signal lines are provided. The signal pattern 313 may be a conductor made of a copper foil, for example. Though only the surface layer 301 has a signal line according to the first embodiment, the signal line may be provided across the surface layer 301 and another layer.

The inner layer 302 neighboring to the surface layer 301 through an insulator layer has a power supply pattern (power plane) 311 made of a plane-shaped conductor to which a power supply potentials applied from a power supply circuit, not illustrated. The inner layer 303 provided between the inner layer 302 and the surface layer 304 and neighboring to the conductor layers 302 and 304 through an insulator layer has a ground pattern (ground plane) 312 made of a plane-shaped conductor to which a ground potential is applied from a power supply circuit, not illustrated. According to the first embodiment, the semiconductor devices 100 and 200 are mounted on the surface layer (component mount surface) 301.

The power supply terminal 101 of the semiconductor device 100 is electrically connected to the power plane 311 through a power supply via 321 which is a first power supply via of the printed wiring board 300. The ground terminal 102 of the semiconductor device 100 is electrically connected to the ground plane 312 through a ground via 322 being a first ground via of the printed wiring board 300. The power supply via 321 and ground via 322 are provided at positions facing the semiconductor device 100 in the direction perpendicular to the surface (surface layer 301) of the printed wiring board 300.

The power supply terminal 201 of the semiconductor device 200 is electrically connected to the power plane 311 through a power supply via, not illustrated, and the ground terminal 202 is electrically connected to the ground plane 312 through a ground via, not illustrated.

Thus, the power plane 311 is in conduction with the power supply terminal 101 of the semiconductor device 100 and the power supply terminal 201 of the semiconductor device 200. The ground plane 312 is in conduction with the ground terminal 102 of the semiconductor device 100 and the ground terminal 202 of the semiconductor device 200. Operating voltage generated by the power supply circuit, not illustrated, is applied between the power supply terminal 101 and the ground terminal 102 of the semiconductor device 100 and between the power supply terminal 201 and the ground terminal 202 of the semiconductor device 200.

The printed circuit board 500 has a bypass circuit 401 being a first bypass circuit provided closer to the semiconductor device 100 (first semiconductor circuit) and a bypass circuit 402 being a second bypass circuit closer to the semiconductor device 200 (second semiconductor circuit).

The bypass circuits 401 and 402 are mounted in the printed wiring board 300. According to the first embodiment, the bypass circuit 401 is mounted on the surface layer 304 (opposite to the plane on which the semiconductor device 100 is mounted). The bypass circuit 402 is mounted on a surface layer 301 (on which the semiconductor device 200 is mounted).

The bypass circuit 401 is placed within a projection region (within region R4) on which the semiconductor device 100 is projected in the direction perpendicular to the plane of the printed wiring board 300 on the surface layer 304. The bypass circuit 402 is placed in vicinity of the semiconductor device 200. In other words, the bypass circuit 402 is placed adjacent to the semiconductor device 200 without through no component between the bypass circuit 402 and the semiconductor device 200.

The power supply via 321 is a conductor provided within a through-hole of the printed wiring board 300, and the ground via 322 is a conductor provided within a through-hole of the printed wiring board 300.

The printed wiring board 300 has a power supply via 331 being a second power supply via and a ground via 332 being a second ground via around the semiconductor device 200 (in vicinity of the bypass circuit 402).

The power supply via 331 is a conductor provided within a through-hole of the printed wiring board 300, and the ground via 332 is a conductor provided within a through-hole of the printed wiring board 300.

The power supply vias 321 and 331 are both connected to the power plane 311 by extending within through holes 312$h_1$ and 312$h_2$ of the ground plane 312 in non-contact with the ground plane 312. The ground vias 322 and 332 are both connected to the ground plane 312 by extending within through holes 311$h_1$ and 311$h_2$ of the power plane 311 in non-contact with the power plane 311. Thus, the power supply vias 321 and 331 are in conduction with the power plane 311 and in non-conduction with the ground plane 312. The ground vias 322 and 332 are in conduction with the ground plane 312 and in non-conduction with the power plane 311.

The bypass circuit 401 has one end electrically connected to the power plane 311 (power supply terminal 101) through the power supply via 321, and the bypass circuit 401 has the other end electrically connected to the ground plane 312 (ground terminal 102) through the ground via 322. The bypass circuit 402 has one end electrically connected to the power plane 311 through the power supply via 331, and the bypass circuit 402 has the other end electrically connected to the ground plane 312 through the ground via 332.

The bypass circuit 401 has a first resistance component and a first capacitance component serially connected to the first resistance component. According to the first embodiment, the bypass circuit 401 includes a resistive element 411 and a capacitor element 412 serially connected to the resistive element 411.

The first resistance component includes a resistance of the resistive element 411 and a resistance (parasitic resistance) of the capacitor element 412. The first capacitance component includes a capacitance component of the capacitor element 412. The bypass circuit 401 may only include a capacitor element having a high parasitic resistance value.

The bypass circuit 401 may be used for preventing a power supply noise prevention and bypasses the power supply terminal 101 (power plane 311) and the ground terminal 102 (ground plane 312) against power supply noise by using the first capacitance component. The bypass circuit 401 accelerates the convergence of power supply noise occurring in an operation of the semiconductor device 100 by using the first resistance component.

The bypass circuit 402 has a second resistance component and a second capacitance component serially connected to the second resistance component. According to the first embodiment, the bypass circuit 402 includes a capacitor element 413.

The second resistance component contains a resistance (parasitic resistance) of a capacitor element 413 and has a resistance value having a lower resistance value than that of the first resistance component of the bypass circuit 401. The second capacitance component includes a capacitance component of the capacitor element 413. The bypass circuit 402 may have a resistive element serially connected to the capacitor element 413 if the second resistance component has a resistance value lower than the resistance value of the first resistance component.

The bypass circuit 402 may be used for preventing signal noise and bypasses the signal noise occurring in the power plane 311 due to the electromagnetic coupling between the signal pattern 313 and the power plane 311 to the ground plane 312 by using the second capacitance component. Therefore, the resistance value of the second resistance component in the bypass circuit 402 is lower than the resistance value of the first resistance component in the bypass circuit 401 because the resistance value of the second resistance component is preferably lower as much as possible.

As illustrated in FIG. 1B, the ground plane 312 has a through hole 312$h_1$ within which the power supply via 321 extends and a through hole 312$h_2$ within which the power supply via 331 extends. The ground plane 312 has a connecting portion 312$J_1$ to which the ground via 322 is connected and a connecting portion 312$J_2$ to which the ground via 332 is connected. These through hole 312$h_1$ and connecting portion 312$J_1$ are provided within a projection region R3 acquired by projecting the semiconductor device 100 to the inner layer 303 in the direction perpendicular to a surface (surface layer 301) of the printed wiring board 300.

The power supply vias 321 and 331 are insulated by clearance of the through holes 312$h_1$ and 312$h_2$ to prevent a short circuit with the ground plane 312. The ground vias 322 and 332 are connected to the ground plane 312 through the connecting portions 312$J_1$ and 312$J_2$. Each of the vias 321, 322, 331, and 332 has a circular cross section, and an equal diameter is set for all of them. It should be noted that the cross sections of the vias 321, 322, 331, and 332 may not have an equal diameter. Assume that a virtual straight line segment connecting the center point of the connecting portion (connection position) 312$J_1$ of the ground via 322 and the center point of the connecting portion (connection position) 312$J_2$ of the ground via 332 is a line segment $L_{G1}$.

According to the first embodiment, the ground plane 312 has slits (inner slits) 312$S_1$ and 312$S_2$ crossing the line segment $L_{G1}$ between the connecting portion 312$J_1$ of the ground via 322 and the connecting portion 312$J_2$ of the ground via 332. In other words, the ground plane 312 has at least one slit (two slits 312$S_1$ and 312$S_2$ according to the first embodiment) crossing the line segment $L_{G1}$. Thus, the inductance or impedance between the ground via 322 and the ground via 332 is increased, and the power supply noise propagating to the ground via 322 is not easily fed to the bypass circuit 402 and can easily be fed to the bypass circuit 401. Therefore, the effect of attenuation of power supply noise produced by the bypass circuit 401 increases, and the power supply noise may converge faster. As a result, because the power supply noise can effectively be reduced in the bypass circuit 401 even when the bypass circuit 401 and the bypass circuit 402 are combined, jitters of signals propagating through the signal pattern 313 can be reduced.

While one or three or more slits may be provided for one line segment $L_{G1}$ and may cross one line segment $L_{G1}$, two slits are provided according to the first embodiment.

The slit 312$S_1$ is neighboring to the ground via 322 and crosses the line segment $L_{G1}$. A length D3 of the slit 312$S_1$ in a direction along a line $L_{G2}$ perpendicular to the line segment $L_{G1}$ is longer than a diameter D1 of the ground via 322.

The slit 312$S_2$ is neighboring to the ground via 332 and crosses the line segment $L_{G1}$. A length D4 of the slit 312$S_2$ in a direction along the line $L_{G2}$ perpendicular to the line segment $L_{G1}$ is longer than the diameter D2 of the ground via 332.

In other words, according to the first embodiment, the slits 312S$_1$ and 312S$_2$ extend longer in the crossing direction (along the perpendicular line $L_{G2}$) than the diameters D3 and D4 of the ground vias 322 and 332. This may effectively increase the inductance between the connecting portion 312J$_1$ of the ground via 322 and the connecting portion 312J$_2$ of the ground via 332 on the ground plane 312, more effectively reducing jitters of signals.

According to the first embodiment, on the ground plane 312, the slit 312S$_1$ is in vicinity of the connecting portion 312J$_1$ of the ground via 322, and the slit 312S$_2$ is in vicinity of the connecting portion 312J$_2$ of the ground via 332. The expression "in vicinity of the connecting portion 312J$_1$" refers to a state that no other pixels and conductors are provided between the slit 312S$_1$ and the connecting portion 312J$_1$, and the expression "in vicinity of the connecting portion 312J$_2$" refers to a state that no other pixels and conductors are provided between the slit 312S$_2$ and the connecting portion 312J$_2$. According to the first embodiment, the slit 312S$_1$ is neighboring to the connecting portion 312J$_1$, and the slit 312S$_2$ is neighboring to the connecting portion 312J$_2$. This may effectively increase the inductance (impedance) between the connecting portion 312J$_1$ of the ground via 322 and the connecting portion 312J$_2$ of the ground via 332, more effectively reducing jitters of signals.

Next, a combination of the power supply noise measure (bypass circuit 401) and the signal noise measure (bypass circuit 402) will be described with respect to a cause of an increase of jitters with reference to a model according to a first comparison example.

Figure 15:
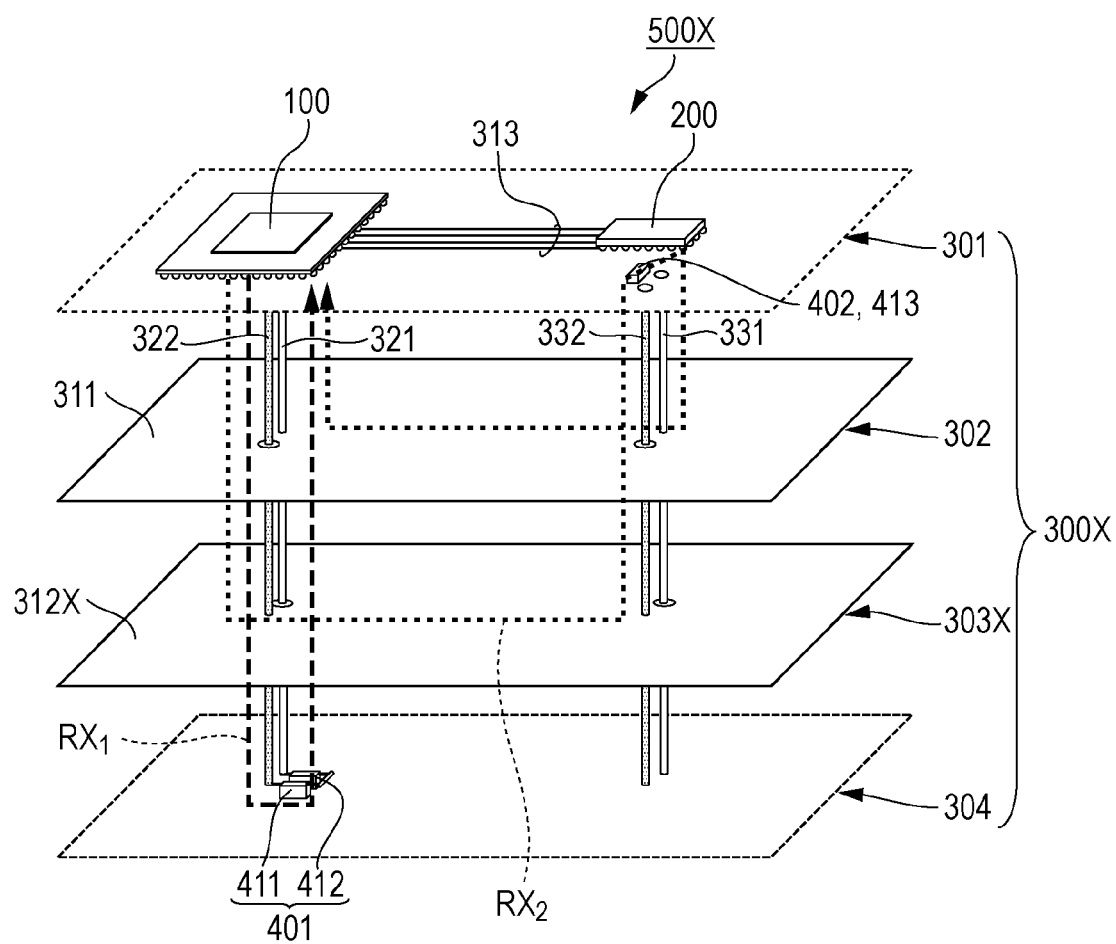
FIG. 15 is a schematic diagram illustrating the printed circuit board according to the first comparison example.

FIG. 15 is a schematic diagram illustrating a printed circuit board according to the first comparison example. Like numbers refer to like parts through the configuration of the printed circuit board 500 according to the first embodiment and the printed circuit board 500X according to the first comparison example illustrated in FIG. 15. FIG. 15 illustrates a perspective view of the printed circuit board 500X according to the first comparison example. The printed circuit board 500X includes a printed wiring board 300X according to the first comparison example and a semiconductor device 100 and a semiconductor device 200 similar to those of the first embodiment. Like the first embodiment, bypass circuits 401 and 402 are mounted on the printed wiring board 300X.

The printed wiring board 300X is a four-layer substrate including a surface layer 301, an inner layer 302, an inner layer 303X, and a surface layer 304. The ground plane 312X provided in the inner layer 303X is different from the ground plane 312 having the slits 312S$_1$ and 312S$_2$ according to the first embodiment. In other words, the ground plane 312X of the printed wiring board 300X has no slit. As illustrated in FIG. 15, power supply noise propagates through a path RX$_1$ and a path RX$_2$ in the printed circuit board 500X according to the first comparison example. The path RX$_1$ is a path for feeding power from the bypass circuit 401 to the semiconductor device 100. The path RX$_2$ is a path for feeding power from the capacitor element 413 in the bypass circuit 402 which is added for reducing signal noise.

Figure 16A:
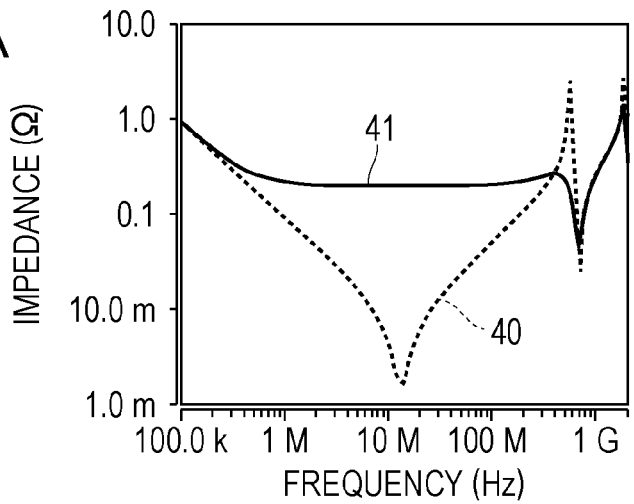
FIGS. 16A to 16C are graphs illustrating changes in impedance of a power feeding path caused by first and second bypass circuits on the printed circuit board according to the first comparison example.
Figure 16B:
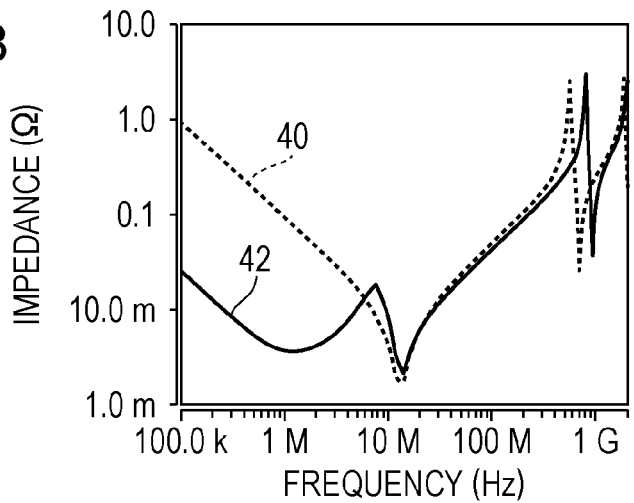
Figure 16C:
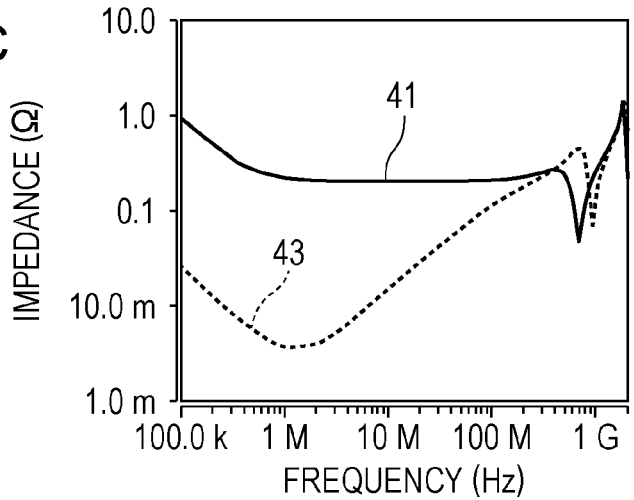

FIGS. 16A to 16C are graphs illustrating changes in impedance of a power feeding path with the bypass circuit 401 for preventing power supply noise and the bypass circuit 402 for preventing signal noise on the printed circuit board according to the first comparison example. The horizontal axis of each of the graphs indicates frequency. The vertical axis of the graphs indicate impedance observed from the power supply terminal 101 and the ground terminal 102 of the semiconductor device 100.

FIG. 16A is a graph illustrating changes in impedance in a case where the bypass circuit 401 only has the capacitor element 412 and a case where the bypass circuit 401 has the capacitor element 412 and the resistive element 411. The bypass circuit 402 is not mounted in either case. In a range from 100 [kHz] to 300 [MHz], an impedance 41 with the capacitor element 412 and the resistive element 411 is higher than an impedance 40 with the capacitor element 412 only.

FIG. 16B illustrates changes in impedance in a case where the bypass circuit 402 is added thereto. In a range from 100 [kHz] to 300 [MHz] excluding a resonance frequency of 8 [MHz], an impedance 42 with the added bypass circuit 402 is lower than the impedance 40 with the capacitor element 412 mounted in the bypass circuit 401.

FIG. 16C is a graph comparing impedance 41 in a case where the bypass circuit 401 is mounted while the bypass circuit 402 is not mounted and an impedance 43 in a case where the bypass circuit 401 and the bypass circuit 402 are mounted. It may be found that, in a range from 100 [kHz] to 300 [MHz], the bypass circuit 402 further provided in addition to the bypass circuit 401 reduces the impedance.

It may be considered from the magnitude relationship of impedance that the combination of the power supply noise measure and the signal noise measure changes the main power feeding path to the semiconductor device 100 from the path RX$_1$ through the bypass circuit 401 to the path RX$_2$ through the bypass circuit 402. As a result, the effect of the earlier convergence of power supply noise through the resistive element 411 in the bypass circuit 401 decreases, and the power supply noise increases, which increases jitters.

As described above, the fact has been focused that such a jitter increase is caused by a change of the power feeding path on the printed circuit board 500X according to the first comparison example. Thus, in order to prevent such a change of the power feeding path, the impedance of the path RX$_1$ through the bypass circuit 401 is caused to be higher than the impedance of the path RX$_2$ through the bypass circuit 402. In order to cause the impedance of the path RX$_2$ to be higher, the inductance of at least one (ground plane 312 according to the first embodiment) of the ground plane 312 and power plane 311 is increased by forming the slits 312S$_1$ and 312S$_2$.

An inductance $L_{total}$ is a sum of self-inductances $L_{vdd}$ and $L_{gnd}$ of the power plane 311 and the ground plane 312 and a mutual inductance M, as follows:

$$L_{total}=L_{vdd}+L_{gnd}\pm 2M \quad (1)$$

In this case, the mutual inductance M has different signs depending on the directions of the current of the power plane 311 and the ground plane 312. When they have the same directions, the mutual inductance M has a positive sign. When they have the opposite directions against each other, the mutual inductance M has a negative sign. In order to increase the inductance $L_{total}$, the self-inductances $L_{vdd}$ and $L_{gnd}$ are increased. When power is fed to the semiconductor device 100, the mutual inductance M is reduced to increase the inductance $L_{total}$ because the power plane 311 and the ground plane 312 have opposite directions of current against each other.

The first embodiment focuses on increasing the self inductance $L_{gnd}$ of the ground plane 312. The self-inductance is proportional to the length of a current path. Accordingly, the ground plane 312 has slits 312S₁ and 312S₂ to increase the current path and increase the self-inductance $L_{gnd}$.

Figure 2A:
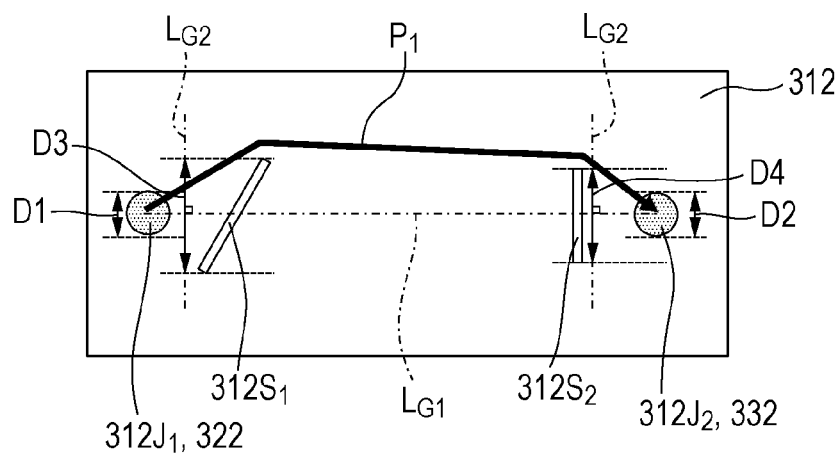
FIGS. 2A and 2B are schematic diagram illustrating a path of current on a ground plane of the printed wiring board of the first embodiment and a ground plane of a printed wiring board according to a first comparison example.
Figure 2B:
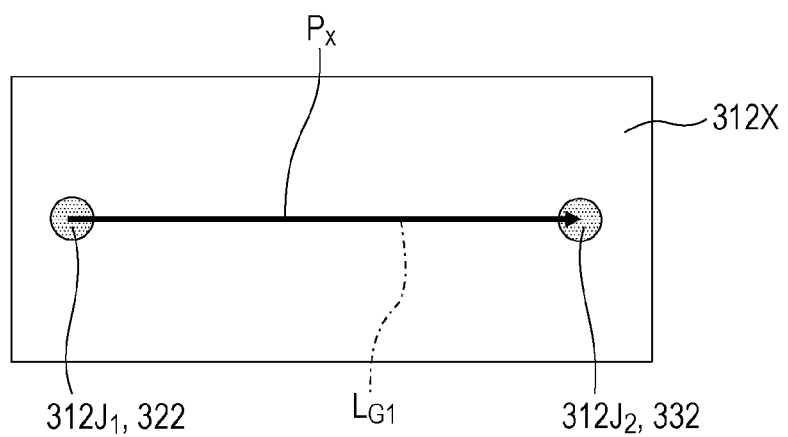

FIGS. 2A and 2B are schematic diagrams illustrating current paths on the ground plane 312 in the printed wiring board 300 according to the first embodiment and the ground plane 312X in the printed wiring board 300X according to the first comparison example. FIG. 2A illustrates a current path on the ground plane 312 in the printed wiring board 300 according to the first embodiment, and FIG. 2B illustrates a current path on the ground plane 312X in the printed wiring board 300X according to the first comparison example.

The line segment $L_{G1}$ coupling the ground via 322 and the ground via 332 illustrated in FIG. 2B is the shortest distance between the two points. When the ground plane 312X is a uniform conductor, the shortest distance is a path $P_x$ having the lowest impedance. Therefore, current mainly flows on the line segment $L_{G1}$.

According to the first embodiment on the other hand, as illustrated in FIG. 2B, the slit 312S₁ crosses the line segment $L_{G1}$ in vicinity of the ground via 322, and the slit 312S₂ crosses the line segment $L_{G1}$ in vicinity of the ground via 332.

In this case, the length D3 of the slit 312S₁ projected to the perpendicular line $L_{G2}$ to line segment $L_{G1}$ is longer than the diameter D1 of the ground via 322. The length D4 of the slit 312S₂ projected to the perpendicular line $L_{G2}$ to the line segment $L_{G1}$ is longer than the diameter D2 of the ground via 332. Thus, because current flows through a path $P_1$ bypassing the slits 312S₁ and 312S₂, the current path is longer than the shortest path $P_x$, which effectively increases the self-inductance.

The slits 312S₁ and 312S₂ play a role in bypassing a current path for increasing the self-inductance. For that, the slits 312S₁ and 312S₂ may have any shape for bypassing a current path.

According to the first embodiment, the slits 312S₁ and 312S₂ are straight lines extending in the direction crossing the line segment $L_{G1}$. The slit 312S₂ particularly is a straight line extending in the direction orthogonal to the line segment $L_{G1}$. It should be understood that the shapes of the slits 312S₁ and 312S₂ are not limited to a straight line.

Figure 3A:
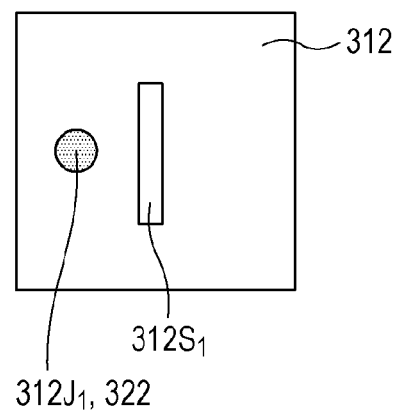
FIGS. 3A to 3C are schematic diagrams illustrating shapes of an inner slit of a ground plane.
Figure 3B:
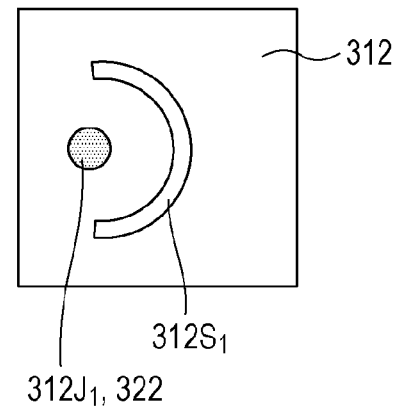
Figure 3C:
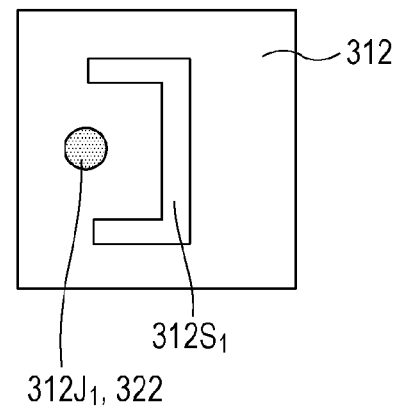

FIGS. 3A to 3C are schematic diagrams illustrating a shape of the slit 312S₁ of the ground plane 312. The slit 312S₁ may have a linear (stick-like) shape as illustrated in FIG. 3A. Alternatively, the slit 312S₁ may be arc-shaped as illustrated in FIG. 3B, or the slit 312S₁ may be U-shaped as illustrated in FIG. 3C. Though FIGS. 3A to 3C illustrate the slit 312S₁ in vicinity of the connecting portion 312J₁ of the ground via 322, the same is true for the slit 312S₂ in vicinity of the connecting portion 312J₂ of the ground via 332. The slits 312S₁ and 312S₂ may have any shape if the shape bypasses the current path and may be linear (stick-shaped), arc-shaped, or U-shaped, for example.

The printed circuit board 500 was designed based on the method for increasing the inductance and was computer-simulated to check the effect. Power SI by Cadence was used for an impedance simulation. HSPICE by Synopsys was used for a jitter simulation.

Figure 4A:
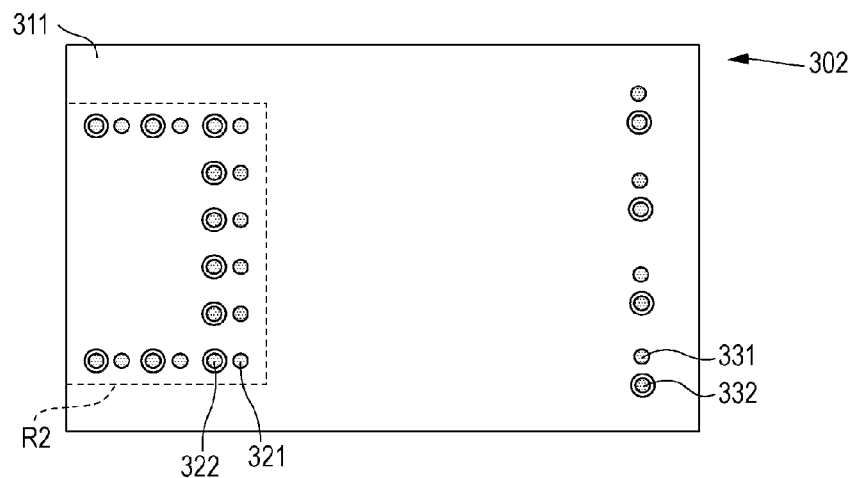
FIGS. 4A and 4B are schematic diagrams illustrating simulation models of a power plane and a ground plane of a printed wiring board of the printed circuit board according to the first embodiment.
Figure 4B:
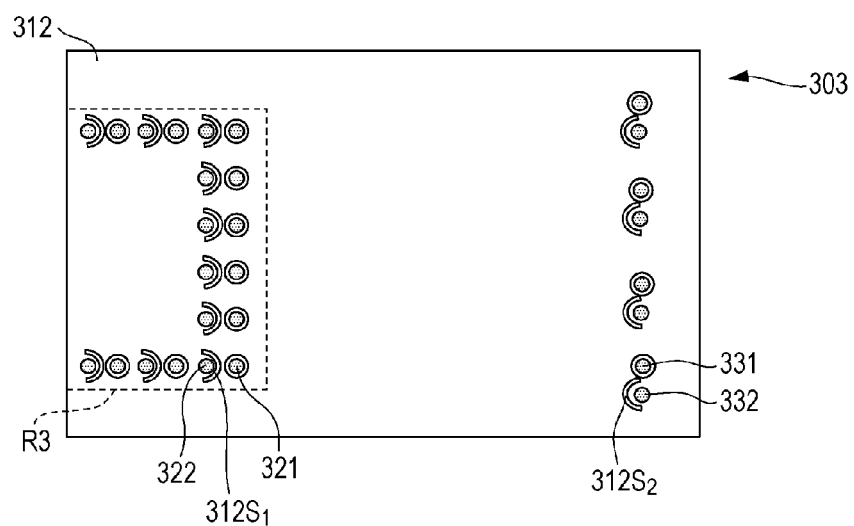

FIGS. 4A and 4B are schematic diagrams illustrating simulation models for a power plane and a ground plane of a printed wiring board on the printed circuit board according to the first embodiment of the present invention. FIG. 4A is a top surface view illustrating the power plane 311, and FIG. 4B is a top surface view illustrating the ground plane 312. The layer configuration of the printed wiring board 300 is described on Table 1 below.

TABLE 1

| | |
|---|---|
| SOLDER RESIST | 20 μm |
| CONDUCTOR IN SURFACE LAYER 301 | 35 μm |
| DIELECTRIC LAYER BETWEEN SURFACE LAYER 301 AND INNER LAYER 302 | 100 μm |
| POWER PLANE 311 | 35 μm |
| DIELECTRIC LAYER BETWEEN INNER LAYER 302 AND INNER LAYER 303 | 100 μm |
| GROUND PLANE 312 | 35 μm |
| DIELECTRIC LAYER BETWEEN INNER LAYER 303 AND SURFACE LAYER 304 | 100 μm |
| CONDUCTOR IN SURFACE LAYER 304 | 35 μm |
| SOLDER RESIST | 20 μm |

The substrate had vias having a hole diameter of 0.3 [mm], a land diameter of 0.6 [mm], and a clearance diameter of 0.9 [mm]. The power plane 311 of the inner layer 302 and the ground plane 312 of the inner layer 303 had a depth of 55 [mm] and a landscape of 44 [mm]. The semiconductor device 100 had a depth of 20 [mm] and a landscape of 20 [mm]. Projections regions R2 and R3 acquired by projecting the semiconductor device 100 to the inner layers 302 and 303 in a direction perpendicular to the plane of the printed wiring board 300 had ten power supply vias 321 and ten ground vias 322. The region of the semiconductor device 200 had four power supply vias 331 and four ground vias 332.

The slit 312S₁ and slit 312S₂ are provided in proximity of the ground via 322 and the ground via 332 as a feature of the first embodiment. The slits 312S₁ and 312S₂ had an arc shape about the ground vias 322 and 332, respectively, and the radius of the arcs was 0.5 [mm], and the width of the arcs was 0.2 [mm]. The distance between the center of the semiconductor device 100 and the center of the semiconductor device 200 was equal to 35 [mm].

Figure 5A:
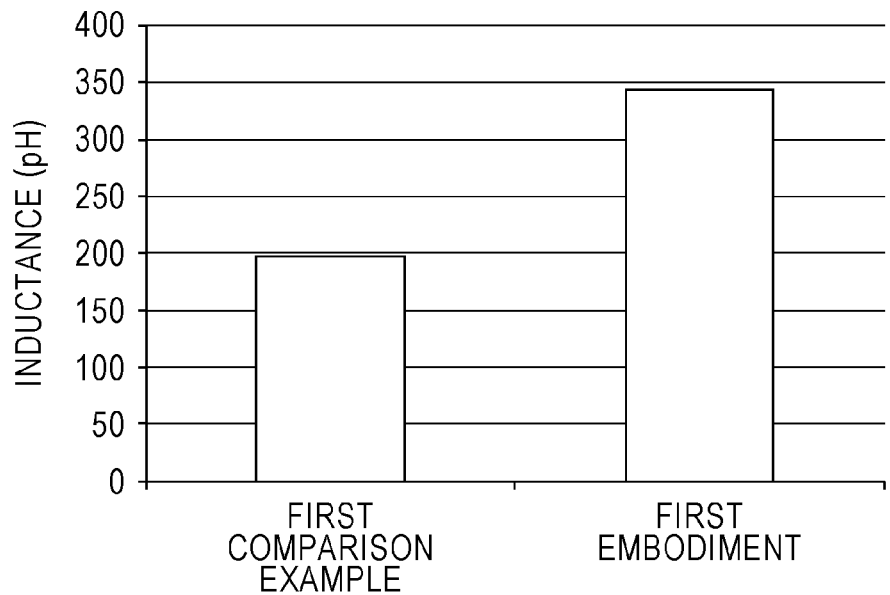
FIGS. 5A and 5B are graphs comparing a simulation result of the printed circuit board according to the first embodiment and a simulation result of the printed circuit board of the first comparison example.
Figure 5B:
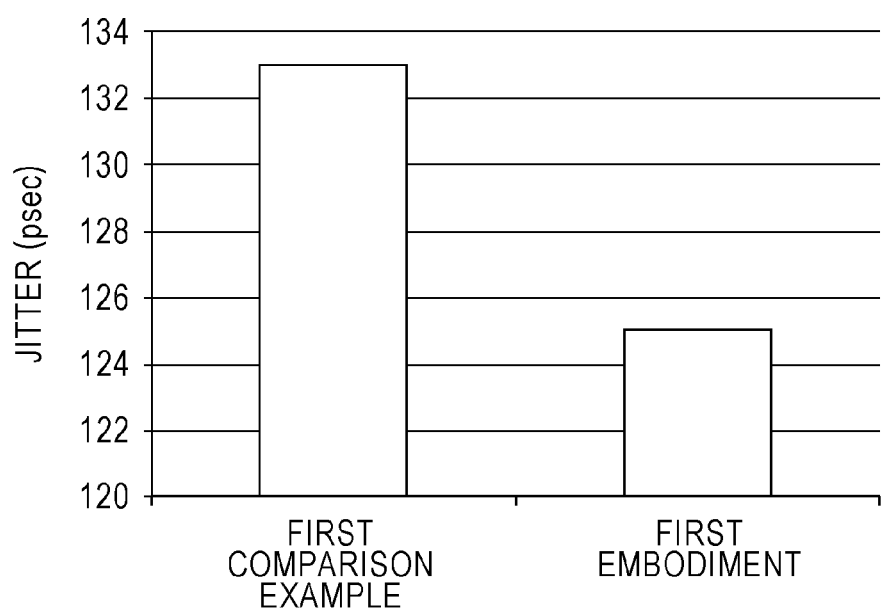

FIGS. 5A and 5B are graphs each comparing a simulation result of the printed circuit board 500 according to the first embodiment of the present invention and a simulation result of the printed circuit board 500X according to the first comparison example.

The input impedance between the power supply terminal 101 and the ground terminal 102 of the semiconductor device 100 was acquired by performing a simulation using Power SI by Cadence. In this case, the capacitor element 412 and the resistive element 411 were not mounted in the semiconductor device 100 according to the first embodiment and the first comparison example, and the capacitor element 413 was mounted in the semiconductor device 200. From the value of the impedance Z at 100 MHz, the inductance L was calculated by using the following Expression (2):

$$L = Z/j\omega \quad (2)$$

Here, $\omega = 2\pi f$, and $\pi$ is a circular constant, and f is a frequency.

FIG. 5A illustrates results of a comparison according to the method of inductances of the printed circuit board 500X according to the first comparison example and the printed circuit board 500 according to the first embodiment. While the inductance of the power feeding path through the capacitor element 413 was 198 [pH] in the first comparison example, it was 344 [pH] in the first embodiment. In other words, the slits 312S₁ and 312S₂ provided on the ground plane 312 of the first embodiment increased the inductance by 146 [pH] and prevented a change of the power feeding path.

FIG. 5B is a graph illustrating a comparison of jitters between the first embodiment and the first comparison example. Simulating with a waveform assuming DDR3-

1333, jitters in the output terminal 103 of the semiconductor device 100 were measured. The reference voltage of jitters is a half of the power supply voltage when the power supply voltage is 1.425 [V] (1.5 [V]×0.9 [%]), the reference voltage is 0.7125 [V]. Jitters in the first comparison example were measured as 133 [psec] while jitters in the first embodiment were measured as 125 [psec]. The slits $312S_1$ and $312S_2$ according to the first embodiment were able to reduce jitters by 8 [psec].

According to the first embodiment, as described above, the slits $312S_1$ and $312S_2$ of the ground plane 312 are able to prevent changes of the power feeding path, and the jitters thus can be reduced compared with the first comparison example.

Second Embodiment

Figure 6A:
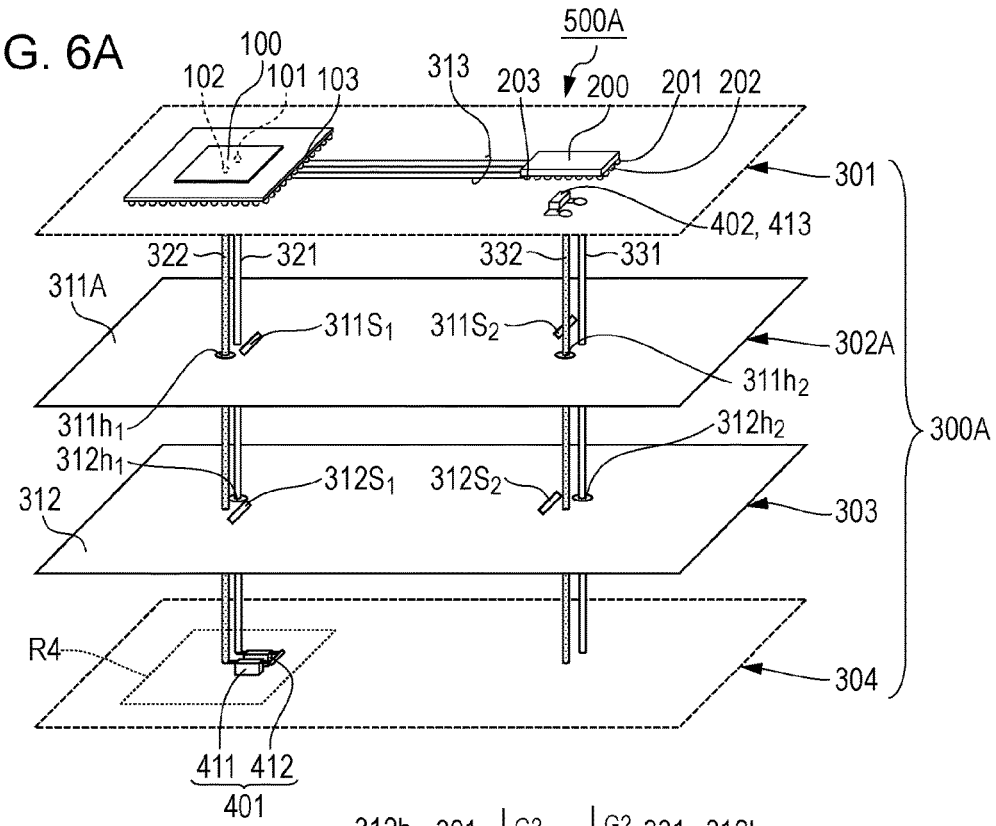
FIGS. 6A to 6C are schematic diagrams illustrating a printed circuit board according to a second embodiment.
Figure 6B:
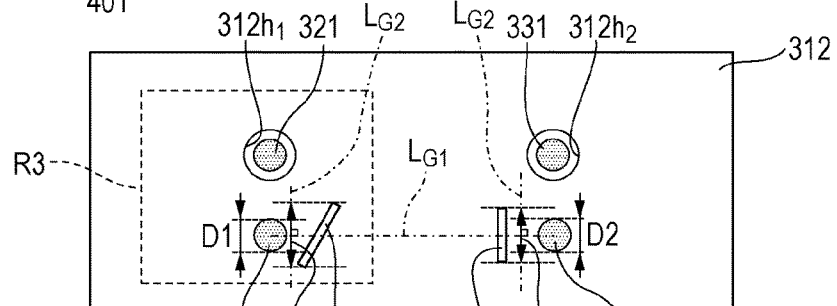
Figure 6C:
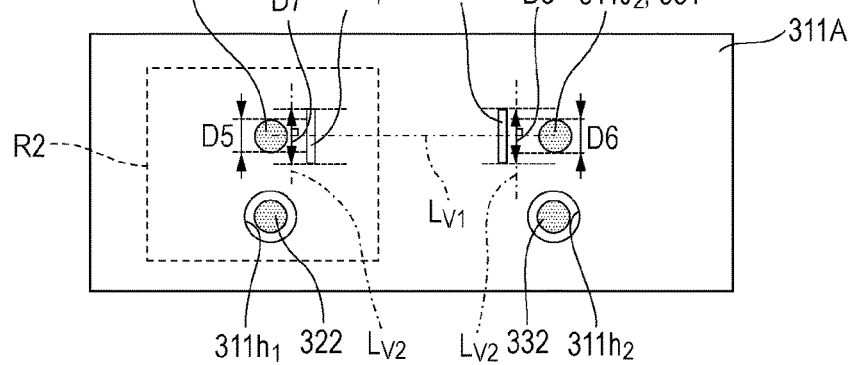

Next, a printed circuit board according to a second embodiment of the present invention will be described. FIGS. 6A to 6C are schematic diagrams illustrating a printed circuit board according to the second embodiment of the present invention. FIG. 6A is a perspective view of the printed circuit board, FIG. 6B is an upper surface view of a ground plane, and FIG. 6C is an upper surface view of a power plane. Like numbers refer to like parts throughout in descriptions of the first embodiment and the second embodiment, and the repetitive description will be omitted.

As illustrated in FIG. 6A, a printed circuit board 500A according to the second embodiment includes a printed wiring board 300A, a semiconductor device 100 and a semiconductor device 200 similar to those of the first embodiment and mounted on the printed wiring board 300A.

The printed wiring board 300A is a multilayer printed wiring board having a plurality of (four in the second embodiment) conductor layers on which conductors are placed. In other words, the printed wiring board 300A is a layered printed wiring board in which a surface layer 301, an inner layer 302A, an inner layer 303 and a surface layer 304, which are conductor layers each having a conductor pattern, are stacked through an insulator layer (dielectric layer). The surface layers 301 and 304 have a solder resist, not illustrated, thereon.

A power plane 311A of the inner layer 302A according the second embodiment is different from the power plane 311 in the first embodiment.

Like the first embodiment, the surface layer 301 has a signal pattern 313 thereon. The signal pattern 313 is a signal line which electrically connects an output terminal 103 of the semiconductor device 100 and the input terminal 203 of the semiconductor device 200.

The inner layer 302A has a power supply pattern (power plane) 311A made of a plane-shaped conductor to which a power supply potential is applied from a power supply circuit, not illustrated.

The inner layer 303 has a ground plane 312 having slits $312S_1$ and $312S_2$, like the first embodiment. Also in the second embodiment, the semiconductor devices 100 and 200 are mounted on the surface layer 301, like the first embodiment.

The power supply terminal 101 of the semiconductor device 100 is electrically connected to a power plane 311A through a power supply via 321 which is a first power supply via of the printed wiring board 300. The ground terminal 102 of the semiconductor device 100 is electrically connected to a ground plane 312 through a ground via 322 being a first ground via of the printed wiring board 300. The power supply via 321 and ground via 322 are provided at positions facing the semiconductor device 100 in the direction perpendicular to the surface (surface layer 301) of the printed wiring board 300.

The power supply terminal 201 of the semiconductor device 200 is electrically connected to the power plane 311A through a power supply via, not illustrated, and the ground terminal 202 is electrically connected to the ground plane 312 through a ground via, not illustrated.

The power plane 311A is in conduction with the power supply terminal 101 of the semiconductor device 100 and the power supply terminal 201 of the semiconductor device 200. The ground plane 312 is in conduction with the ground terminal 102 of the semiconductor device 100 and the ground terminal 202 of the semiconductor device 200. Operating voltage generated by the power supply circuit, not illustrated, is applied between the power supply terminal 101 and the ground terminal 102 of the semiconductor device 100 and between the power supply terminal 201 and the ground terminal 202 of the semiconductor device 200.

The printed circuit board 500A has a bypass circuit 401 being a first bypass circuit provided closer to the semiconductor device 100 (first semiconductor circuit) and a bypass circuit 402 being a second bypass circuit closer to the semiconductor device 200 (second semiconductor circuit), like the first embodiment.

The bypass circuits 401 and 402 are mounted in the printed wiring board 300A. Also according to the second embodiment, the bypass circuit 401 is mounted at a position similar to that of the first embodiment, that is, on the surface layer 304 (opposite to the plane on which the semiconductor device 100 is mounted). The bypass circuit 402 is mounted at a position similar to that of the first embodiment, that is, on a surface layer 301 (on which the semiconductor device 200 is mounted).

The bypass circuit 401 is placed within a projection region (within region R4) on which the semiconductor device 100 is projected in the direction perpendicular to the plane of the printed wiring board 300A on the surface layer 304. The bypass circuit 402 is placed in vicinity of the semiconductor device 200. In other words, the bypass circuit 402 is placed adjacent to the semiconductor device 200 without through no component between the bypass circuit 402 and the semiconductor device 200.

The printed wiring board 300A has a power supply via 331 being a second power supply via and a ground via 332 being a second ground via around the semiconductor device 200 (in vicinity of the bypass circuit 402).

The power supply vias 321 and 331 are both connected to the power plane 311A by extending within through holes $312h_1$ and $312h_2$ of the ground plane 312 in non-contact with the ground plane 312. The ground vias 322 and 332 are both connected to the ground plane 312 by extending within through holes $311h_1$ and $311h_2$ of the power plane 311A in non-contact with the power plane 311A. Thus, the power supply vias 321 and 331 are in conduction with the power plane 311A and in non-conduction with the ground plane 312. The ground vias 322 and 332 are in conduction with the ground plane 312 and in non-conduction with the power plane 311A.

The bypass circuit 401 has one end electrically connected to the power plane 311A (power supply terminal 101) through the power supply via 321, and the bypass circuit 401 has the other end electrically connected to the ground plane 312 (ground terminal 102) through the ground via 322. The bypass circuit 402 has one end electrically connected to the power plane 311A through the power supply via 331, and the bypass circuit 402 has the other end electrically connected to the ground plane 312 through the ground via 332.

The bypass circuit 401 is configured similarly to that in the first embodiment and has a first resistance component and a first capacitance component serially connected to the first resistance component. The bypass circuit 402 is also configured similarly to that in the first embodiment and has a capacitor element 413.

As illustrated in FIG. 6B, the ground plane 312 has at least one slit, that is, two slits $312S_1$ and $312S_2$, like the first embodiment. The slits $312S_1$ and $312S_2$ are provided in vicinity of the connecting portions $312J_1$ and $312J_2$ of the ground vias 322 and 332, like the first embodiment. Thus, like the first embodiment, the slits $312S_1$ and $312S_2$ may increase the inductance between the connecting portions $312J_1$ and $312J_2$ of the ground plane 312 and reduce jitters.

As illustrated in FIG. 6C, the power plane 311A has a through hole $311h_1$ through which the ground via 322 extends and a through hole $311h_2$ to which the ground via 332 extends. The power plane 311A has a connecting portion $311J_1$ to which the power supply via 321 is connected and a connecting portion $311J_2$ to which the power supply via 331 is connected. These through hole $311h_1$ and connecting portion $311J_1$ are provided within a projection region R2 acquired by projecting the semiconductor device 100 to the inner layer 302A in the direction perpendicular to the surface (surface layer 301) of the printed wiring board 300.

The ground vias 322 and 332 are insulated by clearance of the through holes $311h_1$ and $311h_2$ to prevent a short circuit with the power plane 311A. The power supply vias 321 and 331 are connected to the power plane 311A through the connecting portions $311J_1$ and $311J_2$. Each of the vias 321, 322, 331, and 332 has a circular cross section, and an equal diameter is set for all of them. It should be noted that the cross sections of the vias 321, 322, 331, and 332 may not have an equal diameter. Assume that a virtual straight line segment connecting the center point of the connecting portion (connection position) $311J_1$ of the power via 321 and the center point of the connecting portion (connection position) $311J_2$ of the power via 331 is a line segment $L_{V1}$.

According to the second embodiment, the power plane 311A has slits (inner slits) $311S_1$ and $311S_2$ crossing the line segment $L_{V1}$ between the connecting portion $311J_1$ of the power supply via 321 and the connecting portion $311J_2$ of the power supply via 331. In other words, the power plane 311A has at least one slit (two slits $311S_1$ and $311S_2$ according to the second embodiment) crossing the line segment $L_{V1}$. Thus, the inductance or impedance between the power supply via 321 and the power supply via 331 is increased, and the power supply noise propagating to the power supply via 321 is not easily fed to the bypass circuit 402 and can easily be fed to the bypass circuit 401. Therefore, the effect of attenuation of power supply noise produced by the bypass circuit 401 increases, and the power supply noise may converge faster. As a result, because the power supply noise can effectively be reduced in the bypass circuit 401 even when the bypass circuit 401 and the bypass circuit 402 are combined, jitters of signals propagating through the signal pattern 313 can be reduced.

Though one or three or more slits may be provided for one line segment $L_{V1}$ and may cross the line segment $L_{V1}$, two slits are provided in the second embodiment. Also, while one or three or more slits may cross one line segment $L_{G1}$, two slits are provided according to the second embodiment.

The slit $312S_1$ is neighboring to the ground via 322 and crosses the line segment $L_{G1}$, like the first embodiment. A length D3 of the slit $312S_1$ in a direction along a line $L_{G2}$ perpendicular to the line segment $L_{G1}$ is longer than a diameter D1 of the ground via 322.

The slit $312S_2$ is neighboring to the ground via 332 and crosses the line segment $L_{G1}$, like the first embodiment. A length D4 of the slit $312S_2$ in a direction along the line $L_{G2}$ perpendicular to the line segment $L_{G1}$ is longer than the diameter D2 of the ground via 332.

The slit $311S_1$ is neighboring to the power supply via 321 and crosses the line segment $L_{V1}$. A length D7 of the slit $311S_1$ in a direction along the line $L_{V2}$ perpendicular to the line segment $L_{V1}$ is longer than the diameter D5 of the power supply via 321.

The slit $311S_2$ is neighboring to the power supply via 331 and crosses the line segment $L_{V1}$. A length D8 of the slit $311S_2$ in a direction along the line $L_{V2}$ perpendicular to the line segment $L_{V1}$ is longer than the diameter D6 of the power supply via 331.

In other words, according to the second embodiment, the slits $311S_1$ and $311S_2$ extend longer in the crossing direction (along the perpendicular line $L_{V2}$) than the diameters D7 and D8 of the power supply vias 321 and 331. This may effectively increase the inductance (impedance) between the connecting portion $311J_1$ of the power supply via 321 and the connecting portion $311J_2$ of the power supply via 331 on the power plane 311A, more effectively reducing jitters of signals.

According to the second embodiment, on the power plane 311A, the slit $311S_1$ is in vicinity of the connecting portion $311J_1$ of the power supply via 321, and the slit $311S_2$ is in vicinity of the connecting portion $311J_2$ of the power supply via 331. The expression "in vicinity of the connecting portion $311J_1$" refers to a state that no other pixels and conductors are provided between the slit $311S_1$ and the connecting portion $311J_1$, and the expression "in vicinity of the connecting portion $311J_2$" refers to a state that no other pixels and conductors are provided between the slit $311S_2$ and the connecting portion $311J_2$. According to the second embodiment, the slit $311S_1$ is neighboring to the connecting portion $311J_1$, and the slit $311S_2$ is neighboring to the connecting portion $311J_2$. This may effectively increase the inductance (impedance) between the connecting portion $311J_1$ of the power supply via 321 and the connecting portion $311J_2$ of the power supply via 331, more effectively reducing jitters of signals.

As described above, the second embodiment focuses on increases of the self-inductances $L_{gnd}$ and $L_{vdd}$ of the ground plane 312 and the power plane 311A. In order to increase the length of the current path for higher self-inductances $L_{gnd}$ and $L_{vdd}$, at least one (two according to the second embodiment) slit is provided on each of the ground plane 312 and the power plane 311A.

The slits $311S_1$, $311S_2$, $312S_1$, and $312S_2$ play a role in bypassing a current path for increasing the self-inductance. For that, these slits may have any shape may have any shape if the shape bypasses the current path and may be linear (stick-shaped), arc-shaped, or U-shaped, for example, like the first embodiment.

The printed circuit board 500A was designed based on the method for increasing the inductance and was computer-simulated to check the effect.

Figure 7A:
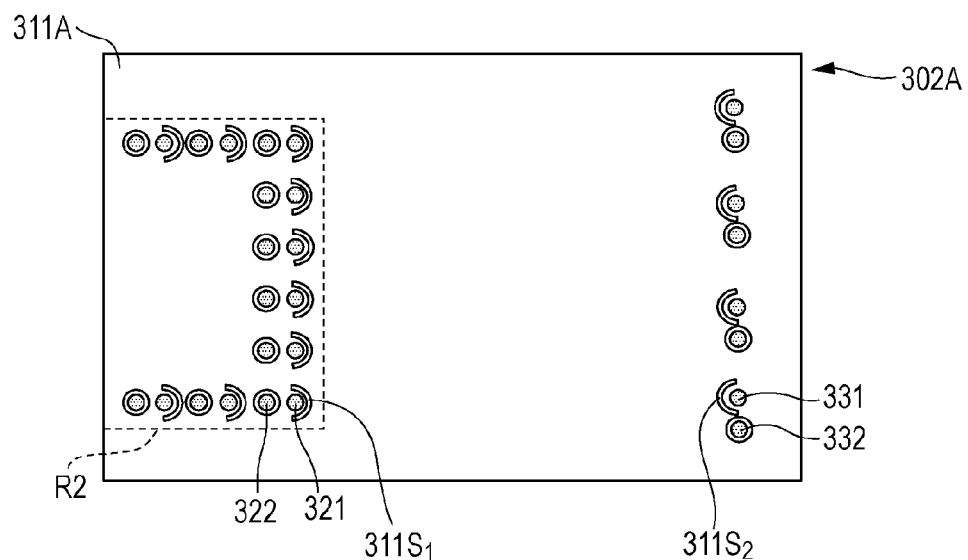
FIGS. 7A and 7B are schematic diagrams illustrating simulation models of a power plane and a ground plane of a printed wiring board of the printed circuit board according to the second embodiment.
Figure 7B:
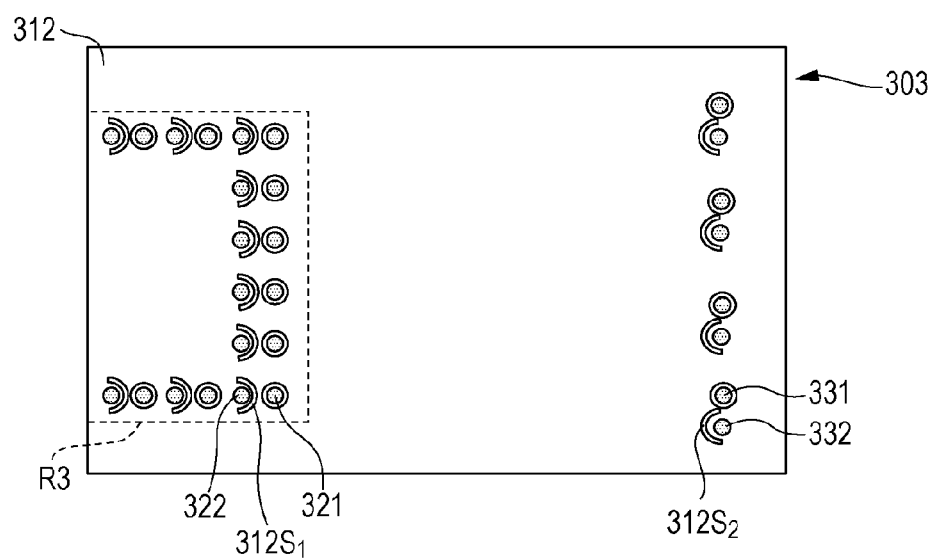

FIGS. 7A and 7B are schematic diagrams illustrating simulation models for a power plane and a ground plane of a printed wiring board on the printed circuit board according to the second embodiment of the present invention. FIG. 7A is a top surface view illustrating the power plane 311A, and FIG. 7B is a top surface view illustrating the ground plane 312. Projections regions R2 and R3 acquired by projecting the semiconductor device 100 to the inner layers 302A and 303 in a direction perpendicular to the plane of the printed wiring board 300A had ten power supply vias 321 and ten ground vias 322. The region of the semiconductor device 200 had four power supply vias 331 and four ground vias 332.

The slit $312S_1$ and the slit $312S_2$ are provided in proximity of the ground via 322 and the ground via 332, and the slit $311S_1$ and the slit $311S_2$ are provided in proximity of the power supply via 321 and power supply via 331. The slits $312S_1$ and $312S_2$ had an arc shape about the ground vias 322 and 332, respectively, and the slits $311S_1$ and $311S_2$ had an arc shape about the power supply vias 321 and 331, respectively.

Figure 8A:
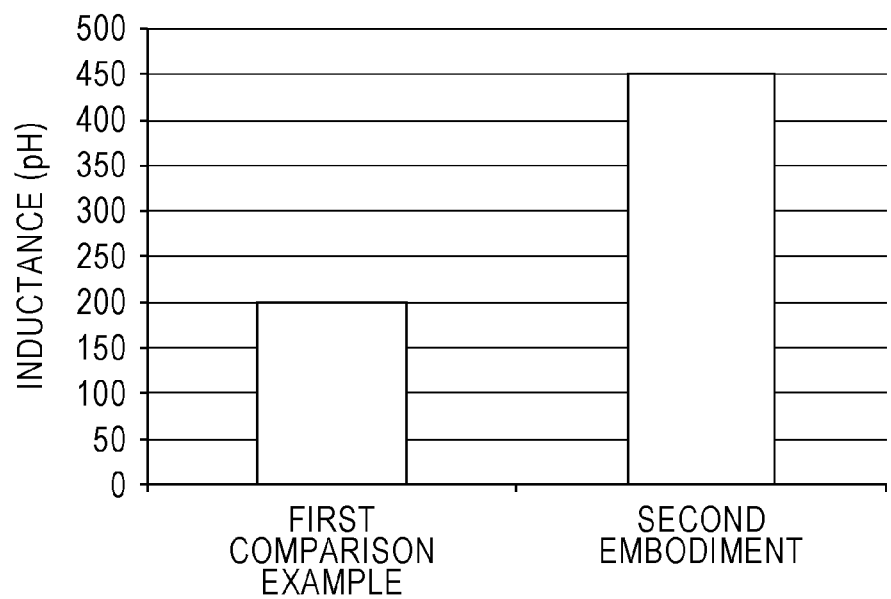
FIGS. 8A and 8B are graphs comparing a simulation result of the printed circuit board according to the second embodiment and a simulation result of the printed circuit board according to the first comparison example.
Figure 8B:
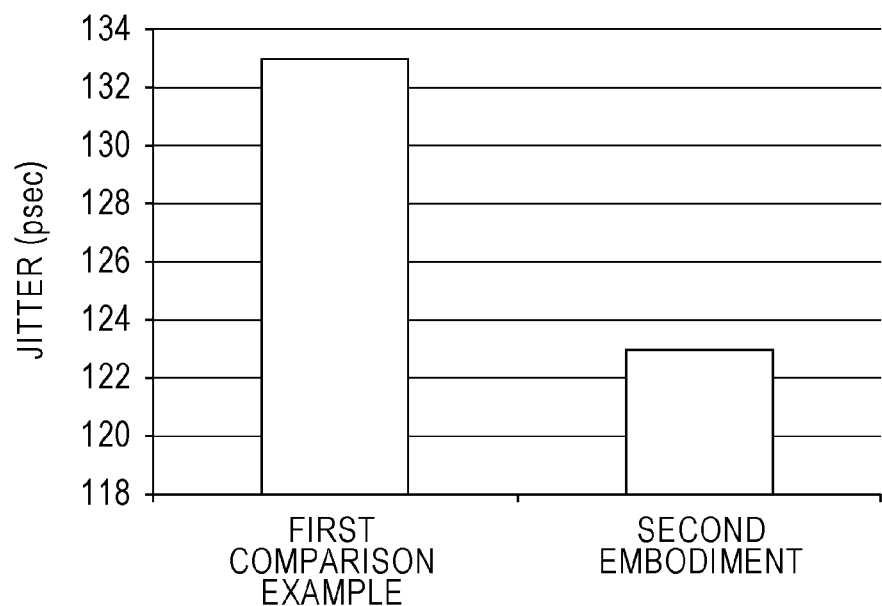

FIGS. 8A and 8B are graphs each comparing a simulation result of the printed circuit board 500A according to the second embodiment of the present invention and a simulation result of the printed circuit board 500X according to the first comparison example.

FIG. 8A is a graph illustrating a result of a comparison in inductance between the second embodiment and the first comparison example. The inductance of the power feeding path through the capacitor element 413 in the bypass circuit 402 was 198 [pH] in the first comparison example and 451 [pH] in the second embodiment. The slits $311S_1$, $311S_2$, $312S_1$, and $312S_2$ of the power plane 311A and ground plane 312 according to the second embodiment inductance increased the inductance by 252 [pH], which may prevent the change of the power feeding path.

FIG. 8B is a graph illustrating a comparison of jitters between the second embodiment and the first comparison example. The jitters in the first comparison example were measured as 133 [psec] while jitters in the second embodiment were measured as 123 [psec]. The slits according to the second embodiment were able to reduce the jitters by 10 [psec]. In other words, the jitters may be reduced according to the second embodiment more than the first embodiment.

According to the second embodiment, as described above, the jitters increased due to the power supply noise measure and the signal noise measure may be inhibited, which may reduce a misoperation risk.

Third Embodiment

Next, a printed circuit board according to a third embodiment of the present invention will be described. FIGS. 9A to 9C are schematic diagrams illustrating a printed circuit board according to the third embodiment of the present invention. FIG. 9A is a perspective view of the printed circuit board, FIG. 9B is an upper surface view of a ground plane, and FIG. 9C is an upper surface view of a power plane. Like numbers refer to like parts throughout in descriptions of the second embodiment and the third embodiment, and the repetitive description will be omitted. According to the third embodiment, the power plane of the printed wiring board according to the second embodiment further has a slit $311S_3$, and the ground plane according to the second embodiment further has a slit $312S_3$. The third embodiment will be described more specifically below.

As illustrated in FIG. 9A, a printed circuit board 500B according to the third embodiment includes a printed wiring board 300B, a semiconductor device 100 and a semiconductor device 200 similar to those of the first embodiment and mounted on the printed wiring board 300B.

The printed wiring board 300B is a multilayer printed wiring board having a plurality of (four in the third embodiment) conductor layers on which conductors are placed. In other words, the printed wiring board 300B is a layered printed wiring board in which a surface layer 301, an inner layer 302B, an inner layer 303B and a surface layer 304, which are conductor layers, are stacked through an insulator layer (dielectric layer). The surface layers 301 and 304 have a solder resist, not illustrated, thereon.

According to the third embodiment, the power plane 311B in the inner layer 302B is different from the power planes of the first and second embodiments, and the ground plane 312B in the inner layer 303B is different from the ground planes of the first and second embodiment.

Like the first embodiment, the surface layer 301 has a signal pattern 313 thereon. The signal pattern 313 is a signal line which electrically connects an output terminal 103 of the semiconductor device 100 and the input terminal 203 of the semiconductor device 200.

The inner layer 302B has a power supply pattern (power plane) 311B made of a plane-shaped conductor to which a power supply potential is applied from a power supply circuit, not illustrated. The inner layer 303B has a ground pattern (ground plane) 312B made of a plane-shaped conductor to which a ground potential is applied from a power supply circuit, not illustrated. According to the third embodiment, the semiconductor devices 100 and 200 are mounted on the surface layer 301.

The power supply terminal 101 of the semiconductor device 100 is electrically connected to a power plane 311B through a power supply via 321 which is a first power supply via of the printed wiring board 300B. The ground terminal 102 of the semiconductor device 100 is electrically connected to a ground plane 312B through a ground via 322 being a first ground via of the printed wiring board 300B. The power supply via 321 and ground via 322 are provided at positions facing the semiconductor device 100 in the direction perpendicular to the surface (surface layer 301) of the printed wiring board 300B.

The power supply terminal 201 of the semiconductor device 200 is electrically connected to the power plane 311B through a power supply via, not illustrated, and the ground terminal 202 is electrically connected to the ground plane 312B through a ground via, not illustrated.

The power plane 311B is in conduction with the power supply terminal 101 of the semiconductor device 100 and the power supply terminal 201 of the semiconductor device 200. The ground plane 312B is in conduction with the ground terminal 102 of the semiconductor device 100 and the ground terminal 202 of the semiconductor device 200. Operating voltage generated by the power supply circuit, not illustrated, is applied between the power supply terminal 101 and the ground terminal 102 of the semiconductor device 100 and between the power supply terminal 201 and the ground terminal 202 of the semiconductor device 200.

The printed circuit board 500B has a bypass circuit 401 being a first bypass circuit provided closer to the semiconductor device 100 (first semiconductor circuit) and a bypass circuit 402 being a second bypass circuit closer to the semiconductor device 200 (second semiconductor circuit), like the first embodiment.

The bypass circuits 401 and 402 are mounted in the printed wiring board 300A. Also according to the third embodiment, the bypass circuit 401 is mounted at a position similar to that of the first embodiment, that is, on the surface layer 304 (opposite to the plane on which the semiconductor device 100 is mounted). The bypass circuit 402 is mounted at a position similar to that of the first embodiment, that is, on a surface layer 301 (on which the semiconductor device 200 is mounted).

The bypass circuit 401 is placed within a projection region (within region R4) on which the semiconductor device 100 is projected in the direction perpendicular to the plane of the printed wiring board 300B on the surface layer 304. The bypass circuit 402 is placed in vicinity of the semiconductor device 200. In other words, the bypass circuit 402 is placed adjacent to the semiconductor device 200 without through no component between the bypass circuit 402 and the semiconductor device 200.

The printed wiring board 300B has a power supply via 331 being a second power supply via and a ground via 332 being a second ground via around the semiconductor device 200 (in vicinity of the bypass circuit 402).

The power supply vias 321 and 331 are both connected to the power plane 311B by extending within through holes $312h_1$ and $312h_2$ of the ground plane 312B in non-contact with the ground plane 312B. The ground vias 322 and 332 are both connected to the ground plane 312B by extending within through holes $311h_1$ and $311h_2$ of the power plane 311B in non-contact with the power plane 311B. Thus, the power supply vias 321 and 331 are in conduction with the power plane 311B and in non-conduction with the ground plane 312B. The ground vias 322 and 332 are in conduction with the ground plane 312B and in non-conduction with the power plane 311B.

The bypass circuit 401 has one end electrically connected to the power plane 311B (power supply terminal 101) through the power supply via 321, and the bypass circuit 401 has the other end electrically connected to the ground plane 312B (ground terminal 102) through the ground via 322. The bypass circuit 402 has one end electrically connected to the power plane 311B through the power supply via 331, and the bypass circuit 402 has the other end electrically connected to the ground plane 312B through the ground via 332.

The bypass circuit 401 is configured similarly to that in the first embodiment and has a first resistance component and a first capacitance component serially connected to the first resistance component. The bypass circuit 402 is also configured similarly to that in the first embodiment and has a capacitor element 413.

As illustrated in FIG. 9B, the ground plane 312B has at least one slit, that is, two slits $312S_1$ and $312S_2$, like the first and second embodiments. The slits $312S_1$ and $312S_2$ are provided in vicinity of the connecting portions $312J_1$ and $312J_2$ of the ground vias 322 and 332, like the first and second embodiments. Thus, like the first and second embodiments, the slits $312S_1$ and $312S_2$ may increase the inductance between the connecting portions $312J_1$ and $312J_2$ of the ground plane 312B and reduce jitters.

As illustrated in FIG. 9C, the power plane 311B has at least one slit, that is, two slits $311S_1$ and $311S_2$, like the first embodiment. The slits $311S_1$ and $311S_2$ are provided in vicinity of the connecting portions $311J_1$ and $311J_2$ of the power supply via 321 and 331, like the second embodiment. Therefore, like the second embodiment, the slits $311S_1$ and $311S_2$ may increase the inductance between the connecting portions $311J_1$ and $311J_2$ of the power plane 311B and reduce jitters.

As illustrated in FIG. 9C, a virtual straight line segment connecting the through hole (through position) $311h_1$ within which the ground via 322 extends and the through hole (through position) $311h_2$ within which the ground via 332 extends on the power plane 311B is defined as a line segment $L_{V3}$.

The power plane 311B has a slit (first outer slit) $311S_3$ at a position on the opposite side of the line segment $L_{V3}$ about the through hole $311h_1$. In other words, the power plane 311B has the slit $311S_3$ at a position on the opposite side to the position of a projected image acquired by projecting the slit $312S_1$ to the inner layer 302B (power plane 311B) in a direction perpendicular to the plane of the printed wiring board 300B about the through hole $311h_1$.

The slit $311S_3$ weakens the electromagnetic coupling between the power plane 311B and the ground plane 312B and is thus able to reduce the mutual inductance M between the ground plane 312B and the power plane 311B. Therefore, the inductance $L_{total}$ may be increased in Expression (1), and jitters of signals may be reduced more effectively as a result.

As illustrated in FIG. 9B, a virtual straight line connecting the through hole (through position) $312h_1$ within which the power supply via 321 extends and the through hole (through position) $312h_2$ within which the power supply via 331 extends on the ground plane 312B is defined as a line segment $L_{G3}$.

The ground plane 312B has a slit (first outer slit) $312S_3$ at a position on the opposite side of the line segment $L_{G3}$ about the through hole $312h_1$. In other words, the ground plane 312B has the slit $312S_3$ at a position on the opposite side of the position of a projected image acquired by projecting the slit $311S_1$ to the inner layer 303B (ground plane 312B) in a direction perpendicular to the plane of the printed wiring board 300B about the through hole $312h_1$.

The slit $312S_3$ weakens the electromagnetic coupling between the power plane 311B and the ground plane 312B and is thus able to reduce the mutual inductance M between the ground plane 312B and the power plane 311B. Therefore, the inductance $L_{total}$ may be increased in Expression (1), and jitters of signals may be reduced more effectively as a result.

The slits $311S_3$ and $312S_3$ may have any shape if the reduction of the mutual inductance M is possible and may be linear (stick-shaped), arc-shaped, or U-shaped, for example.

The printed circuit board 500B was designed based on the method for increasing the inductance and was computer-simulated to check the effect.

Figure 10A:
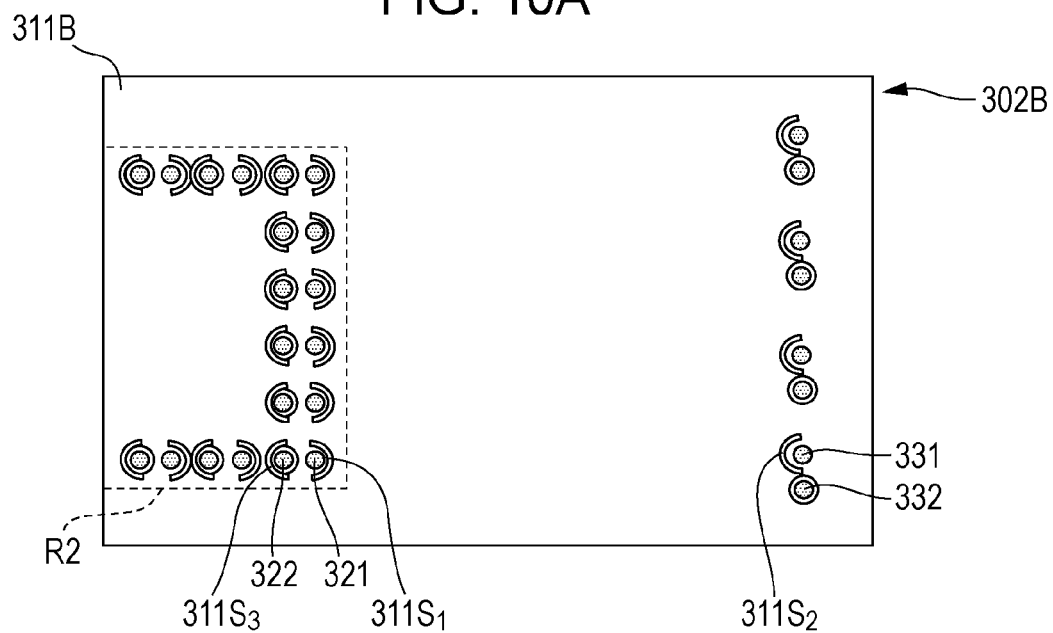
FIGS. 10A and 10B are schematic diagrams illustrating simulation models of a power plane and a ground plane of a printed wiring board of the printed circuit board according to the third embodiment.
Figure 10B:
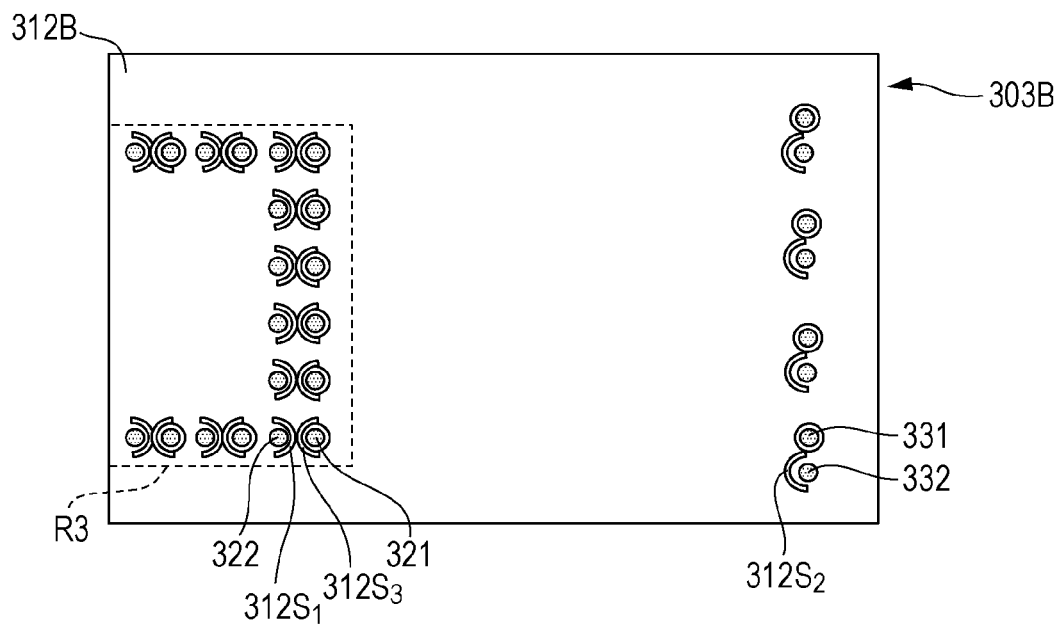

FIGS. 10A and 10B are schematic diagrams illustrating simulation models for a power plane and a ground plane of a printed wiring board on the printed circuit board according to the third embodiment of the present invention. FIG. 10A is a top surface view illustrating the power plane 311B, and FIG. 10B is a top surface view illustrating the ground plane 312B. Projections regions R2 and R3 acquired by projecting the semiconductor device 100 to the inner layers 302B and 303B in a direction perpendicular to the plane of the printed wiring board 300B had ten power supply vias 321 and ten ground vias 322. The region of the semiconductor device 200 had four power supply vias 331 and four ground vias 332.

The ground plane 312B has the slit $312S_1$ and the slit $312S_2$ in proximity of the ground via 322 and the ground via 332. The power plane 311B has the slit $311S_1$ and the slit $311S_2$ in proximity of the power supply via 321 and the power supply via 331. The slits $312S_1$ and $312S_2$ had an arc shape about the ground vias 322 and 332, respectively, and the slits $311S_1$ and $311S_2$ had an arc shape about the power supply vias 321 and 331, respectively.

The power plane 311B has the slit $311S_3$ in proximity of the through hole $311h_1$, and the ground plane 312B has the slit $312S_3$ in proximity of the through hole $312h_1$. The slit $311S_3$ had an arc shape about the through hole $311h_1$ (ground via 322). The slit $312S_3$ had an arc shape about the through hole $312h_1$ (power supply via 321).

Figure 11A:
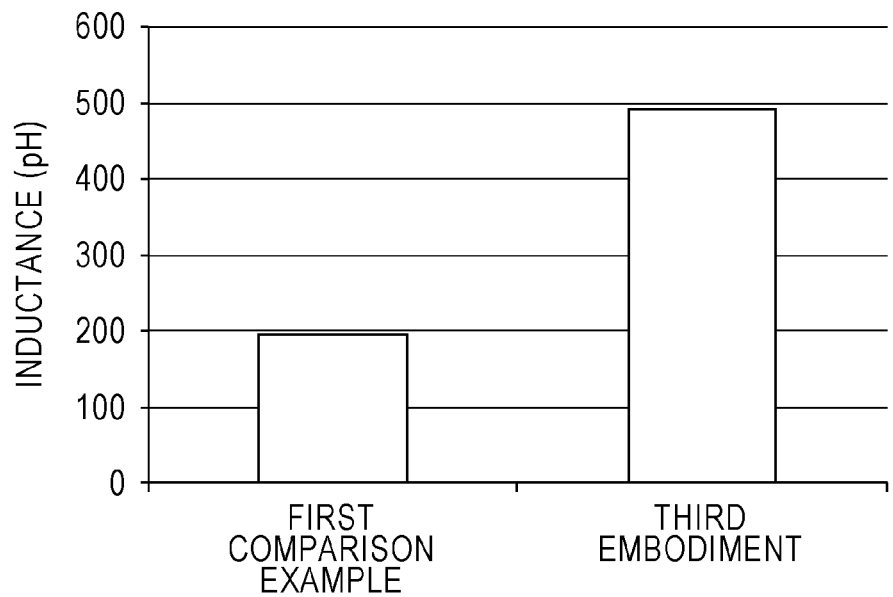
FIGS. 11A and 11B are graphs comparing a simulation result of the printed circuit board according to the third embodiment and a simulation result of the printed circuit board according to the first comparison example.
Figure 11B:
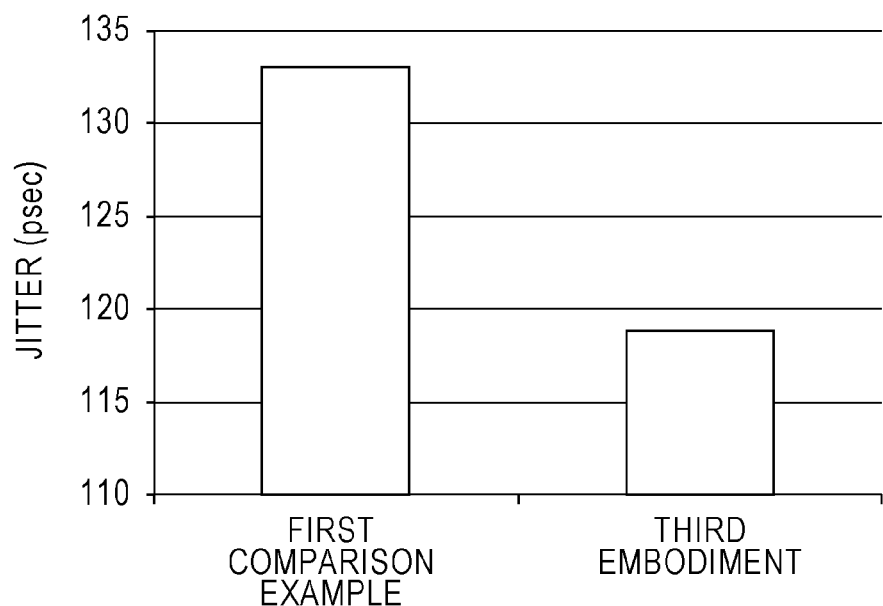

FIGS. 11A and 11B are graphs each comparing a simulation result of the printed circuit board 500B according to the third embodiment of the present invention and a simulation result of the printed circuit board 500X according to the first comparison example.

FIG. 11A is a graph illustrating a result of a comparison in inductance between the third embodiment and the first comparison example. The inductance of the power feeding path through the capacitor element 413 in the bypass circuit 402 was 198 [pH] in the first comparison example and 491 [pH] in the third embodiment. The slits 311S$_3$ and 312S$_3$ which reduce the mutual inductance between the power plane 311B and ground plane 312B increased the inductance by 293 [pH], which may prevent the change of the power feeding path.

FIG. 11B is a graph illustrating a comparison of jitters between the third embodiment and the first comparison example. The jitters in the first comparison example were measured as 133 [psec] while jitters in the third embodiment were measured as 119 [psec]. The slits 311S$_3$ and 312S$_3$ according to the third embodiment were able to reduce the jitters by 14 [psec]. In other words, the jitters may be reduced according to the third embodiment more than the second embodiment.

According to the third embodiment of the present invention, the jitters increased due to the power supply noise measure and the signal noise measure may be inhibited, which may reduce a misoperation risk.

Having described that, according to the third embodiment, the power plane 311B has the slit 311S$_3$ and the ground plane 312B has the slit 312S$_3$, an embodiment of the present invention is not limited thereto. Providing both of the slits 311S$_3$ and 312S$_3$ can reduce the mutual inductance M more effectively, but only one of the slits 311S$_3$ and 312S$_3$ may be provided.

Having described that, according to the third embodiment, the printed wiring board according to the second embodiment further has the slits 311S$_3$ and 312S$_3$, the printed wiring board according to the first embodiment may further has the slit 311S$_3$. This can also reduce jitters of signals.

Fourth Embodiment

Figure 12A:
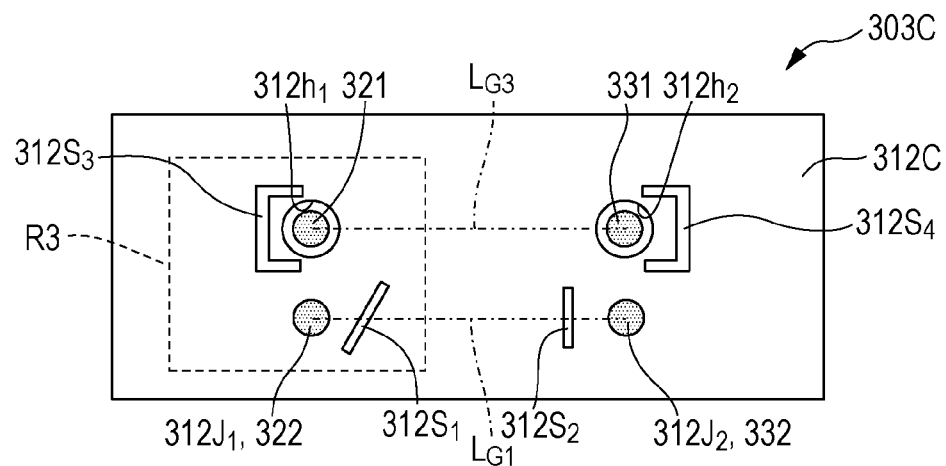
FIGS. 12A and 12B are schematic diagrams illustrating a printed circuit board according to a fourth embodiment.
Figure 12B:
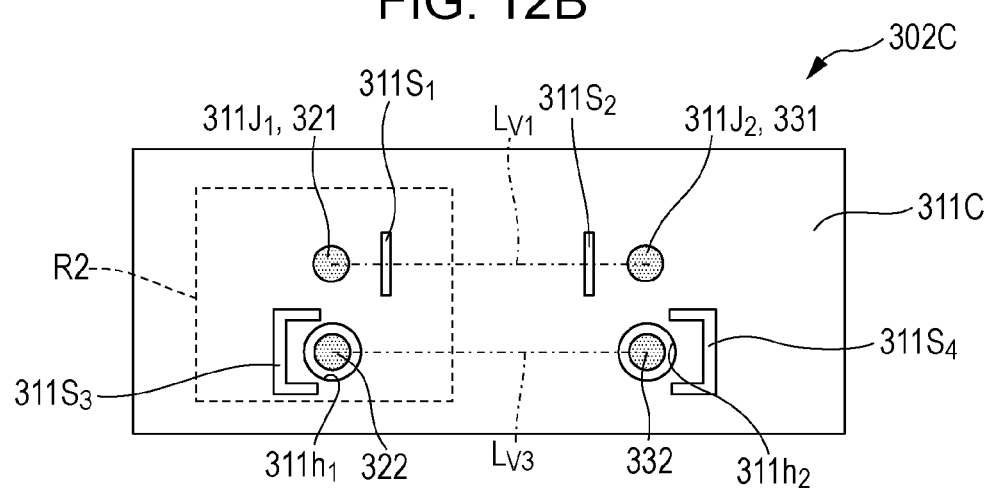

Next, a printed circuit board according to a fourth embodiment of the present invention will be described. FIGS. 12A and 12B are schematic diagrams illustrating a printed circuit board according to the fourth embodiment of the present invention. FIG. 12A is an upper surface view of a ground plane, and FIG. 12B is an upper surface view of a power plane. Like numbers refer to like parts throughout in descriptions of the first embodiment to the fourth embodiment, and the repetitive description will be omitted. According to the fourth embodiment, the power plane of the printed wiring board according to the third embodiment further has a slit 311S$_4$, and the ground plane according to the third embodiment further has a slit 312S$_4$. In other words, the printed wiring board according to the fourth embodiment has the power plane of the second embodiment further having the slit 311S$_3$ and 311S$_4$ and the ground plane of the second embodiment further having the slit 312S$_3$ and 312S$_4$.

The printed wiring board according to the fourth embodiment is a multi-layer (4-layer) printed wiring board having inner layers 302C and 303C being conductor layers between two surface layers being conductor layers and two surface layers through an insulator layer (dielectric layer), like the first embodiment. The surface layers have a solder resist, not illustrated, thereon.

As illustrated in FIG. 12B, the inner layer 302C has a power plane 311C. As illustrated in FIG. 12A, the inner layer 303C has a ground plane 312C.

As illustrated in FIG. 12B, the power plane 311C has the slit 311S$_3$, like the third embodiment. As illustrated in FIG. 12A, the ground plane 312C has the slit 312S$_3$, like the third embodiment. Therefore, the mutual inductance M between the power plane 311C and the ground plane 312C may decrease, and the inductance L$_{total}$ in Expression (1) may increase. As a result, jitters of signals may be reduced more effectively.

Furthermore, as illustrated in FIG. 12B, the power plane 311C has a slit (second outer slit) 311S$_4$ at a position on the opposite end of the line segment L$_{V3}$ about the through hole 311h$_2$. In other words, the power plane 311C has a slit 311S$_4$ at a position on the opposite side of the position of a projected image acquired by projecting the slit 312S$_2$ to the inner layer 302C (power plane 311C) in a direction perpendicular to the plane of the printed wiring board about the through hole 311h$_2$.

The slit 311S$_4$ weakens the electromagnetic coupling between the power plane 311C and the ground plane 312C and is thus able to reduce the mutual inductance M between the ground plane 312C and the power plane 311C. Therefore, the inductance L$_{total}$ may be increased in Expression (1), and jitters of signals may be reduced more effectively as a result.

As illustrated in FIG. 12A, the ground plane 312C has a slit (second outer slit) 312S$_4$ at a position on the opposite side of the line segment L$_{G3}$ about the through hole 312h$_2$. In other words, the ground plane 312C has the slit 312S$_4$ at a position on the opposite side to the position of a projected image acquired by projecting the slit 311S$_2$ to the inner layer 303C (ground plane 312C) in a direction perpendicular to the plane of the printed wiring board about the through hole 312h$_2$.

The slit 312S$_4$ weakens the electromagnetic coupling between the power plane 311C and the ground plane 312C and is thus able to reduce the mutual inductance M between the ground plane 312C and the power plane 311C. Therefore, the inductance L$_{total}$ may be increased in Expression (1), and jitters of signals may be reduced more effectively as a result.

Having described that, according to the fourth embodiment, the power plane 311C has the slits 311S$_3$ and 311S$_4$ and the ground plane 312C has the slits 312S$_3$ and 312S$_4$, an embodiment of the present invention is not limited thereto. Providing all of the slits 311S$_3$, 311S$_4$, 312S$_3$, and 312S$_4$ can reduce the mutual inductance M more effectively, but at least one of the slits 311S$_3$, 311S$_4$, 312S$_3$, and 312S$_4$ may be provided.

Having described that, according to the fourth embodiment, the printed wiring board according to the second embodiment has the slits 311S$_3$, 311S$_4$, 312S$_3$, and 312S$_4$, an embodiment of the present invention is not limited thereto. The printed wiring board according to the first embodiment may further have at least one of the slits 311S$_3$ and 311S$_4$. Thus, jitters of signals can be reduced.

Fifth Embodiment

Figure 13A:
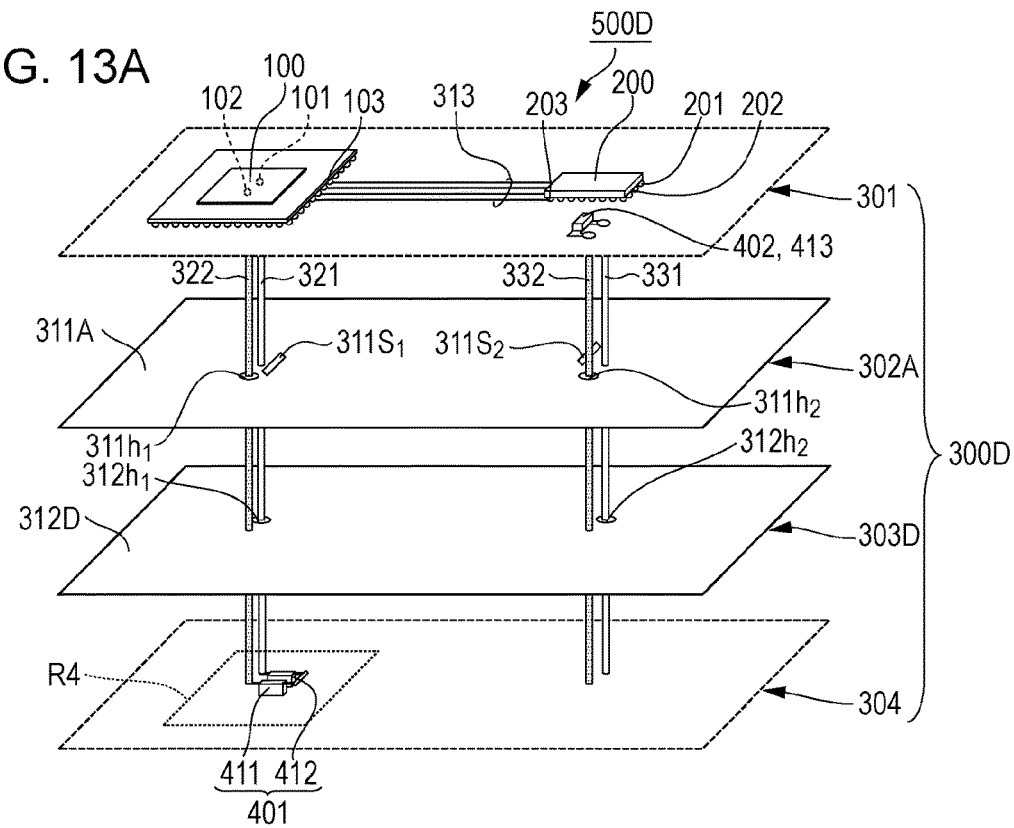
FIGS. 13A to 13C are schematic diagrams illustrating a printed circuit board according to a fifth embodiment.
Figure 13B:
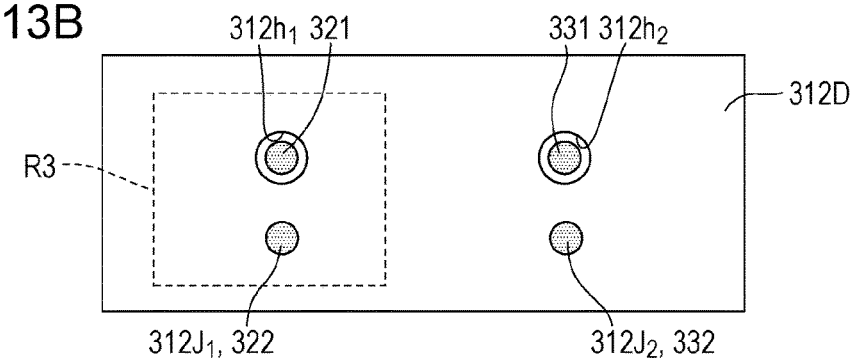
Figure 13C:
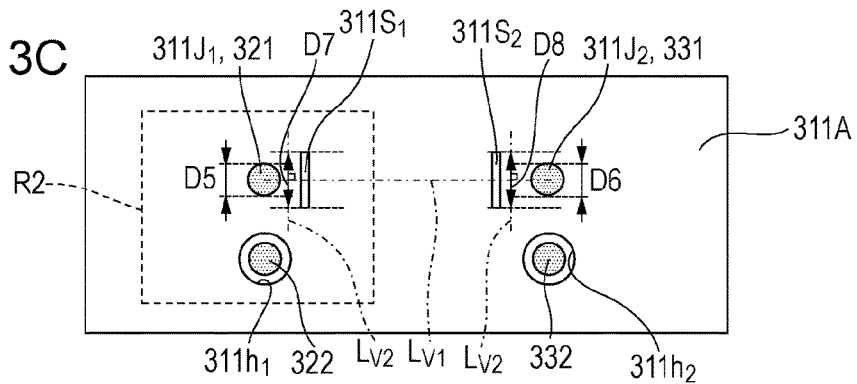

Next, a printed circuit board according to a fifth embodiment of the present invention will be described. FIGS. 13A to 13C are schematic diagrams illustrating a printed circuit board according to the fifth embodiment of the present invention. FIG. 13A is a perspective view of the printed circuit board, FIG. 13B is an upper surface view of a ground plane, and FIG. 13C is an upper surface view of a power plane. Like numbers refer to like parts throughout in descriptions of the first to fifth embodiments, and the repetitive description will be omitted.

Having described that, according to the first embodiment, the ground plane 312 has the slits 312S$_1$ and 312S$_2$, the power plane may have a slit as in the second embodiment, instead of the ground plane having slits. In other words, the slits 312S$_1$ and 312S$_2$ of the ground plane according to the second embodiment may be omitted.

More specifically, as illustrated in FIG. 13A, the printed circuit board 500D according to the fifth embodiment includes a printed wiring board 300D and a semiconductor device 100 and a semiconductor device 200, similar to those of the first embodiment, mounted on the printed wiring board 300D.

The printed wiring board 300D is a multilayer printed wiring board having a plurality of (four in the fifth embodiment) conductor layers on which conductors are placed. In other words, the printed wiring board 300D is a printed wiring board on which a surface layer 301, an inner layer 302A, an inner layer 303D and a surface layer 304, which are conductor layers on each of which a conductor pattern is placed, are stacked through an insulator layer (dielectric layer). The surface layers 301 and 304 have a solder resist, not illustrated, thereon.

The surface layer 301 has a signal pattern 313 thereon. The signal pattern 313 is a signal line which electrically connects an output terminal 103 of the semiconductor device 100 and the input terminal 203 of the semiconductor device 200, like the first embodiment.

The inner layer 302A has a power supply pattern (power plane) 311A made of a plane-shaped conductor to which a power supply potential is applied from a power supply circuit, not illustrated, like the second embodiment.

The inner layer 303D has a ground pattern (ground plane) 312D made of a plane-shaped conductor to which a ground potential is applied from a power supply circuit, not illustrated. In this case, the ground plane 312D does not have the slits 312S$_1$ and 312S$_2$ as described according to the first and second embodiments.

Also according to the fifth embodiment, the semiconductor devices 100 and 200 are mounted on the surface layer 301, like the first to fourth embodiments.

The power supply terminal 101 of the semiconductor device 100 is electrically connected to the power plane 311A through a power supply via 321 which is a first power supply via of the printed wiring board 300D. The ground terminal 102 of the semiconductor device 100 is electrically connected to a ground plane 312D through a ground via 322 being a first ground via of the printed wiring board 300D. The power supply via 321 and ground via 322 are provided at positions facing the semiconductor device 100 in the direction perpendicular to the surface (surface layer 301) of the printed wiring board 300D.

The power supply terminal 201 of the semiconductor device 200 is electrically connected to the power plane 311A through a power supply via, not illustrated, and the ground terminal 202 is electrically connected to the ground plane 312D through a ground via, not illustrated.

The power plane 311A is in conduction with the power supply terminal 101 of the semiconductor device 100 and the power supply terminal 201 of the semiconductor device 200. The ground plane 312D is in conduction with the ground terminal 102 of the semiconductor device 100 and the ground terminal 202 of the semiconductor device 200. Operating voltage generated by the power supply circuit, not illustrated, is applied between the power supply terminal 101 and the ground terminal 102 of the semiconductor device 100 and between the power supply terminal 201 and the ground terminal 202 of the semiconductor device 200.

The printed circuit board 500 has a bypass circuit 401 provided closer to the semiconductor device 100 (first semiconductor circuit) and a bypass circuit 402 being a second bypass circuit closer to the semiconductor device 200 (second semiconductor circuit), like the first embodiment.

The bypass circuits 401 and 402 are mounted in the printed wiring board 300D. Also according to the fifth embodiment, the bypass circuit 401 is mounted at a similar position to that of the first embodiment or on the surface layer 304 (opposite to the plane on which the semiconductor device 100 is mounted). The bypass circuit 402 is mounted at a similar position to that of the first embodiment or on a surface layer 301 (on which the semiconductor device 200 is mounted).

The bypass circuit 401 is placed within a projection region (within region R4) on which the semiconductor device 100 is projected in the direction perpendicular to the plane of the printed wiring board 300D on the surface layer 304. The bypass circuit 402 is placed in vicinity of the semiconductor device 200. In other words, the bypass circuit 402 is placed adjacent to the semiconductor device 200 without through no component between the bypass circuit 402 and the semiconductor device 200.

The printed wiring board 300D has a power supply via 331 being a second power supply via and a ground via 332 being a second ground via around the semiconductor device 200 (in vicinity of the bypass circuit 402).

The power supply vias 321 and 331 are both connected to the power plane 311A by extending within through holes 312h$_1$ and 312h$_2$ of the ground plane 312D in non-contact with the ground plane 312D. The ground vias 322 and 332 are both connected to the ground plane 312D by extending within through holes 311h$_1$ and 311h$_2$ of the power plane 311A in non-contact with the power plane 311A. Thus, the power supply vias 321 and 331 are in conduction with the power plane 311A and in non-conduction with the ground plane 312D. The ground vias 322 and 332 are in conduction with the ground plane 312D and in non-conduction with the power plane 311A.

The bypass circuit 401 has one end electrically connected to the power plane 311A (power supply terminal 101) through the power supply via 321, and the bypass circuit 401 has the other end electrically connected to the ground plane 312D (ground terminal 102) through the ground via 322. The bypass circuit 402 has one end electrically connected to the power plane 311A through the power supply via 331, and the bypass circuit 402 has the other end electrically connected to the ground plane 312D through the ground via 332.

The bypass circuit 401 is configured similarly to that in the first embodiment and has a resistive element 411, and a capacitor element 412 serially connected to the resistive element 411. The bypass circuit 402 is also configured similarly to that in the first embodiment and has a capacitor element 413.

As illustrated in FIG. 13B, the power plane 311A has a through hole 311h$_1$ within which the ground via 322 extends and a through hole 311h$_2$ within which the ground via 332 extends. The power plane 311A has a connecting portion 311J$_1$ to which the power supply via 321 is connected, and a connecting portion 311J$_2$ to which the power supply via 331 is connected. These through hole 311h$_1$ and connecting portion 311J$_1$ are provided within a projection region R2 acquired by projecting the semiconductor device 100 to the inner layer 302A in a direction perpendicular to a surface (surface layer 301) of the printed wiring board 300.

The ground vias 322 and 332 are insulated by clearance of the through holes $311h_1$ and $311h_2$ to prevent a short circuit with the power plane 311A. The power supply vias 321 and 331 are connected to the power plane 311A through the connecting portions $311J_1$ and $311J_2$. Each of the vias 321, 322, 331, and 332 has a circular cross section and an equal diameter is set for all of them. It should be noted that the cross sections of the vias 321, 322, 331, and 332 may not have an equal diameter. Assume that a virtual straight line segment connecting the center point of the connecting portion (connection position) $311J_1$ of the power supply via 321 and the center point of the connecting portion (connection position) $311J_2$ of the power supply via 331 is a line segment $L_{V1}$.

According to the fifth embodiment, the power plane 311A has slits (inner slits) $311S_1$ and $311S_2$ crossing the line segment $L_{V1}$ between the connecting portion $311J_1$ of the power supply via 321 and the connecting portion $311J_2$ of the power supply via 331. In other words, the power plane 311A has at least one slits (two slits $311S_1$ and $311S_2$ according to the fifth embodiment) crossing the line segment $L_{V1}$. Thus, the inductance or impedance between the power supply via 321 and the power supply via 331 is increased, and the power supply noise propagating to the power supply via 321 is not easily fed to the bypass circuit 402 and can easily be fed to the bypass circuit 401. Therefore, the effect of attenuation of power supply noise produced by the bypass circuit 401 increases, and the power supply noise may converge faster. As a result, because the power supply noise can effectively be reduced in the bypass circuit 401 even when the bypass circuit 401 and the bypass circuit 402 are combined, jitters of signals propagating through the signal pattern 313 can be reduced.

While one or three or more slits may be provided for one line segment $L_{V1}$ and may cross one line segment $L_{V1}$, two slits are provided according to the fifth embodiment.

The slit $311S_1$ is neighboring to the power supply via 321 and crosses the line segment $L_{V1}$, like the second embodiment. A length D7 of the slit $311S_1$ in a direction along a line $L_{V2}$ perpendicular to the line segment $L_{V1}$ is longer than a diameter D5 of the power supply via 321.

The slit $311S_2$ is neighboring to the power supply via 331 and crosses the line segment $L_{V1}$, like the second embodiment. A length D8 of the slit $311S_2$ in a direction along the line $L_{V2}$ perpendicular to the line segment $L_{V1}$ is longer than the diameter D6 of the power supply via 331.

In other words, according to the fifth embodiment, the slits $311S_1$ and $311S_2$ extend longer in the crossing direction (along the perpendicular lines $L_{V2}$) than the diameters D7 and D8 of the power supply vias 321 and 331. This may effectively increase the inductance (impedance) between the connecting portion $311J_1$ of the power supply via 321 and the connecting portion $311J_2$ of the power supply via 331 on the power plane 311A, more effectively reducing jitters of signals.

According to the fifth embodiment, on the power plane 311A, the slit $311S_1$ is in vicinity of the connecting portion $311J_1$ of the power supply via 321, and the slit $311S_2$ is in vicinity of the connecting portion $311J_2$ of the power supply via 331. The expression "in vicinity of the connecting portion $311J_1$" refers to a state that no other pixels and conductors are provided between the slit $311S_1$ and the connecting portion $311J_1$, and the expression "in vicinity of the connecting portion $311J_2$" refers to a state that no other pixels and conductors are provided between the slit $311S_2$ and the connecting portion $311J_2$. According to the fifth embodiment, the slit $311S_1$ is neighboring to the connecting portion $311J_1$, and the slit $311S_2$ is neighboring to the connecting portion $311J_2$. This may effectively increase the inductance (impedance) between the connecting portion $311J_1$ of the power supply via 321 and the connecting portion $311J_2$ of the power supply via 331, more effectively reducing jitters of signals.

As described above, the fifth embodiment focuses on an increase of the self-inductance $L_{vdd}$ of the power plane 311A. The power plane 311A having at least one (two in the fifth embodiment) of slits $311S_1$ and $311S_2$ can increase the length of the current path to increase the self-inductance $L_{vdd}$.

The slits $311S_1$ and $311S_2$ play a role in bypassing a current path for increasing the self-inductance. For that, the slits may have any shape for bypassing a current path and may have a linear (stick-like) shape or may be arc-shaped or U-shaped, like the first embodiment.

Sixth Embodiment

Figure 14A:
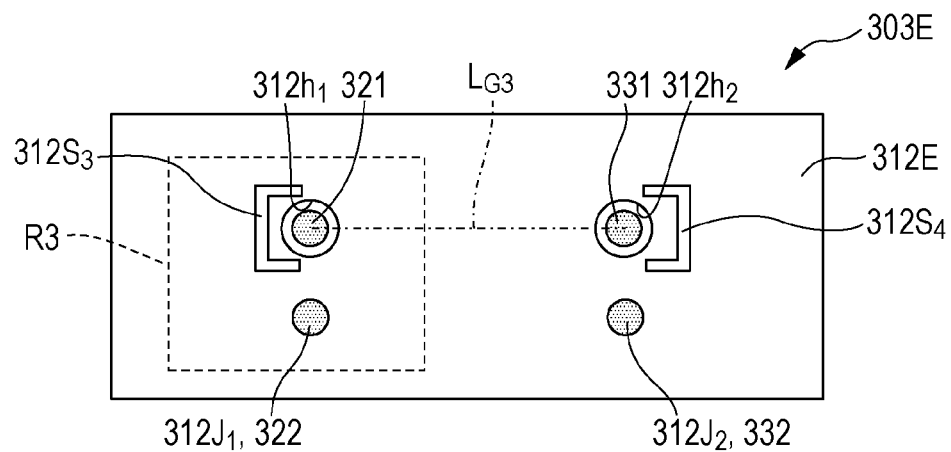
FIGS. 14A and 14B are schematic diagrams illustrating a printed circuit board according to a sixth embodiment.
Figure 14B:
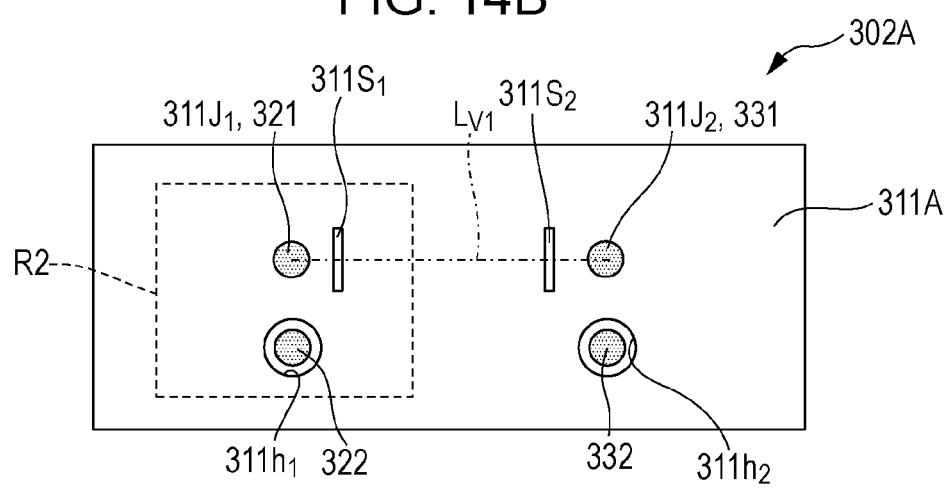

Next, a printed circuit board according to a sixth embodiment of the present invention will be described. FIGS. 14A and 14B are schematic diagrams illustrating a printed circuit board according to the sixth embodiment of the present invention. FIG. 14A is an upper surface view of a ground plane, and FIG. 14B is an upper surface view of a power plane. Like numbers refer to like parts throughout in descriptions of the first embodiment to the sixth embodiment, and the repetitive description will be omitted. According to the sixth embodiment, the power plane of the printed wiring board according to the fifth embodiment further has a slit $312S_3$ and a slit $312S_4$.

The printed wiring board according to the sixth embodiment is a multi-layer (4-layer) printed wiring board having inner layers 302A and 303A being conductor layers between two surface layers being conductor layers and two surface layers through an insulator layer (dielectric layer), like the first embodiment. The surface layers have a solder resist, not illustrated, thereon.

As illustrated in FIG. 14B, an inner layer 302A has a power plane 311A having slits $311S_1$ and $311S_2$, like the fifth embodiment. As illustrated in FIG. 14A, an inner layer 303E has a ground plane 312E.

As illustrated in FIG. 14A, the ground plane 312E has a slit (first outer slit) $312S_3$ at a position on the opposite side of the line segment $L_{G3}$ about the through hole $312h_1$. In other words, the ground plane 312E has a slit $312S_3$ at a position on the opposite side of the position of a projected image acquired by projecting the slit $311S_1$ to the inner layer 303E (ground plane 312E) in a direction perpendicular to the plane of the printed wiring board about the through hole $312h_1$.

The slit $312S_3$ weakens the electromagnetic coupling between the power plane 311A and the ground plane 312E and is thus able to reduce the mutual inductance M between the ground plane 312E and the power plane 311A. Therefore, the inductance $L_{total}$ may be increased in Expression (1), and jitters of signals may be reduced more effectively as a result.

Further, as illustrated in FIG. 14A, the ground plane 312E has a slit (second outer slit) $312S_4$ at a position on the opposite side of the line segment $L_{G3}$ about the through hole $312h_2$. In other words, the ground plane 312E has the slit $312S_4$ at a position on the opposite side to the position of a projected image acquired by projecting the slit $311S_2$ to the inner layer 303E (ground plane 312E) in a direction perpendicular to the plane of the printed wiring board about the through hole $312h_2$.

The slit $312S_4$ weakens the electromagnetic coupling between the power plane 311A and the ground plane 312E and is thus able to reduce the mutual inductance M between the ground plane 312E and the power plane 311A. Therefore, the inductance $L_{total}$ may be increased in Expression (1), and jitters of signals may be reduced more effectively as a result.

Having described that, according the sixth embodiment, the ground plane 312E has the slits $312S_3$ and $312S_4$, an embodiment of the present invention is not limited thereto. Providing both of the slits $312S_3$ and $312S_4$ can reduce the mutual inductance M more effectively, but only one of the slits $312S_3$ and $312S_4$ may be provided.

It should be understood that the present invention is not limited to the aforementioned embodiments, but various changes, modifications and alterations may be made thereto without departing from the technical concept of the present invention.

Having described that, according to the first to sixth embodiments, the semiconductor devices 100 and 200 are mounted on the surface layer 301, an embodiment of the present invention is not limited thereto. There are four patterns for mounting the semiconductor devices 100 and 200 on a printed wiring board, and any of the mounting patterns may be applied. That is, in a first mounting pattern (first to sixth embodiments), the semiconductor devices 100 and 200 are mounted on the surface layer (first component mount surface) 301. In a second mounting pattern, the semiconductor device 100 is mounted on the surface layer (first component mount surface) 301, and the semiconductor device 200 is mounted on the surface layer (second component mount surface) 304. In a third mounting pattern, the semiconductor device 100 is mounted on the surface layer (second component mount surface) 304, and the semiconductor device 200 is mounted on the surface layer (first component mount surface) 301. In a fourth mounting pattern, the semiconductor devices 100 and 200 are mounted on the surface layer (second component mount surface) 304.

The layout of the bypass circuit 401 and bypass circuit 402 is not limited to the layouts according to the first to sixth embodiments. For example, the bypass circuit 401 may be mounted on the same surface on which the semiconductor device 100 is also mounted and in vicinity of the semiconductor device 100. The bypass circuit 402 may be mounted on the surface opposite to the surface on which the semiconductor device 200 is mounted and on a projection region acquired by projecting the semiconductor device 200.

Having described that, according to the first to sixth embodiments, the power plane and the ground plane are provided in different conductor layers, an embodiment of the present invention is not limited thereto. The power plane and the ground plane may be provided in one conductor layer. In a case where the power plane and the ground plane are provided in different conductor layers, the order of stacking them is not limited to those in the first to sixth embodiments. Having described the four-layer printed wiring board according to the first to sixth embodiments, the present invention is applicable to a printed wiring board having two or more layers. In a case where the power plane and the ground plane are provided in different conductor layers, the present invention may apply a printed wiring board having three or more layers.

Seventh Embodiment

Figure 17A:
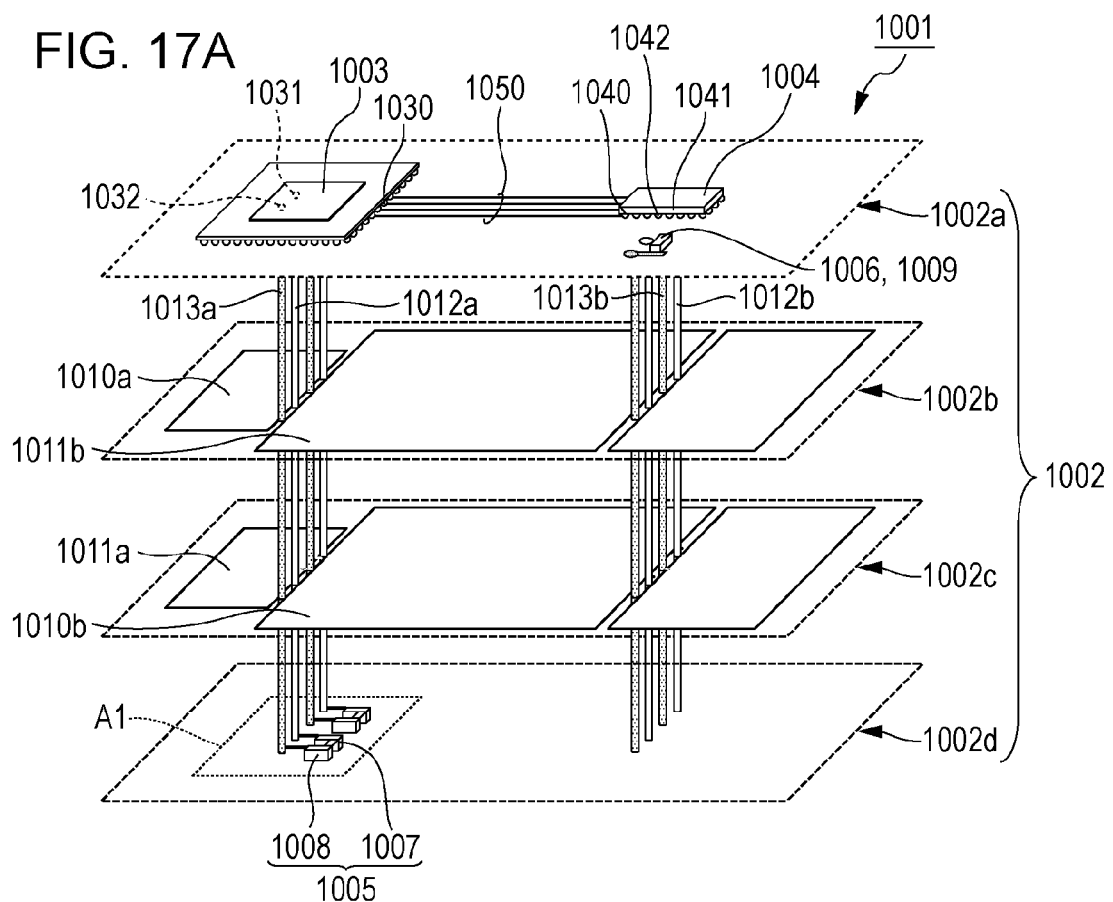
FIGS. 17A to 17C are schematic diagrams illustrating a printed circuit board according to a seventh embodiment.
Figure 17B:
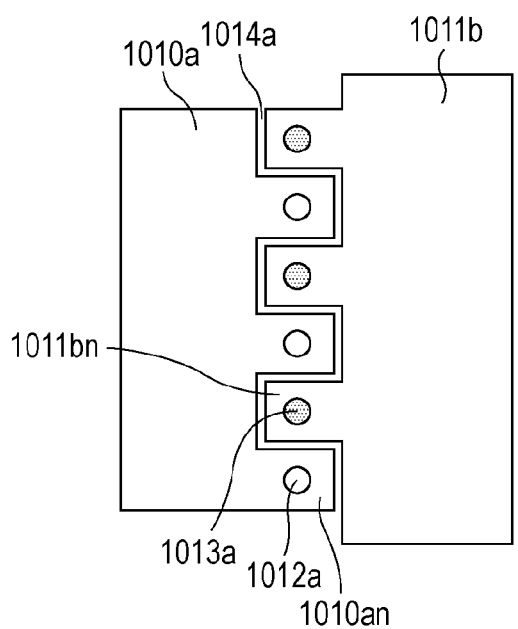
Figure 17C:
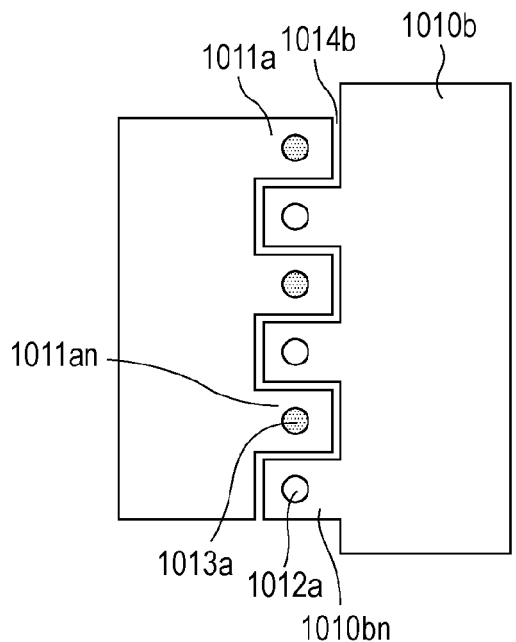

FIGS. 17A to 17C are schematic diagrams illustrating a printed circuit board according to a seventh embodiment of the present invention. FIG. 17A is a perspective view of the printed circuit board, FIG. 17B is an upper surface view of an inner layer 1002b, and FIG. 17C is an upper surface view of an inner layer 1002c. According to the seventh embodiment, a layout and shapes of a power supply pattern and a ground pattern on the printed wiring board are figured out to provide an impedance of a path $RX_2$ illustrated in FIG. 15 higher than an impedance of the path $RX_1$.

As illustrated in FIG. 17A, a printed circuit board 1001 includes a printed wiring board 1002, a semiconductor device 1003 being a first semiconductor circuit, and a semiconductor device 1004 being a second semiconductor circuit. In this case, the semiconductor devices 1003 and 1004 are mounted on the printed wiring board 102.

According to the seventh embodiment, the semiconductor device 103 is a memory controller, and the semiconductor device 1004 is a memory (such as a DDR3-SDRAM). It should be noted that the semiconductor devices 1003 and 1004 are not limited thereto. The semiconductor devices 1003 and 1004 may only be required to have circuits usable for inputting and outputting a signal.

The semiconductor device 1003 at least has an output terminal 1030, a power supply terminal 1031 and a ground terminal 1032. The output terminal 1030 is a terminal configured to send a signal (digital signal) generated by the semiconductor circuit. A power supply potential is applied to the power supply terminal 1031, and a ground potential is applied to the ground terminal 1032. The voltage applied between the power supply terminal 1031 and the ground terminal 1032 causes the semiconductor circuit 1003 to operate to send a signal.

The semiconductor device 1004 at least has an input terminal 1040, a power supply terminal 1041 and a ground terminal 1042. The input terminal 1040 is a terminal usable for receiving a signal (digital signal). A power supply potential is applied to the power supply terminal 1041, and a ground potential is applied to the ground terminal 1042. The voltage applied between the power supply terminal 1041 and the ground terminal 1042 causes the semiconductor circuit 1004 to receive a signal and thus operate.

According to the seventh embodiment, the semiconductor device 1003 has a plurality of output terminals 1030, and the semiconductor device 1004 has a plurality of input terminals 1040. The semiconductor device 1003 has a plurality of power supply terminals 1031 and ground terminals 1032, and the semiconductor device 1004 has a plurality of power supply terminals 1041 and ground terminals 1042.

According to the seventh embodiment, the semiconductor device 1003 is a BGA type semiconductor device and has a plurality of terminals on a lower surface of the package substrate. The semiconductor device 1004 is also a BGA type semiconductor device and has a plurality of terminals on a lower surface of the package substrate.

It should be noted that the semiconductor devices 1003 and 1004 are not limited to those of a BGA type. The semiconductor device 1003 may have an input terminal and an input circuit usable for receiving a signal, and the semiconductor device 1004 has an output terminal and an output circuit usable for sending a signal.

The printed wiring board 1002 is a multi-layer printed wiring board having a plurality of conductor layers on which conductors are placed. According to the seventh embodiment, the printed wiring board 1002 is a layered printed wiring board on which four layers including a surface layer 1002a, an inner layer 1002b, an inner layer 1002c, and a surface layer 1002d are stacked through an insulator layer (dielectric layer). The surface layers 1002a and 1002d have a solder resist, not illustrated, thereon.

The surface layer 1002a has a signal wire 1050 which electrically connects the output terminal 1030 of the semiconductor device 1003 and the input terminal 1040 of the semiconductor device 1004. According to the seventh embodiment, because the plurality of output terminals 1030 and the plurality of input terminals 1040 are provided, a plurality of signal wires 1050 are provided. The signal wire 1050 may be a conductor made of a copper foil, for example. Notably, only the surface layer 1003a has a signal wire 1050 according to the seventh embodiment, the signal wire may be across the surface layer 1002a and another layer.

The inner layer 1002b neighboring to the surface layer 1002a through an insulator layer has a power supply pattern 1010a (power plane) made of a plane-shaped conductor to which a power supply potential is applied from a power supply circuit, not illustrated. The inner layer 1002b has a ground pattern 1011b (ground plane) made of a plane-shape conductor to which a ground potential is applied from the power supply circuit. The inner layer 1002c provided between the inner layer 1002b and the surface layer 1002d and neighboring to the conductor layers 1002b and 1002d through the insulator layers has a power supply pattern 1010b made of a plane-shaped conductor to which a power supply potential is applied from a power supply circuit, not illustrated. The inner layer 1002c has a ground pattern 1011a made of a plane-shaped conductor to which a ground potential is applied from a power supply circuit. According to the seventh embodiment, the semiconductor devices 1003 and 1004 are mounted on the surface layer (component mount surface) 1002a.

The power supply terminal 31 of the semiconductor device 1003 is electrically connected to the power plane 1010a through a power supply via 1012a of the printed wiring board 1002. The ground terminal 1032 of the semiconductor device 1003 is electrically connected to the ground plane 1011a through a ground via 1013a of the printed wiring board 1002. The power supply via 1012a and ground via 1013a are provided at positions facing the semiconductor device 1003 in the direction perpendicular to the surface of the printed wiring board 1002.

The power supply terminal 1041 of the semiconductor device 1004 is electrically connected to the power plane 1010c through the power supply via 1012b. The ground terminal 1042 of the semiconductor device 1004 is electrically connected to the ground plane 1011c through the ground via 1013b.

Operating voltage is applied from a power supply circuit not illustrated, to between the power supply terminal 1031 and the ground terminal 1032 of the semiconductor device 1003 and between the power supply terminal 1041 and the ground terminal 1042 of the semiconductor device 1004. Though, according to the seventh embodiment, the inner layer 1002b has the power planes 1010a and 1010c and the ground plane 1011b, and the inner layer 1002c has the power plane 1010b and the ground planes 1011a and 1011c, the power planes and the ground planes may be replaced by each other.

The printed circuit board 1001 has a first bypass circuit 1005 neighboring to the semiconductor device 1003 and a second bypass circuit 6 neighboring to the semiconductor device 1004.

The first bypass circuit 1005 is placed within a region A1 acquired by projecting the semiconductor device 1003 to the surface layer 1002d in a direction perpendicular to the plane of the printed wiring board 1002. The second bypass circuit 1006 is placed in vicinity of the semiconductor device 1004. Though the second bypass circuit 1006 is illustrated along with the surface layer 1002a according to the seventh embodiment, it may be mounted on the surface layer 1002d.

The bypass circuit 1005 has one end connected to the power plane 1010a and power supply terminal 1031 through the power supply via 1012a, and the bypass circuit 1005 has the other end connected to the ground plane 1011a and ground terminal 1032 through the ground via 1013a. The bypass circuit 1006 has one end connected to the power plane 1010c and power supply terminal 1041 through the power supply via 1012b, and the bypass circuit 1006 has the other end connected to the ground plane 1011c and ground terminal 1042 through the ground via 1013b.

The bypass circuit 1005 has a first resistance component and a first capacitance component serially connected to the first resistance component. According to the seventh embodiment, the bypass circuit 1005 includes a resistive element 1007 and a capacitor element 1008 serially connected to the resistive element 1007.

The first resistance component includes a resistance value of the resistive element 1007 and a resistance value (parasitic resistance value) of the capacitor element 1008. The first capacitance component includes a capacitance component of the capacitor element 1008. The bypass circuit 1005 may only include a capacitor element having a high parasitic resistance value.

The bypass circuit 1005 may be used for reducing power supply noise caused by operations of the semiconductor circuit 1003. With the first capacitance component, the power supply terminal 1031 and the ground terminal 1032 bypass the power supply noise. With the first resistance component, the vibrations of the power supply noise can be converged earlier.

The bypass circuit 1006 has a second resistance component and a second capacitance component serially connected to the second resistance component. The second resistance component has a resistance value lower than the first resistance component. The second capacitance component includes a capacitance component of a capacitor element 1009. The bypass circuit 1006 may be used for preventing signal noise and bypasses the signal noise occurring in the power plane to the ground plane due to the electromagnetic coupling between the signal pattern and the power plane by using the second capacitance component.

As illustrated in FIG. 17B, the power plane 1010a and the ground plane 1011b are arranged in the inner layer 1002b. As illustrated in FIG. 17C, the ground plane 1011a and the power plane 1010b are arranged in the inner layer 1002c. In this way, the power planes 1010a and 1010b and the ground planes 1011a and 1011b are alternately arranged in the inner layers 1002b and 1002c of the printed wiring board 1002. Vias are provided in a direction perpendicular to the planes of the printed wiring board. A power supply via 1012a and a ground via 1013a are used to connect between the power planes 1010a and 1010b alternately arranged with the inner layer 1002b and 1002c of the printed wiring board 1002 and between the ground planes 1011a and 1011b, respectively.

A more specific form of the connections between the power planes and ground planes through the vias will be described. The inner layer 1002b has the power plane 1010a having a comb-shaped end portion and the ground plane 1011b having a comb-shaped end portion to engage with the comb-shaped end portion of the power plane 1010a with a gap 1014a for preventing a short circuit. The inner layer 1002c has the power plane 1010b having a comb-shaped end portion. The comb-shaped power plane has a convex portion 1010bn over a convex portion 1010an of the comb-shaped power plane of the inner layer 1002b through an insulator layer (dielectric layer). The ground plane 1011b having the comb-shaped end portion is provided to engage with the power plane 1010a having the comb-shaped end portion in the inner layer 1002c through a gap 1014b for preventing a short circuit with the power planes.

The convex portion 1010an of the power plane in the inner layer 1002b and the convex portion 1010bn of the power plane in the inner layer 1002c superposed on the convex portion 1010an of the power plane in the inner layer 1002b through a dielectric layer are connected through the power supply via 1012a. The convex portion 1011an of the ground plane in the inner layer 1002b and the convex portion 1011bn of the ground plane in the inner layer 1002c superposed on the convex portion 1011an of the ground plane in the inner layer 1002b through the dielectric layer are connected through the ground via 1013a.

The power supply vias and the ground vias provided in the range from the semiconductor device 1001 to the bypass circuit 1006 according to the seventh embodiment can increase the inductance, that is, the impedance. The power supply noise caused by operations of the semiconductor circuit 1001 is not easily fed to the bypass circuit 1006 and is fed to the bypass circuit 1005, which increases the noise attenuation effect of the bypass circuit 1005 and can reduce jitters. Therefore, jitters caused by interactions between the bypass circuit 1005 and the bypass circuit 1006 can be reduced.

The printed circuit board 1001 was designed based on the method for increasing the inductance and was computer-simulated to check the effect. Power SI by Cadence was used for simulating power supply impedance. HSPICE by Synopsys was used for simulating jitters.

A simulation model including the power plane and ground plane in the printed wiring board according to the seventh embodiment of the present invention was implemented. The layer configuration of the printed wiring board 1002 is described on Table 2 below.

TABLE 2

| SOLDER RESIST | 20 μm |
|---|---|
| CONDUCTOR IN SURFACE LAYER 1002A | 43 μm |
| INSULATOR BETWEEN SURFACE LAYER 1002A AND INNER LAYER 1002B | 100 μm |
| CONDUCTOR IN INNER LAYER 1002B | 35 μm |
| INSULATOR BETWEEN INNER LAYER 1002B AND INNER LAYER 1002C | 100 μm |
| CONDUCTOR IN INNER LAYER 1002C | 35 μm |
| CONDUCTOR IN SURFACE LAYER 1002D | 43 μm |
| SOLDER RESIST | 20 μm |

The vias had a hole diameter of 0.4 mm. The power plane 1010 in the inner layer 1002b and the power plane in the inner layer 1002c had dimensions of 32 mm vertically and 30 mm horizontally. A region A1 vertically projecting the semiconductor device 1003 to the inner layers 1002b and 1002c of the printed wiring board had 20 power supply vias 1012a and 20 ground vias 1013a. The power supply vias 1012a and the ground vias 1013a were arranged alternately with intervals of 1 mm therebetween in the projection region A1 assuming that the vias were provided between BGA ball pads. Forty power supply vias 1012b and forty ground vias 1013b were provided in vicinity of the semiconductor device 1004.

The power planes 1010 and the ground planes 1011 which are a feature of the seventh embodiment are arranged alternately with the inner layers 1002b and 1002c of the printed wiring board 1002, and a power supply structure is provided in which the vias are used for connecting between the power planes 1010 and between the ground planes 1011.

Figure 18A:
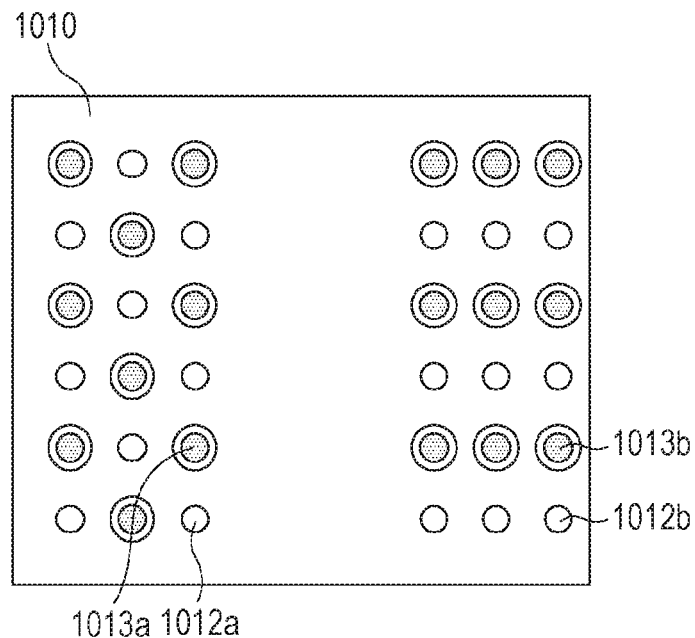
FIGS. 18A and 18B are schematic diagrams illustrating simulation models of a power plane and a ground plane on a printed wiring board according to a second comparison example.
Figure 18B:
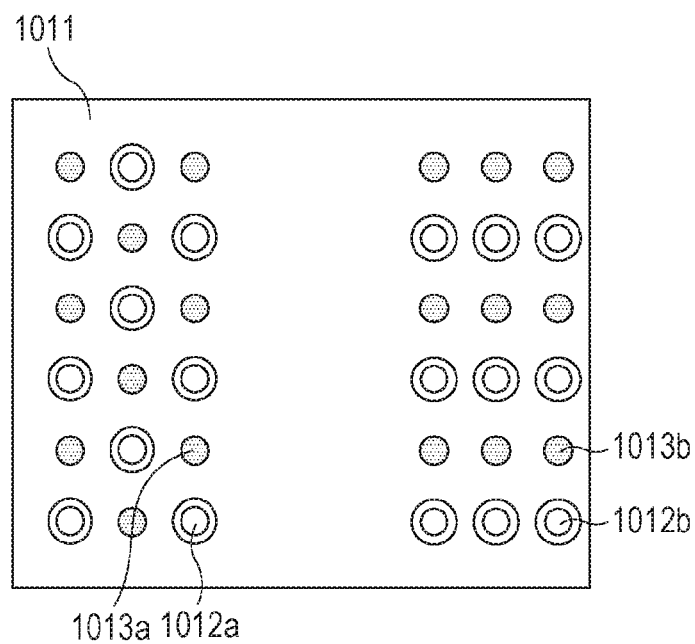
Figure 19A:
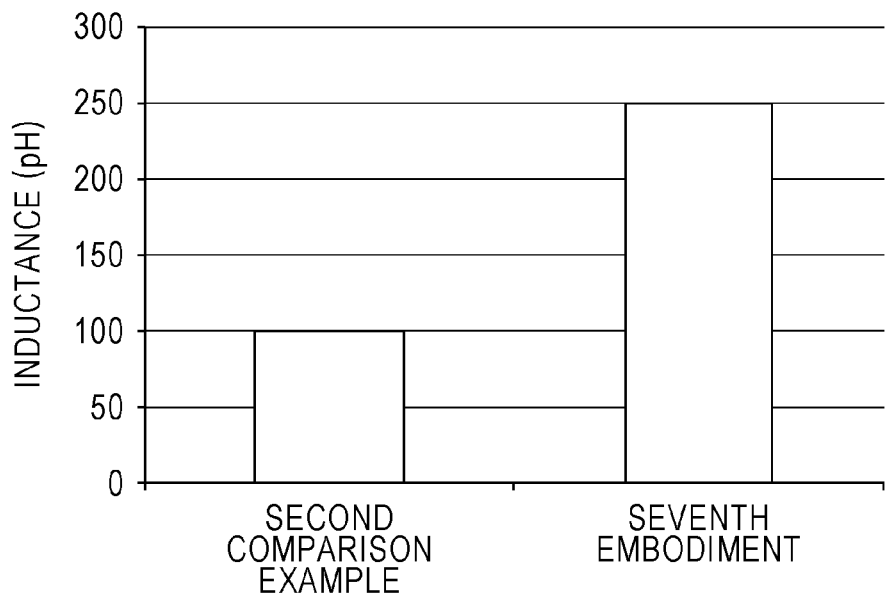
FIGS. 19A and 19B are graphs comparing a printed circuit board according to a seventh embodiment and a source inductance of a printed circuit board according to the second comparison example.

FIGS. 18A and 18B are schematic diagrams illustrating simulation models for a power plane and a ground plane of a printed wiring board according to a second comparison example. FIG. 19A is a graph comparing power supply impedance simulation results between the printed circuit board 1001 according to the seventh embodiment of the present invention and the printed circuit board 1001X according to the second comparison example. In this power supply impedance simulation, the resistive element 1007 and the capacitor element 1008 of the bypass circuit 1005 were not mounted, and the capacitor element 1009 of the bypass circuit 1006 was mounted for comparison in inductance of the path RX2. Each of the inductances were calculated from the value of the impedance Z at 100 MHz in the power supply impedance simulation by using the following Expression (2).

$$L = Z/j\omega \qquad (2)$$

Here, $\omega = 2\pi f$, and $\pi$ is a circular constant, and f is a frequency.

While the inductance of the second comparison example was 100 pH, the inductance of the first embodiment was 250 pH. According to the seventh embodiment, the inductance was increased by 150 pH. In other words, the impedance of the path RX2 could be increased to prevent the change of the power feeding path.

Figure 19B:
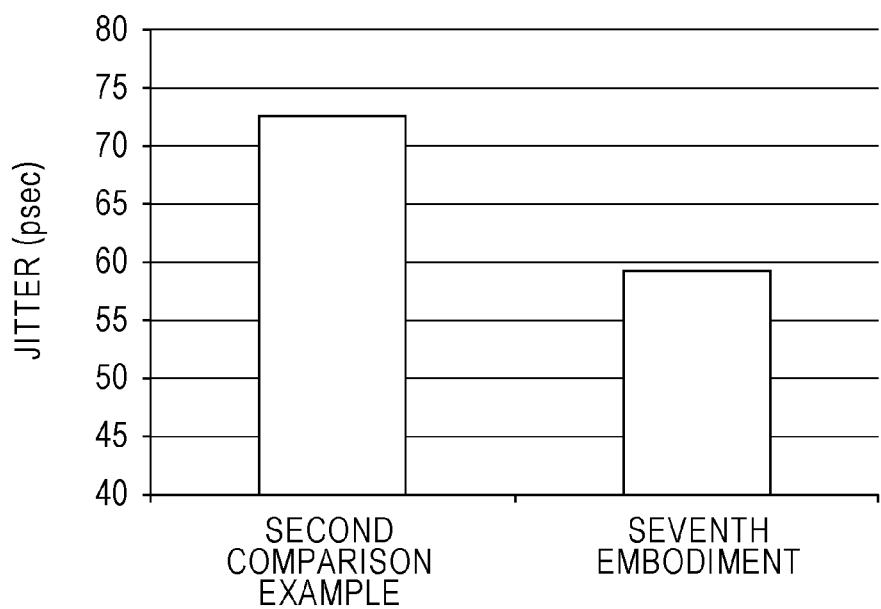

FIG. 19B is a graph comparing jitter simulation results between the printed circuit board 1001 according to the seventh embodiment of the present invention and the printed circuit board 1001X according to the second comparison example. By implementing a waveform simulation assuming DDR3-1333, jitters in the output terminal 1030 of the semiconductor device 1003 were measured. The voltage for the jitter observation was half of power supply voltage. When the power supply voltage is 1.425 V (1.5 V×0.95), the jitter observation voltage is 0.7125 V. Jitters in the second comparison example were measured as 73 psec while jitters in the seventh embodiment were measured as 60 psec. The power supply structure of the seventh embodiment reduced the jitters by 13 psec (18%).

According to the seventh embodiment as described above, the power supply structure in which the power planes 1010 and the ground planes 1011 arranged alternately with the inner layer 1002b and the 1002c are connected by using vias can prevent the change of the power feeding path and can have reduced jitters more than those of the second comparison example.

Eighth Embodiment

Figure 20A:
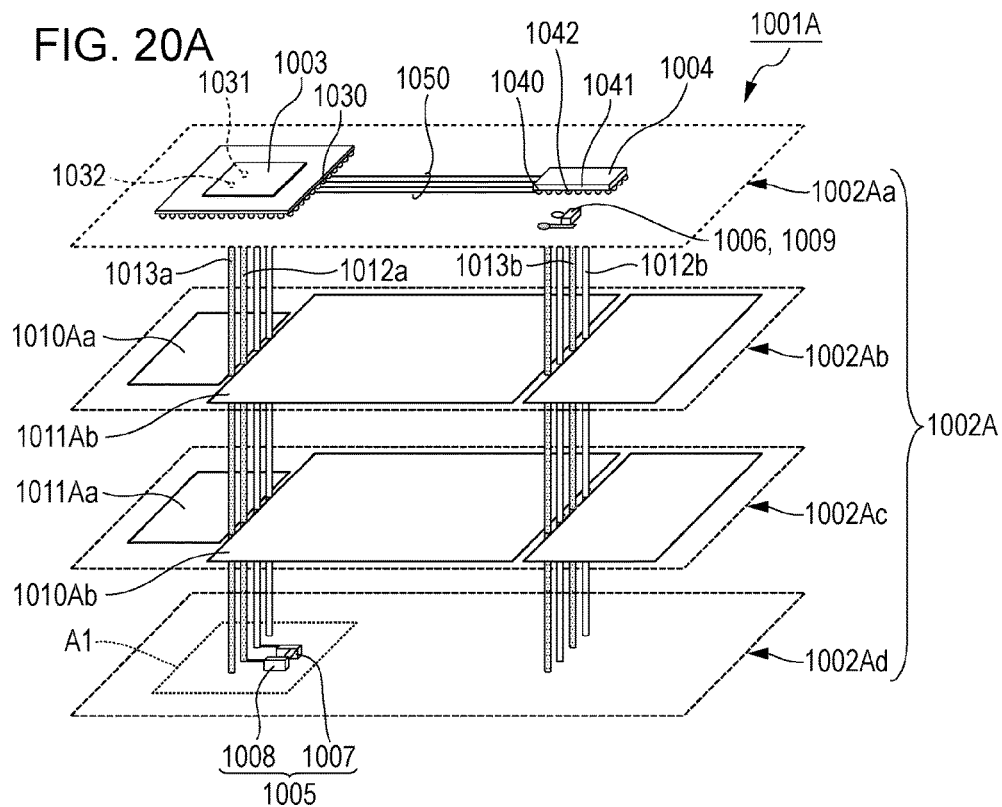
FIGS. 20A to 20C are schematic diagrams illustrating a printed circuit board according to an eighth embodiment.
Figure 20B:
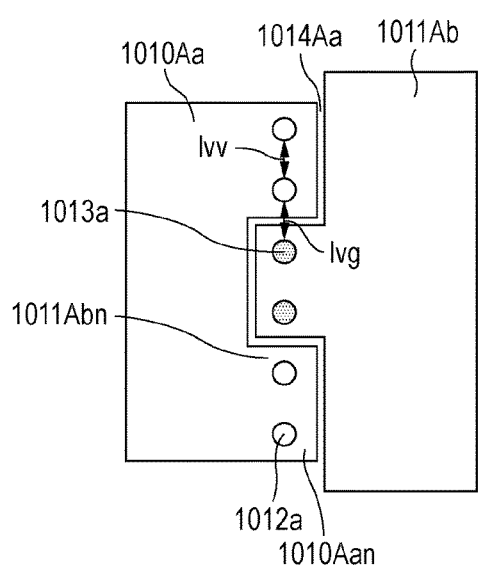
Figure 20C:
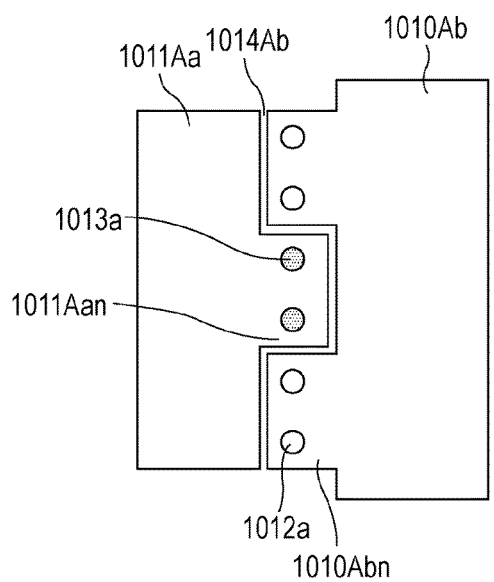

Next, a printed circuit board according to an eighth embodiment of the present invention will be described. FIG. 20A is a perspective view of the printed circuit board, FIG. 20B is an upper surface view of an inner layer 1002Ab, and FIG. 20C is an upper surface view of an inner layer 1002Ac. According to the eighth embodiment, a layout and shapes of a power supply pattern and a ground pattern on the printed wiring board are figured out to provide an impedance of a path RX₂ illustrated in FIG. 15 higher than an impedance of the path RX₁, like the seventh embodiment. Like numbers refer to like parts throughout in descriptions of the seventh and eighth embodiments, and the repetitive description will be omitted.

As illustrated in FIG. 20A, a printed circuit board 1001A includes a printed wiring board 1002A, and a semiconductor device 1003 being a first semiconductor circuit, and a semiconductor device 1004 being a second semiconductor circuit. In this case, the semiconductor devices 1003 and 1004 are mounted on the printed wiring board 1002A.

The printed wiring board 1002A is a multi-layer printed wiring board having a plurality of conductor layers on which conductors are placed. According to the eighth embodiment, the printed wiring board 1002A is a layered printed wiring board on which four layers including a surface layer 1002Aa, the inner layer 1002Ab, the inner layer 1002Ac and a surface layer 1002Ad are stacked through an insulator layer (dielectric layer). The surface layers 1002Aa and 1002Ad have a solder resist, not illustrated, thereon.

According to the eighth embodiment, the arrangement of the power supply vias 1012a and ground vias 1013a is different from the arrangement of the vias in the seventh embodiment. According to the seventh embodiment, the power supply vias 1012a and the ground vias 1013a are arranged alternately. According to the eighth embodiment on the other hand, the power supply vias 1012a are arranged in proximity of the ground vias 1013a.

The structure of the printed wiring board 1002A according to the eighth embodiment will be described more specifically. The surface layer 1002Aa of the printed wiring board 1002A has a signal wire 1050 which electrically connects the output terminal 1030 of the semiconductor device 1003 and the input terminal 1040 of the semiconductor device 1004, like the seventh embodiment.

The inner layer 1002Ab and the inner layer 1002Ac have power supply patterns (power planes) 1010Aa, 1010Ab, and 1010Ac made of a plane-shaped conductors to which a power supply potential is applied from a power supply circuit, not illustrated. The inner layer 1002Ab and the inner layer 1002Ac have ground patterns (ground planes) 1011Aa, 1011Ab, and 1011Ac made of plane-shaped conductors to which a ground potential is applied from the power supply circuit, not illustrated. The power plane and the ground plane are arranged alternately with the inner layer 1002Ab and the inner layer 1002Ac, like the seventh embodiment.

The power supply terminal 1031 of the semiconductor device 1003 is electrically connected to the power plane 1010Aa through a power supply via 1012a of the printed wiring board 1002A. The ground terminal 1032 of the semiconductor device 1003 is electrically connected to the ground plane 1011Aa through a ground via 1013a of the printed wiring board 1002A. The power supply via 1012a and ground via 1013a are provided at positions facing the semiconductor device 1003 in the direction perpendicular to the surface of the printed wiring board 1002A.

The power supply terminal 1041 of the semiconductor device 1004 is electrically connected to the power plane 1010Ac through a power supply via 1012b of the printed wiring board 1002A. The ground terminal 1042 of the semiconductor device 1004 is electrically connected to the ground plane 1011Ac through a ground via 1013b of the printed wiring board 1002A. Operating voltage is applied from a power supply circuit not illustrated, to between the power supply terminal 1031 and the ground terminal 1032 of the semiconductor device 1003 and between the power supply terminal 1041 and the ground terminal 1042 of the semiconductor device 1004.

The printed circuit board 1001A includes a first bypass circuit 1005 neighboring to the semiconductor device 1003 and a second bypass circuit 1006 neighboring to the semiconductor device 1004, like the first embodiment.

The first bypass circuit 1005 is placed within a region A1 acquired by projecting the semiconductor device 1003 to the surface layer 1002Ad in a direction perpendicular to the plane of the printed wiring board 1002A. The second bypass circuit 1006 is placed in vicinity of the semiconductor device 1004. Though the second bypass circuit 1006 is illustrated along with the surface layer 1002Aa according to the second embodiment, it may be mounted on the surface layer 1002Ad.

The bypass circuit 1005 has one end connected to the power plane 1010Aa and power supply terminal 1031 through the power supply via 1012a, and the bypass circuit 1005 has the other end connected to the ground plane 1011Aa and ground terminal 1032 through the ground via 1013a. The bypass circuit 1006 has one end connected to the power plane 1010Ac and power supply terminal 1041 through the power supply via 1012b, and the bypass circuit 1006 has the other end connected to the ground plane 1011Ac and ground terminal 1042 through the ground via 1013b.

The bypass circuit 1005 is configured similarly to that in the seventh embodiment and has a resistive element 1007, and a capacitor element 1008 serially connected to the resistive element 1007. The bypass circuit 1006 is also configured similarly to that in the seventh embodiment and has a capacitor element 1009.

As illustrated in FIG. 20B, the power plane 1010Aa and the ground plane 1011Ab are arranged in the inner layers 1002Ab. As illustrated in FIG. 20C, the ground plane 1011Aa and the power plane 1010Ab are arranged in the inner layers 1002Ac. In this way, the power planes 1010Aa and 1010Ab and the ground planes 1011Aa and 1011Ab are alternately arranged in the inner layers 1002Ab and 1002Ac of the printed wiring board 1002A. Vias are provided in a direction perpendicular to the planes of the printed wiring board. A power supply via 1012a and a ground via 1013a are used to connect between the power planes 1010Aa and 1010Ab alternately arranged with the inner layers 1002Ab and 1002Ac of the printed wiring board 1002A and between the ground planes 1011Aa and 1011Ab.

A more specific form of the connections between the power planes and ground planes through the vias will be described. The inner layer 1002Ab has the power plane 1010Aa having a comb-shaped end portion and a ground plane 1011Ab having a comb-shaped end portion to engage with the comb-shaped end portion of the power plane 1010Aa with a gap 1014Aa for preventing a short circuit. The inner layer 1002Ac has the power plane 1010Ab having a comb-shaped end portion. The comb-shaped power plane has a convex portion 1010Abn over a convex portion 1010Aan of the comb-shaped power plane of the inner layer 1002Ab through an insulator layer (dielectric layer). The ground plane 1011Ab having the comb-shaped end portion is provided to engage with the power plane 1010Aa having the comb-shaped end portion in the inner layer 1002Ac through a gap 1014Ab for preventing a short circuit with the power planes.

The convex portion 1010Aan of the power plane in the inner layer 1002Ab and the convex portion 1010Abn of the power plane in the inner layer 1002Ac are superposed through a dielectric layer. At least two power supply vias 1012a are neighboring to the convex portion 1010Aan of the power plane and are electrically connected to the convex portion 1020Abn of the power plane. The convex portion 1011Abn of the ground plane in the inner layer 1002Ab and the convex portion 1011Aan of the ground plane in the inner layer 1002Ac are superposed through a dielectric layer. At least two ground vias 1013a are neighboring to the convex portion 1011Aan of the ground plane and are electrically connected to the convex portion 1011Abn of the ground plane. In this case, an interval lvv between the neighboring power supply vias 1012a is equal to or smaller than the interval lvg between the power supply via 1012a and the ground via 1013a (lvv≤lvg).

The eighth embodiment focuses on an increase of the mutual inductance. The power supply vias and the ground vias are provided in the range from the semiconductor device 1001 to the bypass circuit 1006. The power supply via neighboring to the ground vias increase the inductance $L_{total}$. In other words, the inductance $L_{vdd\_via}+L_{gnd\_via}+2M$ of the vias can be effectively increased according to the eighth embodiment, compared with the inductance in the second comparison example.

The power supply vias and the ground vias provided in the range from the semiconductor device 1001 to the bypass circuit 1006 according to the eighth embodiment can increase the inductance, that is, the impedance. Furthermore, the mutual inductance between the vias can increase the inductance more effectively than the seventh embodiment. Alternatively, the inductance can be increased with fewer vias than those of the seventh embodiment and a smaller area of the printed wiring board. The power supply noise caused by operations of the semiconductor circuit 1001 is not easily fed to the bypass circuit 1006 and is fed to the bypass circuit 1005, which increases the noise attenuation effect of the bypass circuit 1005 and can reduce jitters. Therefore, jitters caused by interactions between the bypass circuit 1005 and the bypass circuit 1006 can be reduced.

The printed circuit board 1001A was designed based on the method for increasing the inductance and was computer-simulated to check the effect. Power SI by Cadence was used for simulating a power supply impedance. HSPICE by Synopsys was used for simulating jitters.

The printed wiring board 1002A has the same layer configuration (see Table 2) as that of the seventh embodiment. The hole diameter of the vias and the size of the printed wiring board 1001A are equal to those of the seventh embodiment.

The vias had a hole diameter of 0.4 mm. The power plane 1010 in the inner layer 1002Ab and the power plane in the inner layer 1002Ac had dimensions of 32 mm vertically and 30 mm horizontally. A region A1 vertically projecting the semiconductor device 1003 to the inner layers 1002Ab and 1002Ac of the printed wiring board had 16 power supply vias 1012a and 16 ground vias 1013a. The power supply vias 1012a and the ground vias 1013a were arranged with intervals of 1 mm therebetween in the projection region A1 assuming that the vias are provided between BGA ball pads. The power supply vias are neighboring to each other by focusing on an increase of the mutual inductance.

Forty power supply vias 1012b and forty ground vias 1013b were provided in vicinity of the semiconductor device 1002.

Forty power supply vias 1012b and forty ground vias 1013b were provided in vicinity of the semiconductor device 1002.

The power planes and ground planes which are a feature of the eighth embodiment are arranged alternately with the inner layers 1002Ab and 1002Ac of the printed wiring board 1002A, and a power supply structure is provided in which the vias are used for connecting between the power planes and between the ground planes.

Figure 21A:
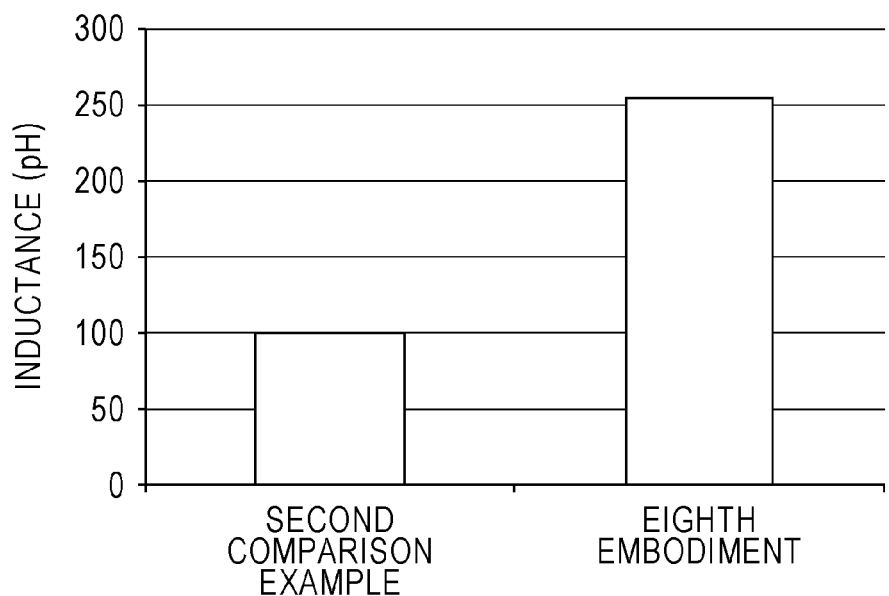
FIGS. 21A and 21B are graphs comparing source inductances of the printed circuit board according to the eighth embodiment and the printed circuit board of the second comparison example.

FIG. 21A is a graph comparing power supply impedance simulation results between the printed circuit board 1001A according to the eighth embodiment of the present invention and the printed circuit board 1001X according to the second comparison example. While the inductance of the second comparison example was 100 pH, the inductance of the eighth embodiment was 256 pH. According to the eighth embodiment, the inductance was increased by 156 pH. In other words, the impedance of the path RX2 could be increased to prevent the change of the power feeding path.

Figure 21B:
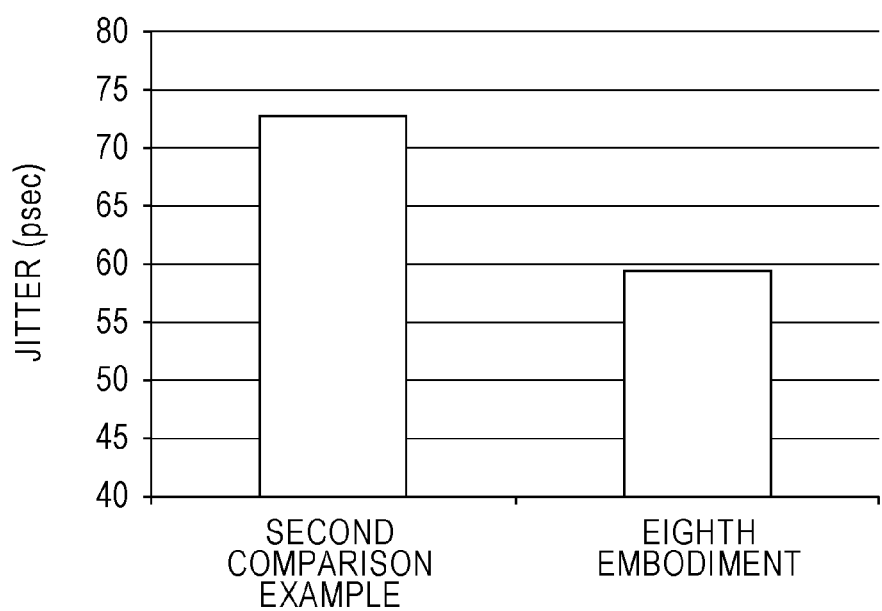

FIG. 21B is a graph comparing jitter simulation results between the printed circuit board 1001AX according to the eighth embodiment of the present invention and the printed circuit board 1001X according to the second comparison example. Like the seventh embodiment, by implementing a waveform simulation assuming DDR3-1333, jitters in the output terminal 1030 of the semiconductor device 1003 were measured. The voltage for the jitter observation was half of power supply voltage. Jitters in the second comparison example were measured as 73 psec while jitters in the eighth embodiment were measured as 60 psec. The power supply structure of the eighth embodiment reduced the jitters by 13 psec (18%). Furthermore, according to the eighth embodiment, the mutual inductance may be used to reduce jitters equivalently to the seventh embodiment with fewer vias than those of the seventh embodiment.

According to the eighth embodiment as described above, the power supply structure in which the power planes 1010 and the ground planes 1011 arranged alternately with the inner layers 1002Ab and 1002Ac of the printed wiring board 1002A are connected by using vias can prevent the change of the power feeding path. Thus, the jitters can be reduced more than the second comparison example. Furthermore, the mutual inductance between vias may be used to reduce the number of vias, compared to the seventh embodiment.

It should be noted that the present invention is not limited to the aforementioned embodiments but various changes, alterations and modifications may be made without departing from the technical concept of the present invention.

Ninth Embodiment

Figure 22A:
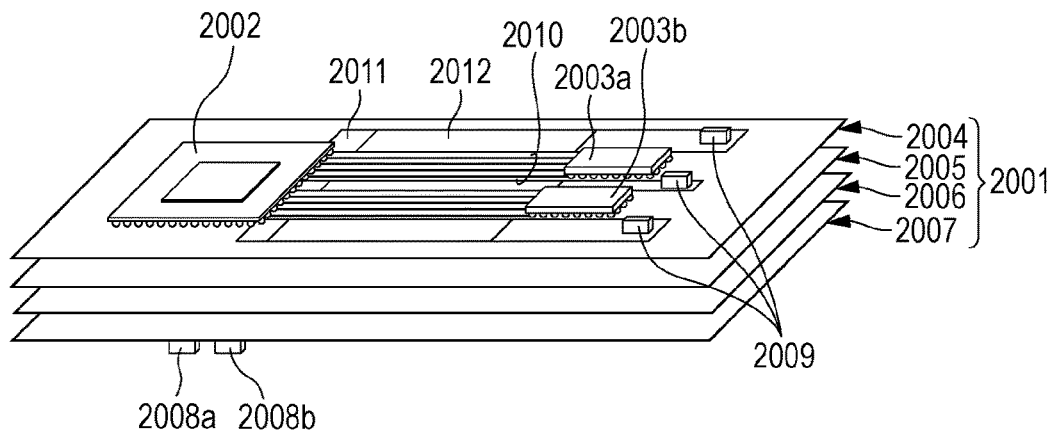
FIGS. 22A to 22C are a perspective view and plan view illustrating a schematic configuration of a printed circuit board according to a ninth embodiment.
Figure 22B:
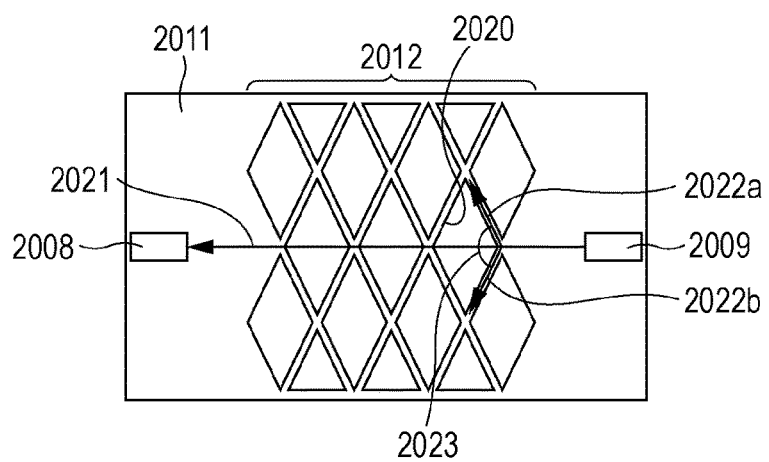
Figure 22C:
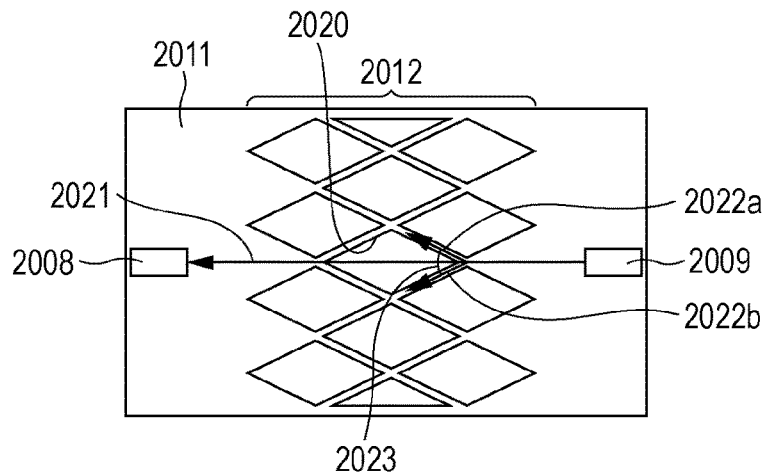

FIGS. 22A to 22C illustrate a schematic configuration of a printed wiring board according to a ninth embodiment of the present invention. The ninth embodiment has a region having a mesh structure having openings in a ground pattern on the printed wiring board in order to increase the impedance of the path $RX_2$ illustrated in FIG. 15 compared to the impedance of the path $RX_1$.

FIGS. 22A to 22C illustrate a printed wiring board 2001, a semiconductor device 2002, and DRAMs 2003a and 2003b. FIGS. 22A to 22C further illustrate a first wiring layer 2004, a power plane layer 2005, a ground plane layer 2006, and a second wiring layer 2007. FIGS. 22A to 22C further illustrate a first capacitor element 2008a, a resistive element 2008b, and a second capacitor 2009. FIGS. 22A to 22C further illustrate a signal wire 2010. FIGS. 22A to 22C further illustrate a ground plane 2011 provided in the first wiring layer 2004 and a mesh 2012 provided in the ground plane 2011.

As illustrated in FIG. 22A, the printed wiring board 2001 includes four layers including the first wiring layer 2004, the power plane layer 2005, the ground plane layer 2006, and the second wiring layer 2007. In the layer configuration of the printed wiring board 1, the first wiring layer 2004, power plane layer 2005, ground plane layer 2006, and second wiring layer 2007 are stacked sequentially. In this case, because the entire thickness of the printed wiring board 2001 is adjusted, the insulator thickness between the power plane layer 2005 and the ground plane layer 2006 is variable but is thicker than the insulator thickness between the first wiring layer 2004 and the power plane layer 2005.

The printed wiring board 2001 has a semiconductor device 2002 and the DRAMs 2003a and 2003b thereon. The semiconductor device 2002 and the DRAM 2003a and the semiconductor device 2002 and the DRAM 2003b are connected by the signal wire 2010. The signal wire 2010 in the first wiring layer 2004 is surrounded by the ground plane 2011.

The first capacitor element 2008a and the resistive element 2008b are provided in proximity of the semiconductor device 2002 and are serially connected to the power supply terminal and the ground terminal of the semiconductor device 2002, the power plane layer 2006, the ground plane 2007, and the ground plane 2012 through vias or wires. The second capacitor element 2009 is provided in proximity of the DRAMs 2003a and 2003b and is connected to the power supply terminal and the ground terminal of the DRAMs 2003a and 2003b, the power plane layer 2006, the ground plane 2007, and the ground plane 2012 through vias or a wire. The ground plane 2011 between the first capacitor element 2008a and the second capacitor element 2009 has the mesh 2012.

FIG. 22B is a plan view of a mesh shape according to the ninth embodiment of the present invention. FIG. 22B illustrates openings 2020 of the mesh. FIG. 22B illustrates a line segment 2021 connecting the second capacitor element 2009 and the first capacitor element 2008a. Currents 2022a and 2022b flow along the openings 2020 of the mesh. FIG. 22B further illustrates an angle 2023 formed by the currents 2022a and 2022b.

As illustrated in FIG. 22B, the mesh is placed at a position between the first capacitor element 2008a and the second capacitor element 2009 of the ground plane 2011 provided on the first wiring layer 2004 of the printed wiring board 2001. The mesh shape has the angle 2023 being an obtuse angle formed by the currents 2022a and 2022b along the opening 2020. The opening 2020 is arranged such that the obtuse angle can face toward the line segment 2021.

Figure 23:
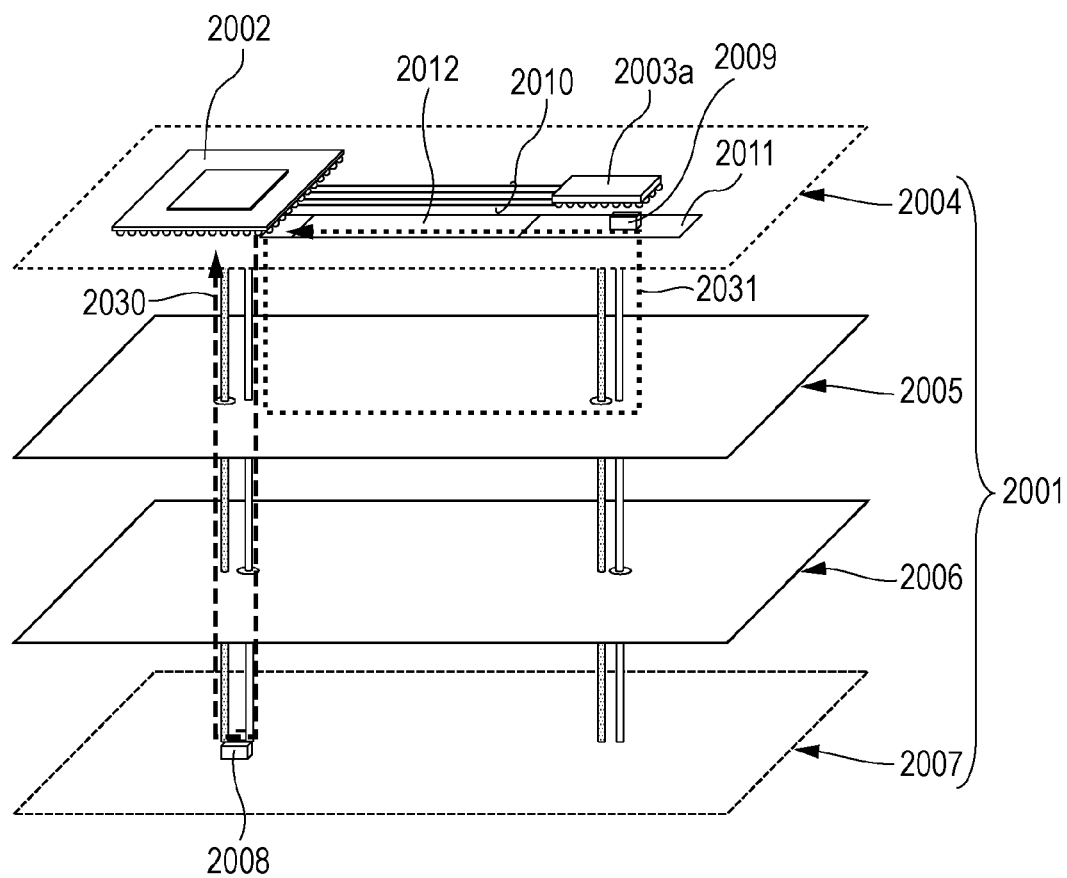
FIG. 23 is a schematic view illustrating a power feeding path to a semiconductor device.

The first capacitor element 2008a is placed in proximity of the semiconductor device 2002 and is connected to the power supply terminal and ground terminal of the semiconductor device 2002, the power plane layer 2006, the ground plane 2007, and the ground plane 2012 through vias or a wire. The second capacitor 2009 is placed in proximity of the DRAMs 2003a and 2003b and is connected to the power supply terminals and ground terminals of the DRAMs 2003a and 2003b, the power plane layer 2006, the ground plane 2007, and the ground plane 2012 through vias or a wire. FIG. 23 illustrates the power feeding path to the semiconductor device 2002 in a case where the first capacitor element 2008a and the second capacitor 2009 are mounted on the printed wiring board 2001. FIG. 23 illustrates a path 2030 for feeding power to the semiconductor device 2002 through the first capacitor element 2008a and a path 2031 for feeding power to the semiconductor device 2002 through the second capacitor 2009. When the insulator thickness between the first wiring layer 2004 and the power plane layer 2005 is thinner than the insulator thickness between the power plane layer 2005 and the ground plane layer 2006, the power feeding path 2031 through the ground plane is used because the ground plane in proximity of the power plane layer 2005 functions as a current feedback path.

In order to isolate the power feeding path, the mesh 2012 is provided on the power feeding path 2031. A longer distance of current flow may be required for effectively increasing the inductance in a limited area of the first wiring layer 2004 of the printed wiring board 2001. For that, as illustrated in FIG. 22B, the mesh has the obtuse angle 2023 formed by the currents 2022a and 2022b along the opening 2020, like the mesh 2012. The opening 2020 provided such that the obtuse angle can direct to the line segment 2021 generates a meander current path for increasing the distance.

Alternatively, as illustrated in FIG. 22C, the mesh has a shape having the angle 2023 being an acute angle formed by the currents 2022a and 2022b along the opening 2020. The opening 2020 provided such that the obtuse angle can direct to the line segment 2021 can increase the inductance of the power feeding path 2031 by using the mutual inductance caused by a current component in the same direction as those of the currents 2022a and 2022b.

While FIGS. 22B and 22C illustrate the mesh having a rhombic opening, the mesh may be hexagonal or elliptic.

It may be considered that isolating the power feeding paths 2030 and 2031 can prevent the change of the power feeding path and thus can reduce jitters. Accordingly, a region having a high inductance may be provided on the ground plane 2011 of the power feeding path 2031 for electrically isolating the power feeding paths 2030 and 2031.

Jitters were compared between the printed wiring board of the present invention and a third comparison example without a region in which the ground plane 2011 does not have a high inductance. The jitters were acquired by performing a computer simulation. First, the power supply impedance was calculated from an electromagnetic field simulation of the printed wiring board illustrated in FIGS. 22A to 22C. In this case, the insulator thicknesses between the layers are 0.1 mm, 1.2 mm, and 0.1 mm in order. PowerSI by Cadence was used as the electromagnetic field simulator.

Next, an equivalent circuit model was generated from the power supply impedance, and the equivalent circuit model was connected to the SPICE model in the DDR3 memory controller. With the circuit simulation, waveforms of a signal output terminal of the DDR3 controller were observed. HSPICE by Synopsys was used as a circuit simulator. The jitters in reference voltage of the signal waveforms acquired from the simulation were measured.

Figure 24:
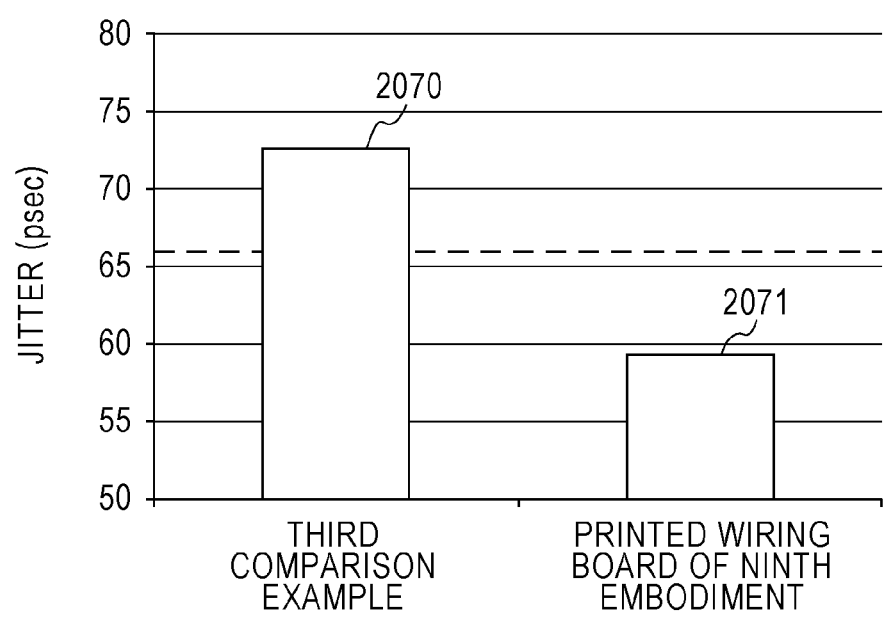
FIG. 24 is a graph comparing jitter values of printed wiring boards according to the ninth embodiment and a conventional technology.

FIG. 24 is a graph comparing jitter values between the printed wiring board of the present invention and the third comparison example. FIG. 24 illustrates a horizontal axis and a vertical axis indicating structures and jitters of the printed wiring boards, respectively. FIG. 24 illustrates a jitter value 2070 of a conventional printed wiring board and a jitter value 2071 of the printed wiring board of the present invention.

According to the ninth embodiment of the present invention as described above, the jitters increased by a power-supply-related noise measure and a signal-related noise measure can be inhibited, and a misoperation risk can be reduced.

Tenth Embodiment

Figure 25A:
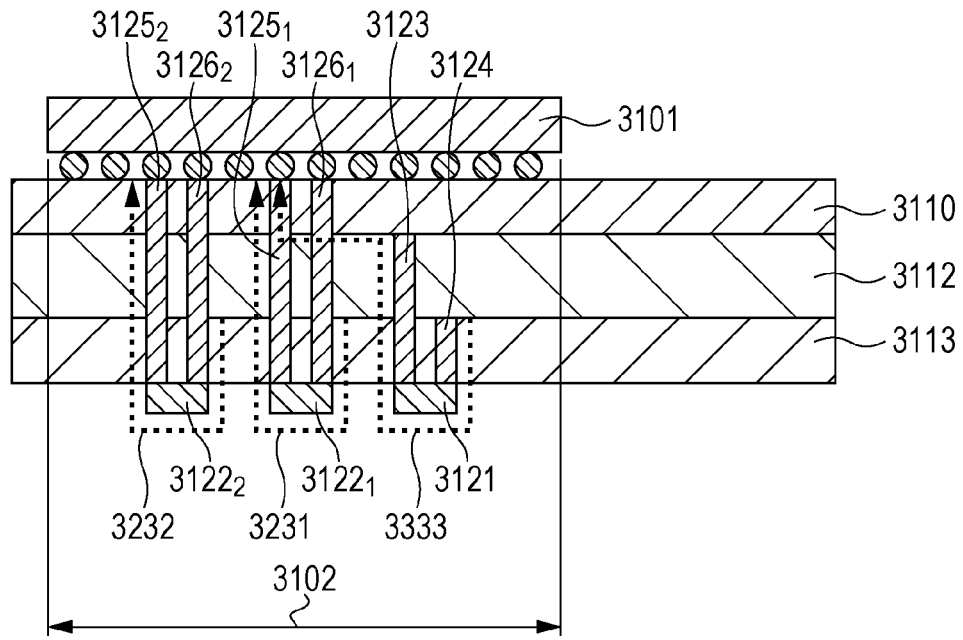
FIGS. 25A and 25B illustrate a printed circuit board according to a tenth embodiment.
Figure 25B:
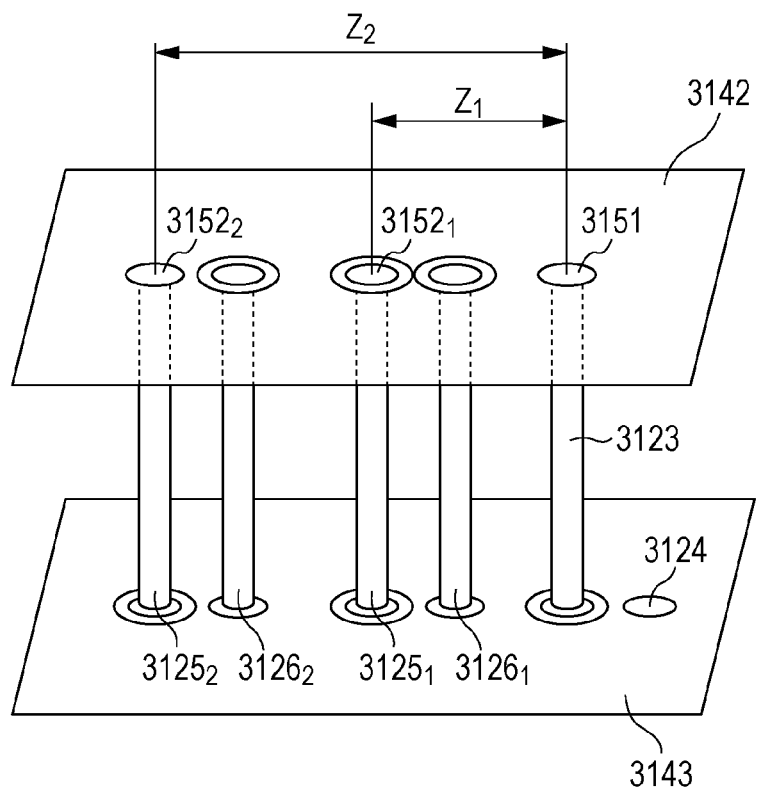

A tenth embodiment of the present invention will be described with reference to FIGS. 25A and 25B. FIGS. 25A and 25B illustrate a printed circuit board according to the tenth embodiment.

FIG. 25A is a cross section view of a printed wiring board 3110 on which a semiconductor device 3101 is mounted and which includes a power supply wiring layer 3112 in which power supply wiring is mainly provided and a ground wiring layer 3113 in which ground wiring is mainly provided. In a region 3102 projecting the semiconductor device to the printed wiring board 3110, a series circuit is mounted which includes a capacitor element 3121, a plurality of resistive elements and capacitor elements. FIG. 25A illustrates series circuits $3122_1$ and $3122_2$ including a resistive element and a capacitor element. The semiconductor device 3101 has power supply terminals connected to the series circuits $3122_1$ and $3122_2$ through vias $3125_1$ and $3125_2$. The semiconductor device 3101 has ground terminals connected to the series circuits $3122_1$ and $3122_2$ through vias $3126_1$ and $3126_2$. The power supply wiring layer 3112 and the capacitor element 3121 are connected through the via 3123, and the ground wiring layer 3113 and the capacitor element 3121 are connected through the via 3124.

FIG. 25B is a perspective view illustrating the ground wiring layer 3113, power supply wiring layer 3112, and vias which connect between the layers within the region 3102 of the printed wiring board 3110. The ground wiring layer 3113 has a ground wire 3143 thereon, and the power supply wiring layer 3112 has a power supply wire 3142 thereon. The vias 3123, $3125_1$, and $3125_2$ on the power supply wiring layer 3112 are referred by references 3151, $3152_1$, and $3152_2$, respectively. Assume a case where impedances $Z_1$ and $Z_2$ occur between the vias 3151 and $3152_1$ and vias 3151 and $3152_2$ when the power supply wire 3142 and the vias $3125_1$ and $3125_2$ are connected. In this case, the power supply wire 3142 is not connected to the vias $3152_1$ and $3152_2$ having a lower impedance than the resistance value R of the series circuits $3122_1$ and $3122_2$. Because the main power supply noise frequency according to this embodiment is the operating frequency of the semiconductor device, the term "impedance" here refers to the impedance at the operating frequency of the semiconductor device unless otherwise specified.

The following descriptions assume a relationship of $Z_2 > R > Z_1$. In this case, the power supply wire 3142 and the vias 3123 and $3125_2$ are connected, and the via $3125_1$ is not connected. The ground wiring layer 3143 and the vias 3124, $3126_1$, and $3126_2$ are connected.

The semiconductor device according to this embodiment illustrated in the FIGS. 25A and 25B has three main power feeding paths. A first power feeding path corresponds to a path 3231 through the ground wire 3143—via $3126_1$—series circuit $3122_1$—via $3125_1$—power supply terminal of the semiconductor device. A second power feeding path corresponds to a path 3232 through ground wire 3143—via $3126_2$—series circuit $3122_2$—via $3125_2$—power supply terminal of the semiconductor device. A third power feeding path corresponds to a path 3333 through ground wiring layer 3113—via 3124—capacitor element 3121—via 3123—power supply wiring layer 3112—via $3125_1$—power supply terminal of the semiconductor device.

When the impedances $Z_1$ and $Z_2$ occur between the vias 3151 and $3152_1$ and vias 3151 and $3152_2$ and the resistance value R of the series circuits $3122_1$ and $3122_2$ satisfies the relationship $Z_2 > R > Z_1$ power feeding path 3231, the paths 3232 and 3333 may be isolated. Thus, the change of the power feeding path may be prevented, and jitters may be reduced.

Accordingly, when relationships of $Z_{3231} < Z_{3233}$, $Z_{3232} < Z_{3333}$ are satisfied where the impedances of the paths 3231, 3232, and 3333 are $Z_{3231}$, $Z_{3232}$, $Z_{3333}$, respectively, the power feeding paths 3231, 3232, and 3333 are isolated.

Figure 26A:
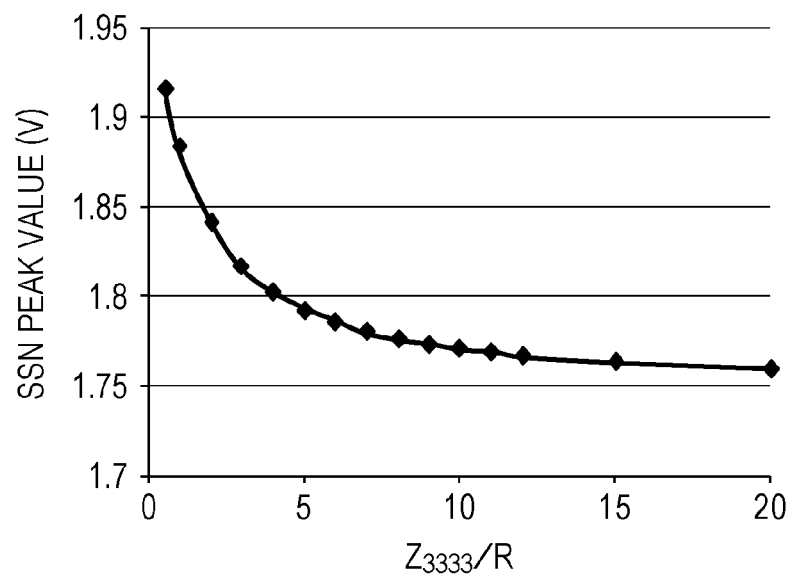
FIGS. 26A and 26B are graphs illustrating results of a computer simulation of changes in power supply noise with respect to an impedance of a power feeding path.
Figure 26B:
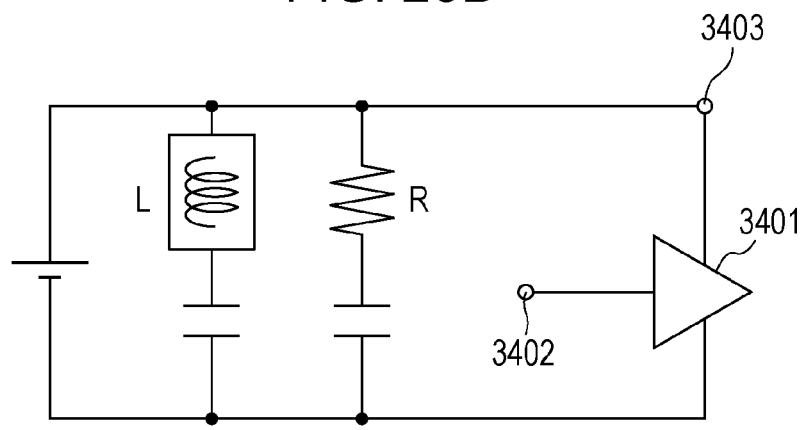

FIG. 26A is a graph illustrating results of calculations of changes in power supply noise against the impedance $Z_{3333}$ of the power feeding path 3333 by performing a computer simulation. The graph in FIG. 26A has a vertical axis indicating a peak value of power supply noise and a horizontal axis indicating a value acquired by dividing the impedance $Z_{3333}$ by a resistance R of the series circuit. FIG. 26A illustrates results of a simulation using a circuit model illustrated in FIG. 26B and HSPICE by Synopsys. A SPICE model of a DDR3-1333 memory was used as a semiconductor device model 3401 being a circuit model, and when a rise waveform was input to a port 3402 as an input waveform, the peak value of a power supply voltage Port 3403 of the semiconductor device was extracted. In this case, $Z_{3333}$ was represented by using an inductance L as $Z_{3333} = 2\pi f L$.

It is understood from FIG. 26A that when the impedance $Z_{3333}$ of the power feeding path 3333 increases, the power supply noise decreases. From this, the power feeding paths 3231 and 3232 are isolated by using a difference in impedance such that the power feeding paths 3231 and 3232 to the semiconductor device can be main power feeding paths, thus reducing the power supply noise. Therefore, it is understood that the jitters can be reduced.

Next, the isolation of the power feeding paths according to the tenth embodiment will be described with reference to FIG. 25. From the condition, $Z_2 > R > Z_1$, relationships of $Z_{3231} < Z_{3333}$ and $Z_{3232} > Z_{3233}$ are satisfied. In order to satisfy a relationship of $Z_{3231} > Z_{3333}$, a via $3325_1$ and a power supply wire 3312 are not connected to the path 3231 having a lower impedance than $Z_{3333}$. The non-connection isolates the path to via $3126_1$ of the path 3333 is physically isolated. Thus, the path 3333 is changed to a path through ground wiring 3113—via 3124—capacitor element 3121—via 3123—power supply wire 3112—via $3125_2$—power supply terminal of the semiconductor device. When the changed path has the impedance $Z_{3333'}$, a relationship of $Z_{3231} > Z_{3333'}$ is satisfied based on the relationship $Z_2 > R > Z_1$. Whether the via connected to series circuits is connected to the power supply wire 3142 or not may be determined in accordance with the impedance so that the power feeding path may be isolated.

Having described that, according to the tenth embodiment, as illustrated in FIGS. 25A and 25B, two series circuits, one capacitor element, and one via not connected to power supply wiring are provided, an embodiment of the present invention is not limited thereto. A plurality of series circuits, capacitor elements and vias may be provided. For a series circuit in which a resistance and a capacitance are serially connected, a connection member of a part mounting portion may be changed to a highly resistive material, or a high ESR capacitor element may be used, for example. Alternatively, a resistor and a capacitor element may be serially connected, for example.

SSN jitters in printed circuit boards according to the tenth embodiment and a fourth comparison example were compared. The jitter values were derived by performing a computer simulation. First, the electromagnetic simulation was performed on the printed circuit boards of the tenth embodiment and the fourth comparison example to extract the power supply impedances. PowerSI by Cadence was used as the electromagnetic field simulator. Next, the power supply impedance and the SPICE model of the DDR3 memory controller were connected. With the circuit simulation, waveforms of a signal output terminal of the DDR3 controller were observed. HSPICE by Synopsys was used as a circuit simulator.

Specific shapes of the printed circuit boards according to the tenth embodiment and the fourth comparison example will be described with reference to FIGS. 27A to 27C and FIGS. 28A to 28C. The circuit model used in the circuit simulation will be described with reference to FIGS. 29A and 29B.

FIGS. 27A to 27C are schematic diagrams of the printed wiring board according to the fourth comparison example. The layer configuration includes a first wiring layer on which a semiconductor device is mounted, a second power supply wiring layer 3112, a third ground wiring layer 3113, and a fourth wiring layer on which parts are mounted. In this case, the insulator thicknesses between the layers are 0.1 mm, 1.2 mm, and 0.1 mm in order. FIG. 27A is a schematic diagram illustrating the second power supply wiring layer 3112 having the region 3102 projecting the semiconductor device to the printed wiring board and the power supply wire 3142. The power supply wire 3142 has dimensions of 50 mm vertically×50 mm horizontally. FIG. 27B is a schematic diagram illustrating the third ground wiring layer 3113 having the region 3102 projecting the semiconductor device to the printed wiring board and the ground wire 3143. The ground wire 3143 has dimensions of 80 mm vertically×50 mm horizontally. FIG. 27C is a schematic diagram illustrating a fourth wiring layer having the region 3102 projecting the semiconductor device to the printed wiring board. The region 3102 has the plurality of series circuits 3122 and the capacitor element 3121. The series circuits 3122 and the capacitor element 3121 are connected to the power supply wire 3142 and the ground wire 3143 through vias.

Figure 28C:
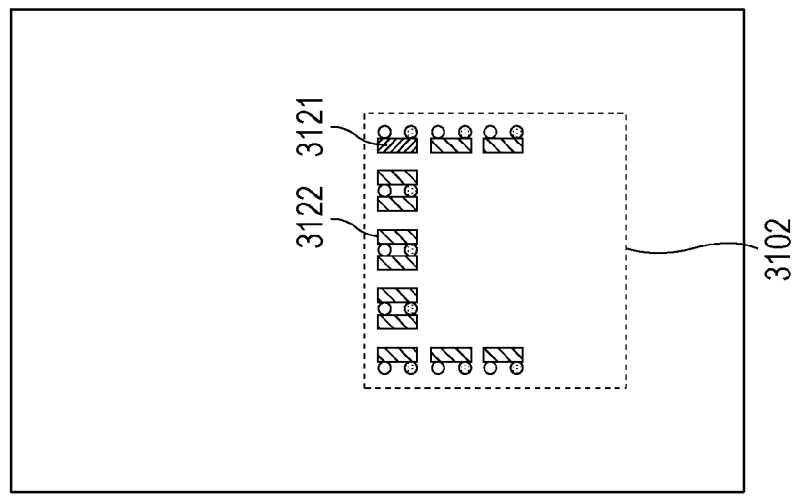
FIGS. 28A to 28C are schematic diagrams of a printed wiring board according to a tenth embodiment.
Figure 28B:
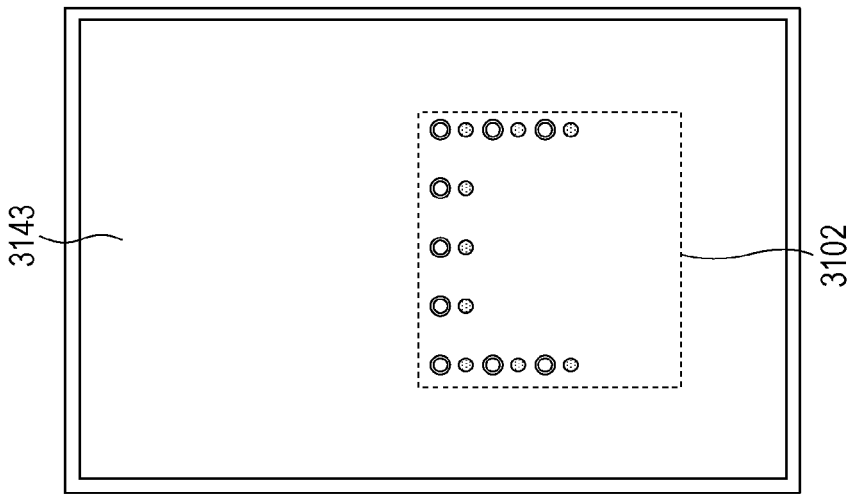
Figure 28A:
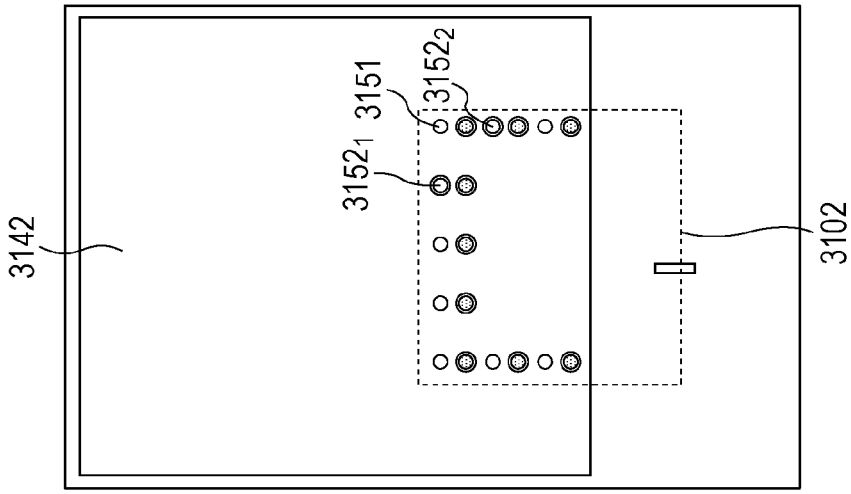

FIGS. 28A to 28C are schematic diagrams of the printed wiring board according to the tenth embodiment. Differences from the fourth comparison example in FIGS. 27A to 27C will be described below. FIG. 28A illustrates a via pad 3151 on the power supply wire 3142 of a via connecting to the capacitor element and via pads $3152_1$, $3152_2$, $3152_3$, etc. on the power supply wire 3142 of vias connecting to the series circuit. Assume a case where impedances $Z_1$ and $Z_2$ occur between the vias 3151 and $3152_1$ and vias 3151 and $3152_2$ when the power supply wire 3142 and the vias $3125_1$ and $3125_2$ are connected. In this case, the power supply wire 3142 is not connected to the vias $3152_1$ and $3152_2$ having a lower impedance than the resistance value R of the series circuits $3122_1$ and $3122_2$.

Figure 29A:
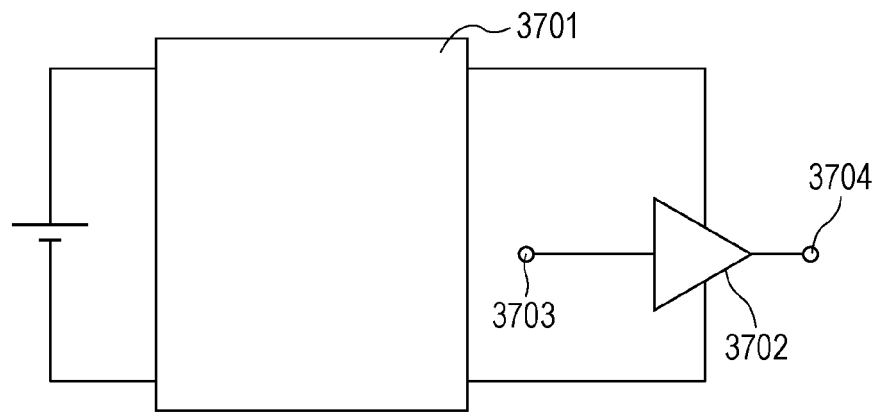
FIGS. 29A and 29B are schematic diagrams of a model used for simulation of calculation of jitters according to the tenth embodiment.
Figure 29B:
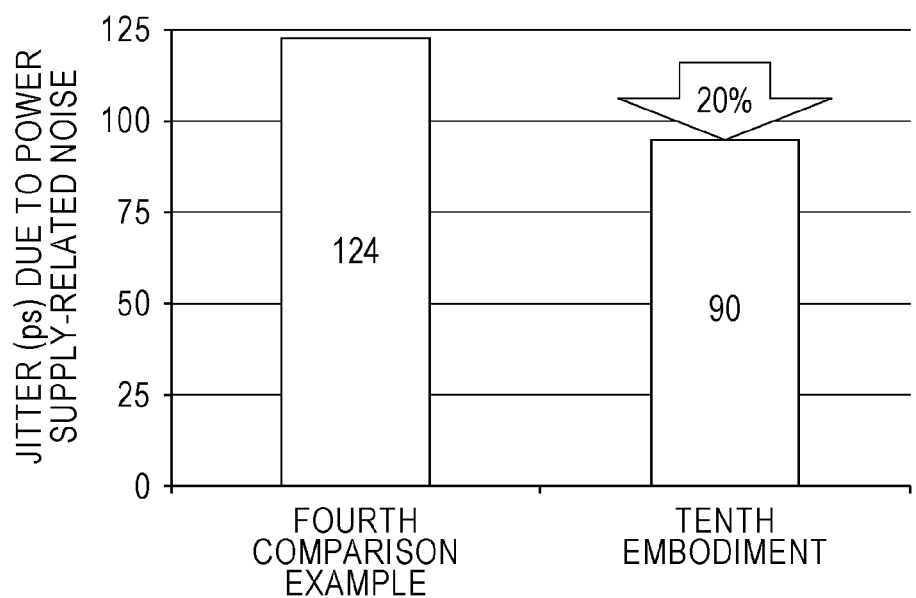

Next, the circuit model used in the circuit simulation and simulation results will be described with reference to FIGS. 29A and 29B. In the circuit model in FIG. 29A, the model 3701 with the power supply impedance and the SPICE model 3702 of the DDR3 memory controller were connected. With the circuit simulation, waveforms of a output waveform terminal 3704 were observed when a pseudo random signal waveform was input to the input terminal 3703 of the DDR controller. The jitters in reference voltage of the thus acquired signal waveforms were measured. FIG. 29B illustrates a result of a comparison between the tenth embodiment and the fourth comparison example.

From the comparison result in FIG. 29B, this embodiment acquires a jitter reduction effect of 27% compared to the fourth comparison example.

Eleventh Embodiment

Figure 30:
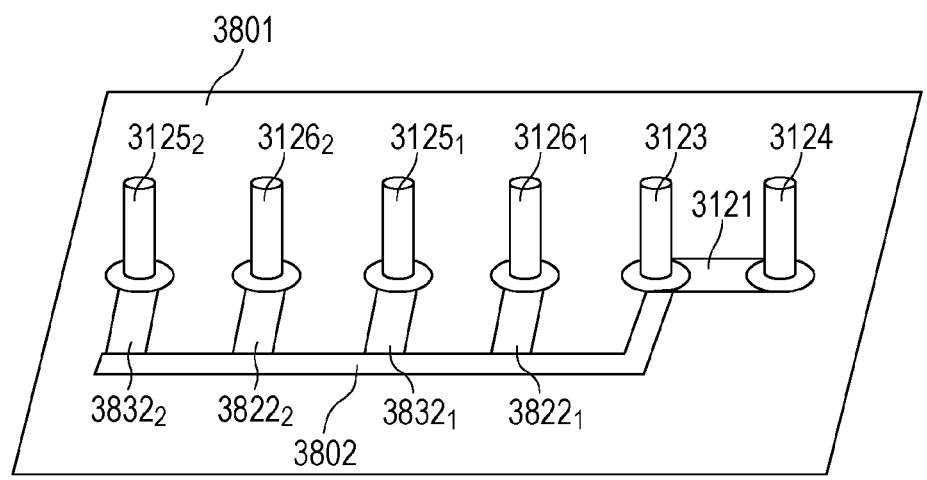
FIG. 30 is a schematic diagram of a printed circuit board according to an eleventh embodiment.

An eleventh embodiment of the present invention will be described with reference to FIG. 30. FIG. 30 illustrates a wiring layer 3801 mounting the components in FIG. 26B including the series circuits and the capacitor element 3121. The eleventh embodiment is different from the tenth embodiment in that a plurality of series circuit including resistance parts $3832_1$ and $3832_2$ and capacitor elements $3822_1$ and $3822_2$ are connected, and that a capacitor element 3121 is connected to a wire 3802 between the resistance parts $3832_1$ and $3832_2$ and the capacitor elements $3822_1$ and $3822_2$ therein.

With the connection by the wire 3802, the commonality of the capacitor path may be achieved, and the parasitic inductances of the parts may be reduced because of their parallel effect. This can reduce the power supply noise.

Having described that, according to the eleventh embodiment, two series circuits, one capacitor element and one via not connected to a power supply wire are provided as illustrated in FIG. 30, an embodiment of the present invention is not limited thereto. A plurality of those components may be provided. Though those components are connected by the wire 3802, they may be connected by a plane.

Twelfth Embodiment

Figure 31A:
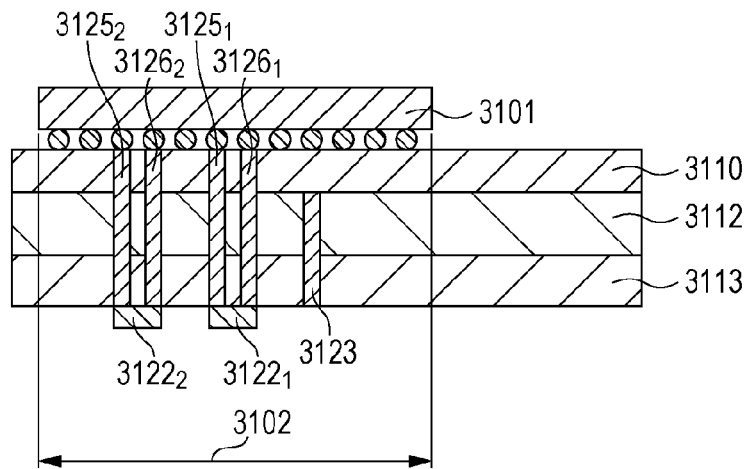
FIGS. 31A to 31C are schematic diagrams of a printed circuit board according to a twelfth embodiment.
Figure 31B:
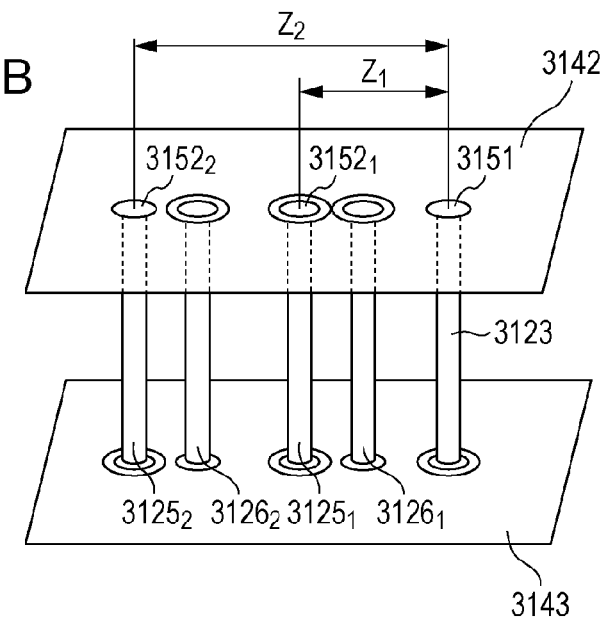
Figure 31C:
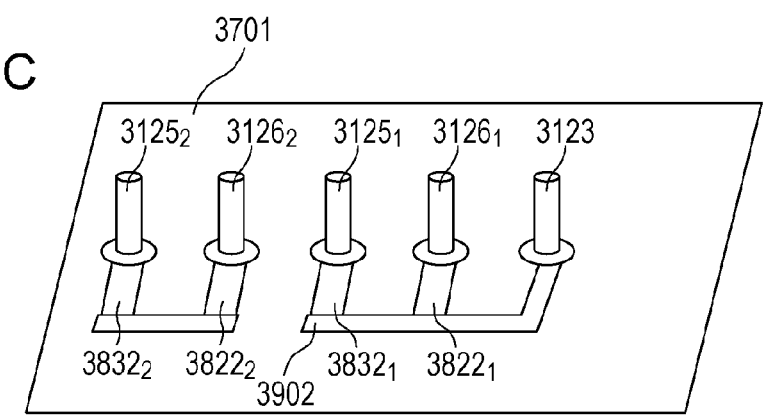

A twelfth embodiment of the present invention will be described with reference to FIGS. 31A to 31C. FIGS. 31A to 31C are schematic diagrams of a printed circuit board according to the twelfth embodiment. Differences from the tenth embodiment in FIG. 26 will be described.

FIG. 31C illustrates a wiring layer 3801 mounting the components in FIG. 26. The twelfth embodiment is different from the eleventh embodiment in that the series circuits are provided including resistance parts $3832_1$ and $3832_2$ and capacitor elements $3822_1$ and $3822_2$, and that the capacitor elements 3121 and the via 3124 are not provided. The via 3123, the resistance part $3832_1$ and the capacitor element $3822_1$ are connected by a wire 3902.

With the connection by the wire 3902, a function for preventing power supply noise and a function for preventing signal noise may be provided for the capacitor elements in the series circuits, and the number of parts and the mounting area may thus be reduced.

Having described that according to the twelfth embodiment, as illustrated in FIG. 26B and FIGS. 31A to 31C, two series circuits, one capacitor element, and one via not connected to power supply wiring are provided, an embodiment of the present invention is not limited thereto. A plurality of those components may be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-235526, filed Nov. 20, 2014 and No. 2015-204852 filed Oct. 16, 2015, which are hereby incorporated by reference herein in their entirety.

What is claimed is:

1. A printed circuit board comprising:
   a first semiconductor circuit having an output terminal configured to output a signal, a first power supply terminal to which a power supply potential is applied, and a first ground terminal to which a ground potential is applied;

a second semiconductor circuit having an input terminal to which a signal is input, a second power supply terminal to which a power supply potential is applied and a second ground terminal to which a ground potential is applied;

a printed wiring board on which the first semiconductor circuit and the second semiconductor circuit are mounted and a signal line configured to connect the output terminal are the input terminal is provided, the printed wiring board having a power plane in conduction with the first power supply terminal and the second power supply terminal, and a ground plane in conduction with the first ground terminal and the second ground terminal;

a first bypass circuit mounted on the printed wiring board, the first bypass circuit having one end connected to the power plane through a first power supply via provided in the printed wiring board and the other end connected to the ground plane through a first ground via provided in the printed wiring board, the first bypass circuit including a first resistance component and a first capacitance component serially connected to the first resistance component, the first bypass circuit being provided closer to the first semiconductor circuit; and a second bypass circuit mounted on the printed wiring board, the second bypass circuit having one end connected to the power plane through a second power supply via provided in the printed wiring board and the other end connected to the ground plane through a second ground via provided in the printed wiring board, the second bypass circuit including a second resistance component having a lower resistance value than that of the first resistance component and a second capacitance component serially connected to the second resistance component, the second bypass circuit being provided closer to the second semiconductor circuit, wherein the ground plane has an inner slit being a slit crossing a line segment connecting a connection position of the first ground via and a connection position of the second ground via between the connection position of the first ground via and the connection position of the second ground via.

2. The printed circuit board according to claim 1, wherein the inner slit extends longer than line segments projecting the diameters of the first and second ground vias along a straight line perpendicular to the straight line through the centers of the first and second ground vias.

3. The printed circuit board according to claim 1, wherein the ground plane has the inner slit in vicinity of the connection position of the first ground via and in vicinity of the connection position of the second ground via.

4. The printed circuit board according to claim 1, wherein the power plane has a first outer slit being a slit present at a position on the opposite side of a line segment connecting a through position through which the first ground via extends and a through position through which the second ground via extends about a through position through which the first ground via extends.

5. The printed circuit board according to claim 1, wherein the power plane has a second outer slit being a slit at a position on the opposite side of a line segment connecting a through position through which the first ground via extends and a through position through which the second ground via extends about a through position through which the second ground via extends.

6. The printed circuit board according to claim 1, wherein the power plane has an inner slit being a slit crossing a line segment connecting a connection position of the first power supply via and a connection position of the second power supply via between the connection position of the first power supply via and the connection position of the second power supply via.

7. The printed circuit board according to claim 6, wherein the inner slit extends longer than line segments projecting the diameters of the first and second power supply vias along a straight line perpendicular to the straight line through the centers of the first and second power supply vias.

8. The printed circuit board according to claim 6, wherein the power plane has the inner slit in vicinity of a connection position of the first power supply via and in vicinity of a connection position of the second power supply via.

9. The printed circuit board according to claim 6, wherein the ground plane has a first outer slit being a slit present at a position on the opposite side of a line segment connecting a through position through which the first power supply via extends and a through position through which the second power supply via about the through position through which the first power supply via.

10. The printed circuit board according to claim 6, wherein
the ground plane has a second outer slit being a slit present at a position on the opposite side of a line segment connecting a through position through which the first power supply via extends and a through position through which the second power supply via extends about the through position through which the second power supply via extends.

11. A printed circuit board comprising:

a first semiconductor circuit having an output terminal configured to output a signal, a first power supply terminal to which a power supply potential is applied, and a first ground terminal to which a ground potential is applied;

a second semiconductor circuit having an input terminal to which a signal is input, a second power supply terminal to which a power supply potential is applied and a second ground terminal to which a ground potential is applied;

a printed wiring board on which the first semiconductor circuit and the second semiconductor circuit are mounted and a signal line configured to connect the output terminal are the input terminal is provided, the printed wiring board having a power plane in conduction with the first power supply terminal and the second power supply terminal, and a ground plane in conduction with the first ground terminal and the second ground terminal;

a first bypass circuit mounted on the printed wiring board, the first bypass circuit having one end connected to the power plane through a first power supply via provided in the printed wiring board and the other end connected to the ground plane through a first ground via provided in the printed wiring board, the first bypass circuit including a first resistance component and a first capacitance component serially connected to the first resistance component, the first bypass circuit being provided closer to the first semiconductor circuit; and a second bypass circuit mounted on the printed wiring board, the second bypass circuit having one end connected to the power plane through a second power supply via provided in the printed wiring board and the other end connected to the ground plane through a second ground via provided in the printed wiring board, the second bypass circuit including a second resistance component having a lower resistance value than that of the first resistance component and a second capacitance component serially connected to the second resistance component, the second bypass circuit being provided closer to the second semiconductor circuit, wherein the power plane has an inner slit being a slit crossing a line segment connecting a connection position of the first power supply via and a connection position of the second power supply via between the connection position of the first power supply via and the connection position of the second power supply via.

12. A printed circuit board comprising:

a first semiconductor circuit having an output terminal configured to output a signal, a first power supply terminal to which a power supply potential is applied, and a first ground terminal to which a ground potential is applied;

a second semiconductor circuit having an input terminal to which a signal is input, a second power supply terminal to which a power supply potential is applied and a second ground terminal to which a ground potential is applied;

a printed wiring board on which the first semiconductor circuit and the second semiconductor circuit are mounted and a signal line configured to connect the output terminal are the input terminal is provided, the printed wiring board having first and second power planes in conduction with the first power supply terminal and the second power supply terminal, and first and second ground planes in conduction with the first ground terminal and the second ground terminal;

a first bypass circuit mounted on the printed wiring board, the first bypass circuit having one end connected to the first power plane through a first power supply via provided in the printed wiring board and the other end connected to the first ground plane through a first ground via provided in the printed wiring board, the first bypass circuit including a first resistance component and a first capacitance component serially connected to the first resistance component, the first bypass circuit being provided closer to the first semiconductor circuit; and a second bypass circuit mounted on the printed wiring board, the second bypass circuit having one end connected to the power plane through a second power supply via provided in the printed wiring board and the other end connected to the second ground plane through a second ground via provided in the printed wiring board, the second bypass circuit including a second resistance component having a lower resistance value than that of the first resistance component and a second capacitance component serially connected to the second resistance component, the second bypass circuit being provided closer to the second semiconductor circuit, wherein a region projecting the semiconductor circuit to the printed circuit board has a first power plane and a first ground plane each having a comb-shaped end portion, the comb-shaped portion of the first power plane and the comb-shaped portion of the first ground plane being engaged through a gap, and has a second inner layer having a second ground plane having a comb-shaped end portion, the second ground plane facing the first power plane, the second ground plane having the comb-shaped portion engaging with the comb-shaped portion of the second power plane through a gap; and the first power plane and the second power plane are connected through a second power supply via hole of a comb-shaped convex portion, and the first ground plane and the second ground plane are connected through a second ground via of a comb-shaped convex portion.

13. The printed circuit board according to claim 12, wherein the first power plane and the second power plane are connected through at least two power supply via holes provided in a comb-shaped convex portion, the first ground plane and the second ground plane are connected through at least two ground via holes provided in a comb-shaped convex portion, and an intervals between the power supply via holes is equal to or smaller than the interval between the power supply via hole and the ground via hole.

14. A printed circuit board comprising:

a first semiconductor circuit having an output terminal configured to output a signal, a first power supply terminal to which a power supply potential is applied, and a first ground terminal to which a ground potential is applied;

a second semiconductor circuit having an input terminal to which a signal is input, a second power supply terminal to which a power supply potential is applied and a second ground terminal to which a ground potential is applied;

a printed wiring board on which the first semiconductor circuit and the second semiconductor circuit are mounted and a signal line configured to connect the output terminal are the input terminal is provided, the printed wiring board having a power plane in conduction with the first power supply terminal and the second power supply terminal, and a ground plane in conduction with the first ground terminal and the second ground terminal;

a first bypass circuit mounted on the printed wiring board, the first bypass circuit having one end connected to the power plane through a first power supply via provided in the printed wiring board and the other end connected to the ground plane through a first ground via provided in the printed wiring board, the first bypass circuit including a first resistance component and a first capacitance component serially connected to the first resistance component, the first bypass circuit being provided closer to the first semiconductor circuit; and a second bypass circuit mounted on the printed wiring board, the second bypass circuit having one end connected to the power plane through a second power supply via provided in the printed wiring board and the other end connected to the ground plane through a second ground via provided in the printed wiring board, the second bypass circuit including a second resistance component having a lower resistance value than that of the first resistance component and a second capacitance component serially connected to the second resistance component, the second bypass circuit being provided closer to the second semiconductor circuit, wherein a region between the first capacitor and the second capacitor on the ground plane has a region having a mesh structure having a plurality of openings on the ground plane.

15. The printed circuit board according to claim 14, wherein
the mesh structure has an acute angle formed by the direction of current flowing along the mesh structure and a line segment connecting the first capacitor element and the second capacitor element.

16. A printed circuit board comprising:
a first semiconductor circuit having an output terminal configured to output a signal, a first power supply terminal to which a power supply potential is applied, and a first ground terminal to which a ground potential is applied;
a second semiconductor circuit having an input terminal to which a signal is input, a second power supply terminal to which a power supply potential is applied and a second ground terminal to which a ground potential is applied;
a printed wiring board on which the first semiconductor circuit and the second semiconductor circuit are mounted and a signal line configured to connect the output terminal are the input terminal is provided, the printed wiring board having a power plane in conduction with the first power supply terminal and the second power supply terminal, and a ground plane in conduction with the first ground terminal and the second ground terminal;
a first bypass circuit mounted on the printed wiring board, the first bypass circuit having one end connected to the power plane through a first power supply via provided in the printed wiring board and the other end connected to the ground plane through a first ground via provided in the printed wiring board, the first bypass circuit including a first resistance component and a first capacitance component serially connected to the first resistance component, the first bypass circuit being provided closer to the first semiconductor circuit; and
a second bypass circuit mounted on the printed wiring board, the second bypass circuit having one end connected to the power plane through a second power supply via provided in the printed wiring board and the other end connected to the ground plane through a second ground via provided in the printed wiring board, the second bypass circuit including a second resistance component having a lower resistance value than that of the first resistance component and a second capacitance component serially connected to the second resistance component, the second bypass circuit being provided closer to the second semiconductor circuit, wherein a third capacitance component is provided in vicinity of the first bypass circuit, the third capacitance component is connected to the power plane and the ground plane through vias.

17. A printed circuit board comprising:
a first semiconductor circuit having an output terminal configured to output a signal, a first power supply terminal to which a power supply potential is applied, and a first ground terminal to which a ground potential is applied;
a second semiconductor circuit having an input terminal to which a signal is input, a second power supply terminal to which a power supply potential is applied and a second ground terminal to which a ground potential is applied;
a printed wiring board on which the first semiconductor circuit and the second semiconductor circuit are mounted and a signal line configured to connect the output terminal are the input terminal is provided, the printed wiring board having a power plane in conduction with the first power supply terminal and the second power supply terminal, and a ground plane in conduction with the first ground terminal and the second ground terminal;
a first bypass circuit mounted on the printed wiring board, the first bypass circuit having one end connected to the power plane through a first power supply via provided in the printed wiring board and the other end connected to the ground plane through a first ground via provided in the printed wiring board, the first bypass circuit including a first resistance component and a first capacitance component serially connected to the first resistance component, the first bypass circuit being provided closer to the first semiconductor circuit; and
a second bypass circuit mounted on the printed wiring board, the second bypass circuit having one end connected to the power plane through a second power supply via provided in the printed wiring board and the other end connected to the ground plane through a second ground via provided in the printed wiring board, the second bypass circuit including a second resistance component having a lower resistance value than that of the first resistance component and a second capacitance component serially connected to the second resistance component, the second bypass circuit being provided closer to the second semiconductor circuit, wherein
a value of an impedance of a second path through the first ground via, the ground plane, the second ground via, and the second bypass circuit is higher than a value of an impedance of a first path through the first power supply via, the first bypass circuit, and the first ground via.

* * * * *